US012757361B2

(12) United States Patent
Liu et al.

(10) Patent No.: US 12,757,361 B2
(45) Date of Patent: Oct. 6, 2026

(54) VEHICLE-MOUNTED POWER SUPPLY APPARATUS WITH UPPER AND LOWER COOLING CHANNELS AND VEHICLE

(71) Applicant: Huawei Digital Power Technologies Co., Ltd., Shenzhen (CN)

(72) Inventors: Yuting Liu, Dongguan (CN); Lin Du, Dongguan (CN); Shaolong Liu, Dongguan (CN)

(73) Assignee: Huawei Digital Power Technologies Co., Ltd., Shenzhen (CN)

(*) Notice: Subject to any disclaimer, the term of this patent is extended or adjusted under 35 U.S.C. 154(b) by 209 days.

(21) Appl. No.: 18/411,345

(22) Filed: Jan. 12, 2024

(65) Prior Publication Data

US 2024/0244802 A1 Jul. 18, 2024

(30) Foreign Application Priority Data

Jan. 18, 2023 (CN) ......................... 202320234526.0

(51) Int. Cl.
*H05K 7/20* (2006.01)
*B60L 53/22* (2019.01)
(Continued)

(52) U.S. Cl.
CPC .......... *H05K 7/20927* (2013.01); *B60L 53/22* (2019.02); *H05K 5/0047* (2013.01);
(Continued)

(58) Field of Classification Search
CPC ........... H05K 7/20254; H05K 7/20327; H05K 7/20436; H05K 7/205; H05K 7/20509;
(Continued)

(56) References Cited

U.S. PATENT DOCUMENTS

| | | | | |
|---|---|---|---|---|
| 11,856,740 | B2 * | 12/2023 | Honjo | H05K 7/20254 |
| 12,342,512 | B2 * | 6/2025 | Pouilly | H05K 7/20927 |

(Continued)

FOREIGN PATENT DOCUMENTS

| | | | | |
|---|---|---|---|---|
| CN | 215751861 U | * | 2/2022 | |
| CN | 216128156 U | * | 3/2022 | B60L 53/22 |

(Continued)

OTHER PUBLICATIONS

Machine translation for CN 216128156 by Gu et al. completed Nov. 6, 2025 (Year: 2025).*

*Primary Examiner* — Jayprakash N Gandhi
*Assistant Examiner* — Steven Ngo
(74) *Attorney, Agent, or Firm* — Maier & Maier, PLLC

(57) ABSTRACT

A vehicle-mounted power supply apparatus and a vehicle. The vehicle-mounted power supply apparatus includes a power conversion circuit, an upper-layer PCB board, a lower-layer PCB board, a bottom cover, and a radiator. The upper-layer PCB board and the lower-layer PCB board are configured to bear a plurality of power switching transistors of the power conversion circuit, so that the power conversion circuit is distributed more flexibly. The lower-layer PCB board and a plurality of transformers are fastened to a bottom plate of the bottom cover, and cooled by heat dissipation through a lower-layer cooling channel in the bottom cover. The upper-layer PCB board and the radiator are sequentially stacked above the lower-layer PCB board and the plurality of transformers, and cooled by heat dissipation through an upper-layer cooling channel in the radiator.

21 Claims, 44 Drawing Sheets

(51) Int. Cl.
*H05K 5/00* (2025.01)
*H10W 40/47* (2026.01)

(52) U.S. Cl.
CPC ..... *H05K 7/20254* (2013.01); *H05K 7/20436* (2013.01); *H05K 7/20854* (2013.01); *H05K 7/20872* (2013.01); *H10W 40/47* (2026.01)

(58) Field of Classification Search
CPC ........... H05K 7/20518; H05K 7/20854; H05K 7/20872; H05K 7/20881; H05K 7/209; H05K 7/20927; H05K 7/20936; H05K 5/0047; H05K 2201/064; H01L 23/4012; H01L 23/473; B60L 53/22
See application file for complete search history.

(56) References Cited

U.S. PATENT DOCUMENTS

| | | | | |
|---|---|---|---|---|
| 2019/0098777 | A1* | 3/2019 | Nakatsu | B60L 50/00 |
| 2020/0274375 | A1 | 8/2020 | Griffiths et al. | |
| 2022/0039297 | A1* | 2/2022 | Smal | H05K 7/20872 |
| 2023/0301038 | A1* | 9/2023 | Pouilly | H05K 7/20845 361/689 |

FOREIGN PATENT DOCUMENTS

| | | | |
|---|---|---|---|
| CN | 114745906 | A | 7/2022 |
| EP | 1713169 | A1 | 10/2006 |

* cited by examiner

VEHICLE-MOUNTED POWER SUPPLY APPARATUS WITH UPPER AND LOWER COOLING CHANNELS AND VEHICLE

CROSS-REFERENCE TO RELATED APPLICATIONS

This application claims priority to Chinese Patent Application No. 202320234526.0, filed on Jan. 18, 2023, which is hereby incorporated by reference in its entirety.

TECHNICAL FIELD

This embodiments relate to the field of vehicle power supply technologies, to a vehicle-mounted power supply apparatus, and a vehicle.

BACKGROUND

A vehicle-mounted power supply apparatus is an integral part of an electric vehicle. The vehicle-mounted power supply apparatus converts electrical energy transmitted by an external power source into a direct current, to supply power to a high-voltage battery pack and a low-voltage electrical device. A power conversion circuit in the vehicle-mounted power supply apparatus includes a large quantity of components, which are configured to realize power conversion. With increasing requirements for autonomous driving of an electric vehicle and the use of various vehicle-mounted low-voltage electrical devices, low-voltage supply power continues to rise. As a result, a volume of a power conversion circuit in the vehicle-mounted power supply apparatus rapidly increases. The increasing volume of the vehicle-mounted power supply apparatus affects an overall vehicle layout and interior space of the vehicle. The increase of components of the power conversion circuit also affects mounting structure strength of the vehicle-mounted power supply apparatus. In addition, the power conversion circuit generates a large amount of heat when working, and a temperature rise affects working efficiency of a vehicle-mounted power supply module.

SUMMARY

The embodiments provide a vehicle-mounted power supply apparatus and a vehicle.

According to a first aspect, an embodiment provides a vehicle-mounted power supply apparatus. The vehicle-mounted power supply apparatus includes a power conversion circuit, an upper-layer printed circuit board (PCB board), a lower-layer PCB board, a bottom cover, and a radiator. The power conversion circuit includes a plurality of power switching transistors and a plurality of transformers. The upper-layer PCB board and the lower-layer PCB board are configured to bear the plurality of power switching transistors of the power conversion circuit. The bottom cover includes a bottom plate and four side walls. The lower-layer PCB board and the plurality of transformers are fastened to the bottom plate. The upper-layer PCB board and the radiator are sequentially stacked above the lower-layer PCB board and the plurality of transformers. The radiator includes an upper-layer cooling channel. The bottom cover includes a lower-layer cooling channel. The upper-layer cooling channel communicates with the lower-layer cooling channel in the bottom cover through one of the side walls.

The power conversion circuit is configured to implement alternating current/direct current conversion and voltage conversion, so that the vehicle-mounted power supply apparatus can meet power consumption requirements of different loads.

Both the upper-layer PCB board and the lower-layer PCB board are configured to bear some of the power switching transistors, so that the power conversion circuit is distributed on the upper-layer PCB board and the lower-layer PCB board that are stacked. Compared with an implementation in which the power conversion circuit is distributed on one PCB board, in this implementation, the power conversion circuit is distributed more flexibly, and an area of the vehicle-mounted power supply apparatus on a horizontal plane can be reduced.

The radiator, the upper-layer PCB board, and the lower-layer PCB board are sequentially stacked to reduce a volume of internal space occupied by the vehicle-mounted power supply apparatus. The lower-layer PCB board and the plurality of transformers are both fastened to the bottom cover, so that the lower-layer PCB board and the plurality of transformers are stably fastened to the bottom cover, and overall structural strength of the vehicle-mounted power supply apparatus is stronger.

The upper-layer PCB board and the radiator are sequentially stacked above the lower-layer PCB board and the plurality of transformers, so that the radiator can cool a heat generation component on the upper-layer PCB board through heat dissipation. The bottom cover includes a lower-layer cooling channel, which can cool the plurality of transformers fastened to the bottom cover through heat dissipation, to improve an overall heat dissipation effect of the vehicle-mounted power supply apparatus, and enable the power conversion circuit to work in a proper temperature range.

The upper-layer cooling channel communicates with the lower-layer cooling channel through the side wall, so that coolant is less resisted when flowing in the vehicle-mounted power supply apparatus, and has a faster flow speed and larger flow rate, which can facilitate a capability of dissipating heat of the heat generation component. This helps improve a cooling effect of the coolant on the vehicle-mounted power supply apparatus. In addition, temperature uniformity of the vehicle-mounted power supply apparatus can be improved.

In a possible implementation, an area of an orthographic projection of the radiator on the upper-layer PCB board is less than an area of the upper-layer PCB board. The orthographic projection of the radiator covers the plurality of transformers and the plurality of power switching transistors borne on the upper-layer PCB board.

In this implementation, a cross section of the radiator and a surface of the upper-layer PCB board are both perpendicular to a height direction of the vehicle-mounted power supply apparatus. The radiator does not occupy a large area on the upper-layer PCB board. In one aspect, more space is available on an upper surface of the upper-layer PCB board for mounting other components, to improve space utilization inside the vehicle-mounted power supply apparatus. In another aspect, the radiator may be flexibly arranged on the upper-layer PCB board based on a position of the heat generation component, to effectively dissipate heat of the heat generation component, improve a local heat dissipation effect, and help reduce manufacturing costs of the radiator.

In this implementation, the power switching transistor is one of main heat sources of the power conversion circuit. The radiator is provided outside the power switching transistor along the height direction of the vehicle-mounted power supply apparatus. When the coolant flows into the radiator, the coolant can take away heat generated by the power switching transistor, thereby reducing a temperature of the power switching transistor in a stable working state, and implementing temperature control for the vehicle-mounted power supply apparatus.

In a possible implementation, the vehicle-mounted power supply apparatus includes a cover plate. An area of an orthographic projection of the cover plate is greater than an area of the upper-layer PCB board. A gap between the cover plate and the upper-layer PCB board is used to accommodate the radiator. In this implementation, the cover plate is located on a side that is of upper-layer PCB board and that is away from the bottom cover along the height direction of the vehicle-mounted power supply apparatus. The cover plate can completely cover the upper-layer PCB board, so that the cover plate is fixedly connected to the bottom cover on an outer side of the upper-layer PCB board to form an accommodating cavity. This protects the power conversion circuit from being affected by an external environment. The radiator is located in the gap between the cover plate and the upper-layer PCB board. Even if the coolant leaks from the radiator, the leaked coolant does not flow out of the vehicle-mounted power supply apparatus due to blocking of the cover plate, thereby reducing impact of the coolant leakage on an entire vehicle.

In a possible implementation, the bottom plate includes a plurality of shielding protrusions, and the upper-layer PCB board and the radiator are sequentially stacked and fastened to the plurality of shielding protrusions. Two shielding protrusions jointly form one shielding region, or one shielding protrusion and one side wall jointly form another shielding region, and an orthographic projection of the upper-layer PCB board covers the one shielding region and the another shielding region.

In this implementation, the upper-layer PCB board and the radiator are fastened to the bottom cover through the shielding protrusions. When the vehicle-mounted power supply apparatus is subject to an action force exerted by the external environment, relative displacement is not likely to occur between the radiator and the bottom cover. This helps improve stability of an overall structure of the vehicle-mounted power supply apparatus. In this implementation, the orthographic projection of the upper-layer PCB board along the height direction of the vehicle-mounted power supply apparatus covers the plurality of shielding regions, so that a part of the power conversion circuit fastened to the upper-layer PCB board can extend to the shielding region, thereby improving an electrical shielding effect.

In a possible implementation, the bottom plate includes a plurality of first protrusions and a plurality of second protrusions. The plurality of first protrusions are configured to fasten the lower-layer PCB board. The plurality of second protrusions are configured to fasten the upper-layer PCB board and the radiator. A height of the plurality of first protrusions along the height direction of the vehicle-mounted power supply apparatus is less than a height of the second protrusions, so that the lower-layer PCB board is closer to the lower-layer cooling channel than the upper-layer PCB board, and the upper-layer PCB board is closer to the upper-layer cooling channel than the lower-layer PCB board.

In this implementation, a part of the power conversion circuit mounted on the upper-layer PCB board needs to occupy a volume in the height direction of the vehicle-mounted power supply apparatus, and the upper-layer PCB board is fastened to the bottom plate through the second protrusions. Therefore, setting the height of the second protrusions being greater than the height of the first protrusions means that a distance between the upper-layer PCB board and the bottom plate is greater than a distance between the lower-layer PCB board and the bottom plate in the height direction, which provides mounting space for a component with a large volume in the power conversion circuit. In this implementation, a magnitude relationship between the height of the first protrusions and the height of the second protrusions further enables the upper-layer PCB board to be disposed close to the upper-layer cooling channel of the radiator, the lower-layer PCB board to be disposed close to the lower-layer cooling channel in the bottom cover, and the upper-layer cooling channel and the lower-layer cooling channel form a three-dimensional channel, which can dissipate heat for components located in different positions of the vehicle-mounted power supply apparatus, and improve cooling efficiency of the coolant.

In a possible implementation, the power conversion circuit includes a power factor correction (PFC) inductor, a PFC capacitor, and two transformers. The lower-layer cooling channel and the bottom cover are an integrally formed structure. The PFC inductor, the PFC capacitor, and the two transformers are in contact with the bottom of the bottom cover through a heat-conductive material, and are arranged above the lower-layer cooling channel and below the upper-layer PCB board in a flat manner. The two transformers are an LLC transformer and a low-voltage transformer. When the capacitor, the inductor, and the transformer in the power conversion circuit are in a working state, heat is generated, and a cooling channel needs to be provided for the heat generation component. In this implementation, one end of each of the PFC inductor, the PFC capacitor, the LLC transformer, and the low-voltage transformer is disposed back to the upper-layer cooling channel. When cooling the power switching transistor, the upper-layer cooling channel also has a heat dissipation effect for the heat generation component. The other end of each of the PFC inductor, the PFC capacitor, the LLC transformer, and the low-voltage transformer is in contact with the lower-layer cooling channel through a heat-conductive material. A part of heat generated by the heat generation component is transferred to the coolant in the lower-layer cooling channel through the heat-conductive material. The upper-layer cooling channel and the lower-layer cooling channel cool the heat generation component from both sides along the height direction of the vehicle-mounted power supply apparatus. This helps enhance the heat dissipation effect. The heat-conductive material includes, but is not limited to, a thermal grease, a thermal silicone sheet, a thermal conductive gel, and the like.

In a possible implementation, the bottom cover includes the bottom plate, a front side wall, a rear side wall, a left side wall, and a right side wall. The front side wall and the rear side wall are disposed opposite to each other. The left side wall and the right side wall are disposed opposite to each other. The rear side wall includes a cooling channel interface. The cooling channel interface is configured to connect an external cooling system to the lower-layer cooling channel and the upper-layer cooling channel, so that the external cooling system exchanges a cooling medium with the lower-layer cooling channel and the upper-layer cooling channel through the cooling channel interface. In this implementation, the upper-layer cooling channel may be configured to cool the power switching transistor of the upper-layer PCB board through heat dissipation: and the lower-layer cooling channel may cool through heat dissipation the components such as the plurality of transformers, the inductor, and the capacitor that are fastened to the bottom cover. The two layers of channels communicate with each other through the cooling channel interface, so that coolant can circulate between the two layers of cooling channels. This improves an even cooling effect for the vehicle-mounted power supply apparatus and improves temperature uniformity of the vehicle-mounted power supply apparatus.

In a possible implementation, the front side wall includes a power interface, two first direct current interfaces, and one second direct current interface. The power interface and the second direct current interface are electrically connected to the upper-layer PCB board. The two first direct current interfaces are electrically connected to the lower-layer PCB board. In this implementation, the power interface, the second direct current interface, and the two first direct current interfaces are electrical interfaces, and are all used for electrical transmission of the vehicle-mounted power supply apparatus. The electrical interfaces are disposed on the front side wall, and the cooling channel interface is disposed on the rear side wall opposite to the front side wall, so that the electrical interfaces are far away from the cooling channel interface, and electrical transmission and coolant transmission do not affect each other. This helps improve working efficiency and safety performance of the vehicle-mounted power supply apparatus. In this implementation, the power interface and the second direct current interface are electrically connected to a part of the power conversion circuit on the upper-layer PCB board, and the first direct current interface is electrically connected to a part of the power conversion circuit on the lower-layer PCB board, so that the upper-layer PCB board and the lower-layer PCB board undertake different electrical transmission work.

In a possible implementation, the cooling channel interface includes two radiator interfaces, two external cooling system interfaces, and two bottom cover interfaces. The radiator interfaces are disposed on an upper surface of the rear side wall, and the two radiator interfaces are respectively configured to connect to an outlet and an inlet of the upper-layer cooling channel. The external cooling system interfaces are disposed on a side surface that is of the rear side wall and that is away from the upper-layer PCB board, and the two external cooling system interfaces are respectively configured to connect to an outlet and an inlet of the external cooling system. The two bottom cover interfaces are respectively configured to connect to an outlet and an inlet of the lower-layer cooling channel.

In this implementation, the external cooling system interfaces communicate with the radiator interfaces and the bottom cover interfaces separately. The coolant enters the upper-layer cooling channel and the lower-layer cooling channel through the external cooling system interfaces, flows through the upper-layer cooling channel and the lower-layer cooling channel, and then flows out from the external cooling system interfaces. The radiator interface communicates with the bottom cover interface, so that the upper-layer cooling channel communicates with the lower-layer cooling channel, and coolant can circulate between the two layers of cooling channels. This improves an even cooling effect for the vehicle-mounted power supply apparatus and improves temperature uniformity of the vehicle-mounted power supply apparatus.

In a possible implementation, the radiator includes two stacked sheet metal parts and two sealing interfaces located at a same side with the sheet metal parts, edges of the two sheet metal parts are sealed through brazing with filler metal and form the upper-layer cooling channel, and the upper-layer cooling channel communicates with the two radiator interfaces through the two sealing interfaces. A thickness of the sheet metal part is less than a thickness of the bottom cover.

In this implementation, the radiator is made of sheet metal. The two sheet metal parts in the radiator are a channel cover plate of the upper-layer cooling channel and an upper-layer cooling channel body respectively. The channel cover plate is located on a side that is of the upper-layer cooling channel and that is away from the upper-layer PCB board along a height direction X of the vehicle-mounted power supply apparatus. The channel cover plate is provided on an outer side of the upper-layer cooling channel. An orthographic projection of the channel cover plate on the upper-layer PCB board covers an orthographic projection of the upper-layer cooling channel on the upper-layer PCB board. The channel cover plate is configured to prevent coolant from leaking from the upper-layer cooling channel. The channel cover plate is fixedly connected to the bottom cover through the upper-layer PCB board, for example, by using a screw. The upper-layer cooling channel is fastened to the bottom cover, so that the upper-layer cooling channel is not affected by an external force, and remains immobile. The thickness of the sheet metal part is less than the thickness of the bottom cover, so that the radiator is lighter. In addition, a heat conduction effect is better, for example, heat of the power switching transistor under the radiator can be transferred and absorbed, thereby improving a heat dissipation effect of the vehicle-mounted power supply apparatus.

According to a second aspect, the embodiments provide a vehicle, including a first-type load, a battery, and the vehicle-mounted power supply apparatus according to any one of the foregoing implementations. The power conversion circuit is configured to output a first direct current and a second direct current. A voltage of the second direct current is higher than a voltage of the first direct current. The first direct current is used to be transmitted to the first-type load to supply power to the first-type load, the second direct current is used to be transmitted to the battery to supply power to the battery. The voltage of the second direct current is higher than the voltage of the first direct current. The vehicle-mounted power supply apparatus provided in the embodiments has a smaller volume, greater overall structural strength, and better electromagnetic compatibility, and when applied to the vehicle, helps optimize an overall layout of the vehicle.

BRIEF DESCRIPTION OF DRAWINGS

To describe solutions in the embodiments more clearly, the following describes accompanying drawings used in the embodiments.

DETAILED DESCRIPTION OF EMBODIMENTS

Figure 1:
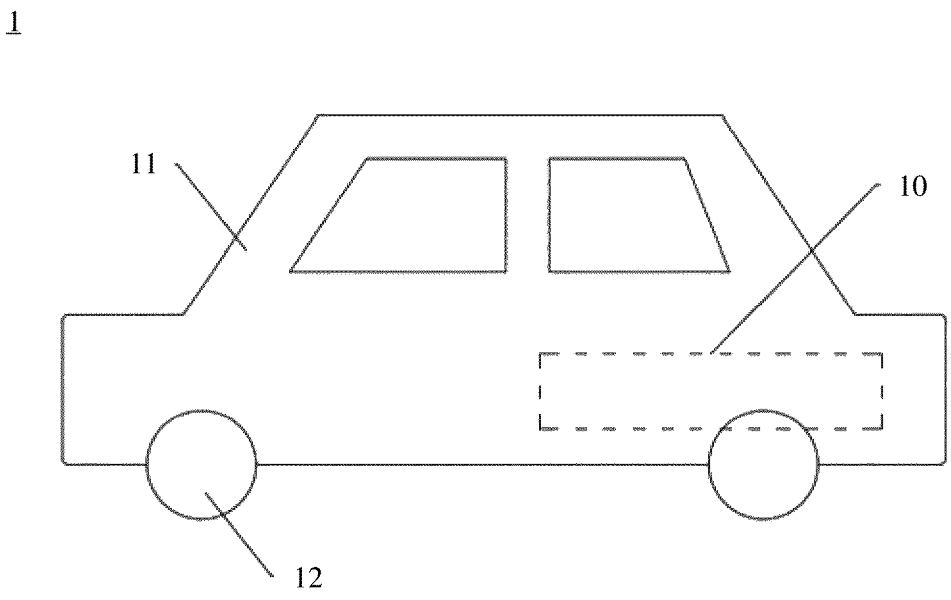
FIG. 1 is a schematic diagram of a structure of a vehicle according to an embodiment.

The following describes solutions in embodiments with reference to the accompanying drawings. It is clear that the described embodiments are merely some, rather than all, of the embodiments.

Terms "first", "second", and the like are merely intended for a purpose of description, and shall not be understood as an indication or implication of relative importance or implicit indication of a quantity of indicated features. Therefore, a feature limited by "first" or "second" may explicitly or implicitly include one or more features. Unless otherwise stated, "a plurality of" means two or more than two.

In the embodiments, orientation terms such as "upper", "lower", "front", "back", "left", "right", "top", "bottom", "internal", and "external" are defined with respect to the placed orientations of schematic structures in the accompanying drawings. It should be understood that these directional terms are relative concepts, and are used in relative description and clarification, and may change accordingly based on a change of the placed orientation of the structure.

In the embodiments, unless otherwise specified and limited, when a first feature is "above" or "below" a second feature, the first feature may be in direct contact with the second feature, or the first feature may be in indirect contact with the second feature through an intermediate medium. In addition, that the first feature is "above", "over", or "on the top of" the second feature may be that the first feature is right above or obliquely above the second feature, or only indicates that a horizontal height of the first feature is higher than that of the second feature. That the first feature is "below", "under", or "beneath" the second feature may be that the first feature is right below or obliquely below the second feature, or only indicates that a horizontal height of the first feature is less than that of the second feature.

For ease of understanding, the following first explains and describes English abbreviations and related terms used in embodiments.

PCB: Printed Circuit Board. A printed circuit board is a carrier on which electronic parts and components connect to each other.

AC: AC is short for Alternating Current. An AC filter is a filter in an alternating current/direct current conversion circuit.

PFC: Power Factor Correction, which means power factor correction. A PFC capacitor is a capacitor in an alternating current/direct current conversion circuit. A PFC inductor is an inductor in the alternating current/direct current conversion circuit.

HVDC: HVDC generally refers to high-voltage direct current transmission. An HVDC filter is a filter in a high-voltage direct current conversion circuit, and the HVDC filter may also be referred to as a high-voltage direct current filter.

LVDC: LVDC generally refers to low-voltage direct current transmission. An LVDC filter is a filter in a low-voltage direct current conversion circuit, and the LVDC filter may also be referred to as a low-voltage filter.

In the embodiments, "high voltage" and "low voltage" refer to relative voltages. A "high voltage" is higher than a "low voltage", but no specific voltage value is indicated.

"Parallel" defined in the embodiments is not limited to absolute parallelism. The definition of "parallel" may be understood as basic parallelism, which allows non-absolute parallelism caused by factors such as an assembly tolerance, a design tolerance, and structural flatness.

"Perpendicular" defined in the embodiments is not limited to an absolute perpendicular intersection relationship (an included angle is 90 degrees), and allows a non-absolute perpendicular intersection relationship caused by factors such as an assembly tolerance, a design tolerance, and structural flatness. An error within a small angle range is also allowed, for example, an assembly error range of 80 degrees to 100 degrees.

FIG. 1 is a schematic diagram of a structure of a vehicle 1 according to an embodiment. In an implementation, the vehicle 1 includes a vehicle body 11 and wheels 12. A vehicle-mounted power supply apparatus 10 is mounted in the vehicle body 11. The vehicle-mounted power supply apparatus 10 is configured to provide electrical energy for all electrical parts in the vehicle 1, and drive the wheels 12 to rotate.

The vehicle 1 is a wheeled vehicle driven or pulled by a power apparatus, for use on roads for the carriage of persons or for the transportation of goods and special engineering operations. The vehicle 1 includes an electric vehicle/electric vehicle (EV), a pure electric vehicle (Pure Electric Vehicle/Battery Electric Vehicle, PEV/BEV), a hybrid electric vehicle (HEV), a range extended electric vehicle (REEV), a plug-in hybrid electric vehicle (PHEV), a new energy vehicle, or the like. In some implementations, the vehicle 1 includes a passenger vehicle and various special operation vehicles with specific functions, for example, an engineering rescue vehicle, a sprinkler, a sewage sucker, a cement mixer, a crane, and a medical vehicle. Alternatively, the vehicle 1 may be a robot that can travel. There may be three or more wheels 12 of the vehicle 1. This is not limited.

Figure 2:
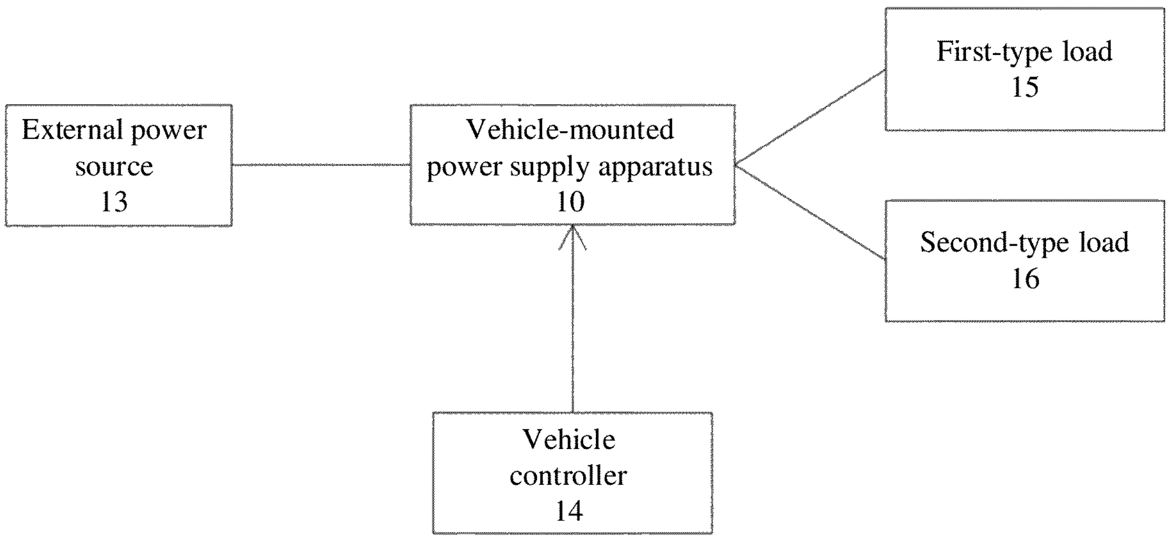
FIG. 2 is a schematic diagram of an application scenario of a vehicle-mounted power supply apparatus according to an embodiment.

FIG. 2 is a schematic diagram of an application scenario of the vehicle-mounted power supply apparatus 10 according to an embodiment. In an implementation, the vehicle-mounted power supply apparatus 10 is electrically connected to an external power source 13, an entire vehicle controller 14, a first-type load 15, and a second-type load 16.

In an implementation, the external power source 13 may be an alternating current power grid, an alternating current charging pile, or an uninterruptible power supply (UPS). In this case, the external power source 13 is an alternating current power source. The vehicle-mounted power supply apparatus 10 is configured to electrically connect to the external power source 13 and receive an alternating current. For example, the vehicle-mounted power supply apparatus 10 converts the received alternating current into a direct current. The vehicle-mounted power supply apparatus 10 provides a direct current to supply power to the first-type load 15 and the second-type load 16.

In an implementation, the first-type load 15 is a low-voltage load. For example, the first-type load 15 includes at least one of a low-voltage battery, a vehicle light, a wiper, an air conditioner, a speaker, a USB interface, a dashboard, and a control display screen. For example, the low-voltage battery may also supply power to another first-type load 15. For example, the second-type load 16 is a battery. When the battery is configured to supply power to a motor in a power system, the battery may also be referred to as a power battery.

The vehicle-mounted power supply apparatus 10 is electrically connected to the vehicle controller 14. The vehicle controller 14 is configured to send a control signal to the vehicle-mounted power supply apparatus 10 to optimize energy distribution of the vehicle.

Figure 3:
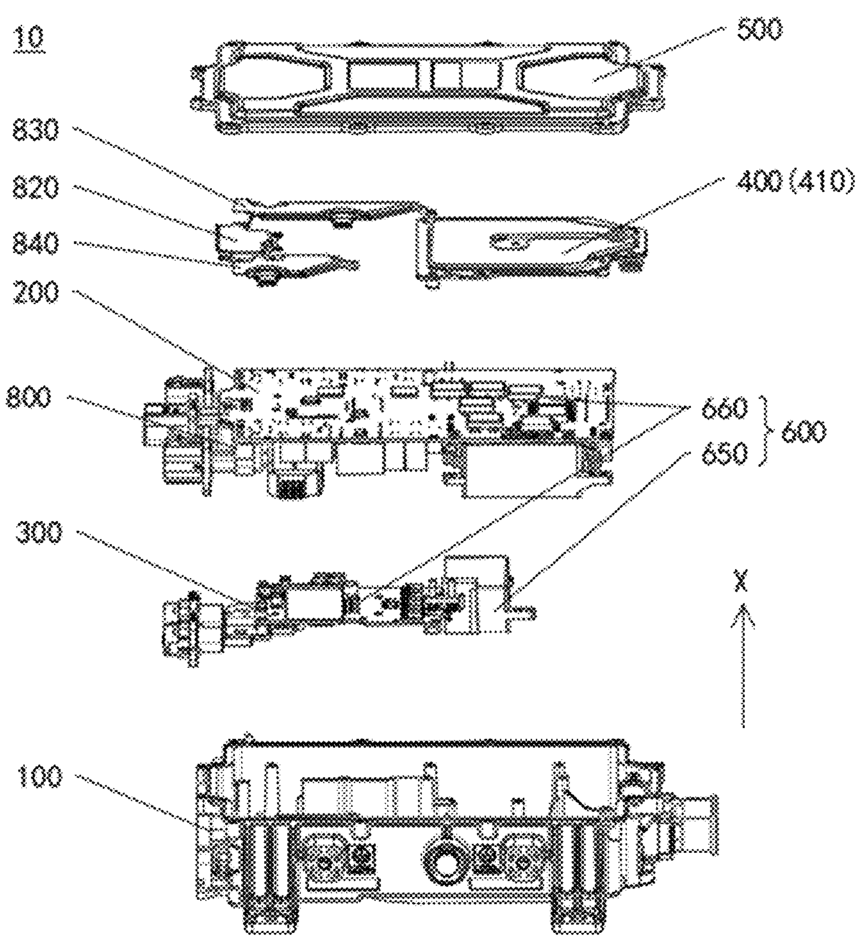
FIG. 3 is an exploded view of a vehicle-mounted power supply apparatus according to an implementation.
Figure 4:
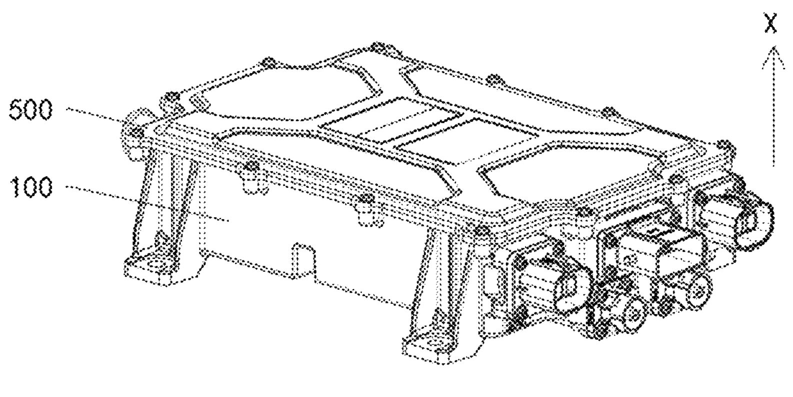
FIG. 4 is a schematic diagram of a structure of a vehicle-mounted power supply apparatus according to an implementation.

FIG. 3 is an exploded view of the vehicle-mounted power supply apparatus 10 according to an implementation. FIG. 4 is a schematic diagram of a structure of the vehicle-mounted power supply apparatus 10 according to an implementation. In an implementation, the vehicle-mounted power supply apparatus 10 includes a bottom cover 100, a lower-layer PCB board 300, an upper-layer PCB board 200, a power conversion circuit 600, a radiator 400, and a cover plate 500 (as shown in FIG. 3). The bottom cover 100 and the cover plate 500 jointly form an accommodating cavity. The lower-layer PCB board 300, the upper-layer PCB board 200, the radiator 400, and the power conversion circuit 600 are located in the accommodating cavity (as shown in FIG. 3 and FIG. 4). Both the upper-layer PCB board 200 and the lower-layer PCB board 300 are provided with a part of the power conversion circuit 600 (as shown in FIG. 3). The power conversion circuit 600 is configured to receive an alternating current and output at least two direct currents with different voltages. The direct current is used to supply power to a first-type load and a second-type load. Both the radiator 400 and the bottom cover 100 are provided with a cooling channel. The cooling channel in both the radiator 400 and the bottom cover 100 is configured to cool the power conversion circuit 600. For example, the cooling channel may be configured to cool components such as a transformer 650, a capacitor, and an inductor in the power conversion circuit 600. The bottom cover 100 includes a plurality of protrusions, some of which are configured to support and fasten the upper-layer PCB board 200, the lower-layer PCB board 300, the radiator 400, and at least one of the components such as the transformer 650, the capacitor, and the inductor in the power conversion circuit 600. Some of the protrusions and a side wall of the bottom cover 100 form at least one shielding region. The shielding region is used to shield a component located in the shielding region from electrical interference with an external component.

In the vehicle-mounted power supply apparatus 10 provided in this embodiment, structures, position relationships, and relative function relationships of the bottom cover 100, the lower-layer PCB board 300, the upper-layer PCB board 200, the power conversion circuit 600, the radiator 400, and the cover plate 500 are set. This makes the lower-layer PCB board 300, the upper-layer PCB board 200, the power conversion circuit 600, and the radiator 400 more compact in layout, the vehicle-mounted power supply apparatus 10 more miniaturized, and the components in the vehicle-mounted power supply apparatus 10 more reliably fastened: and facilitates a more stable electrical connection, lower electrical interference, a better cooling effect, and higher power density.

Still refer to FIG. 3. In an implementation, the lower-layer PCB board 300, the upper-layer PCB board 200, and the radiator 400 are sequentially stacked and fastened to the bottom cover 100. The power conversion circuit 600 includes a plurality of power switching transistors 660 and a plurality of transformers 650. The upper-layer PCB board 200 and the lower-layer PCB board 300 are configured to bear the plurality of power switching transistors 660. The bottom cover 100 is configured to support the upper-layer PCB board 200, the lower-layer PCB board 300, the radiator 400, and the plurality of transformers 650.

In this implementation, the lower-layer PCB board 300, the upper-layer PCB board 200, and the radiator 400 are sequentially stacked along a height direction X of the vehicle-mounted power supply apparatus 10. The radiator 400 is located on a side that is of the upper-layer PCB board 200 and that is away from the lower-layer PCB board 300. The radiator 400, the upper-layer PCB board 200, and the lower-layer PCB board 300 are all fixedly connected to the bottom cover 100, so that the radiator 400, the upper-layer PCB board 200, the lower-layer PCB board 300, and the bottom cover 100 are stably fastened, and therefore, overall structural strength of the vehicle-mounted power supply apparatus 10 is stronger.

In this implementation, the lower-layer PCB board 300, the upper-layer PCB board 200, the radiator 400, and the power conversion circuit 600 inside the vehicle-mounted power supply apparatus 10 are arranged to be fixedly connected to the bottom cover 100 directly or indirectly, which helps improve stability of an overall structure of the vehicle-mounted power supply apparatus 10. When an external environment exerts an external force on the vehicle-mounted power supply apparatus 10, the lower-layer PCB board 300, the upper-layer PCB board 200, the radiator 400, and the power conversion circuit 600 are not apt to move relative to the bottom cover 100. This helps the vehicle-mounted power supply apparatus 10 to work in a stable state.

The power switching transistors 660 in the power conversion circuit 600 refer to power electronic devices that can implement a power conversion function, including, but not limited to, an IGBT (insulated gate bipolar transistor), a silicon carbide power transistor, a silicon transistor, a MOS transistor (metal-oxide-semiconductor field-effect transistor), a diode, and the like. The transformer 650 in the power conversion circuit 600 is an apparatus that changes a voltage of an alternating current by using an electromagnetic induction principle. In this implementation, the power switching transistors 660 and the transformers 650 are used in combination, so that the alternating current is converted into at least two types of direct currents by the power conversion circuit 600, thereby meeting power supply requirements of at least two types of loads.

In this implementation, the power conversion circuit 600 includes the plurality of power switching transistors 660 and the plurality of transformers 650 for implementing power conversion. Both the upper-layer PCB board 200 and the lower-layer PCB board 300 are configured to bear some of the power switching transistors 660, so that the power conversion circuit 600 is distributed on the upper-layer PCB board 200 and the lower-layer PCB board 300 that are stacked. Compared with an implementation in which the power conversion circuit 600 is distributed on one PCB board, in this implementation, the power conversion circuit 600 is distributed more flexibly, and an area of the vehicle-mounted power supply apparatus 10 on a horizontal plane can be reduced.

In this implementation, the power switching transistors 660 are borne by the upper-layer PCB board 200 and the lower-layer PCB board 300, and the transformers 650 are supported by the bottom cover 100, so that the upper-layer PCB board 200, the lower-layer PCB board 300, and the bottom cover 100 all bear a part of the power conversion circuit 600. Components of the power conversion circuit 600 are distributed in different positions inside the vehicle-mounted power supply apparatus 10, which optimizes a layout of the power conversion circuit 600 and improves space utilization of the vehicle-mounted power supply apparatus 10, and therefore, facilitates a miniaturization design of the vehicle-mounted power supply apparatus 10.

Still refer to FIG. 3. In an implementation, the cover plate 500 and the bottom cover 100 of the vehicle-mounted power supply apparatus 10 jointly form an accommodating cavity. The accommodating cavity is configured to accommodate the lower-layer PCB board 300, the upper-layer PCB board 200, the radiator 400, and the plurality of transformers 650. The lower-layer PCB board 300, the upper-layer PCB board 200, the radiator 400, and the cover plate 500 are sequentially stacked along the height direction X of the vehicle-mounted power supply apparatus 10.

In this implementation, the accommodating cavity is configured to protect the lower-layer PCB board 300, the upper-layer PCB board 200, the radiator 400, and the plurality of transformers 650 inside from being affected by the external environment. In the height direction X of the vehicle-mounted power supply apparatus 10, the upper-layer PCB board 200 is disposed closer to the cover plate 500 than the lower-layer PCB board 300, and the radiator 400 is disposed between the cover plate 500 and the upper-layer PCB board 200. The radiator 400 may be configured to cool the power switching transistor 660 on the upper-layer PCB board 200 through heat dissipation.

In this implementation, the lower-layer PCB board 300, the upper-layer PCB board 200, the radiator 400, and the cover plate 500 are sequentially stacked, so that the arrangement of these components is more compact, which helps reduce a size of the vehicle-mounted power supply apparatus 10.

In an implementation, the cover plate 500 is detachably connected to the bottom cover 100. When an internal component of the vehicle-mounted power supply apparatus

10 needs to be repaired or replaced, the detachable connection relationship makes an operation less difficult and thus reduces costs. For example, the detachable connection may be a screw connection.

In an implementation, in the height direction X of the vehicle-mounted power supply apparatus 10, edges of two opposite end surfaces of the cover plate 500 and the bottom cover 100 are detachably connected. In this solution, the cover plate 500 and the bottom cover 100 are connected on the periphery of the accommodating cavity, which does not occupy internal space of the vehicle-mounted power supply apparatus 10, and is convenient for disassembly and assembly of the cover plate 500 and the bottom cover 100.

Figure 5:
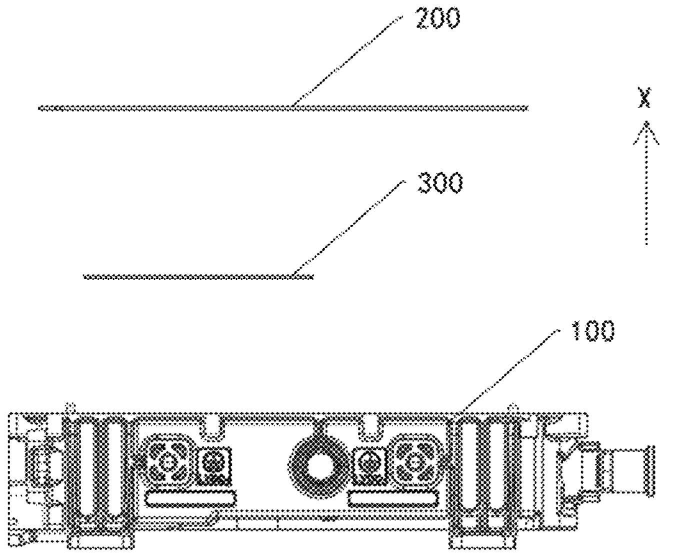
FIG. 5 is a schematic diagram of a structure of an upper-layer PCB board and a lower-layer PCB board according to an implementation.
Figure 6:
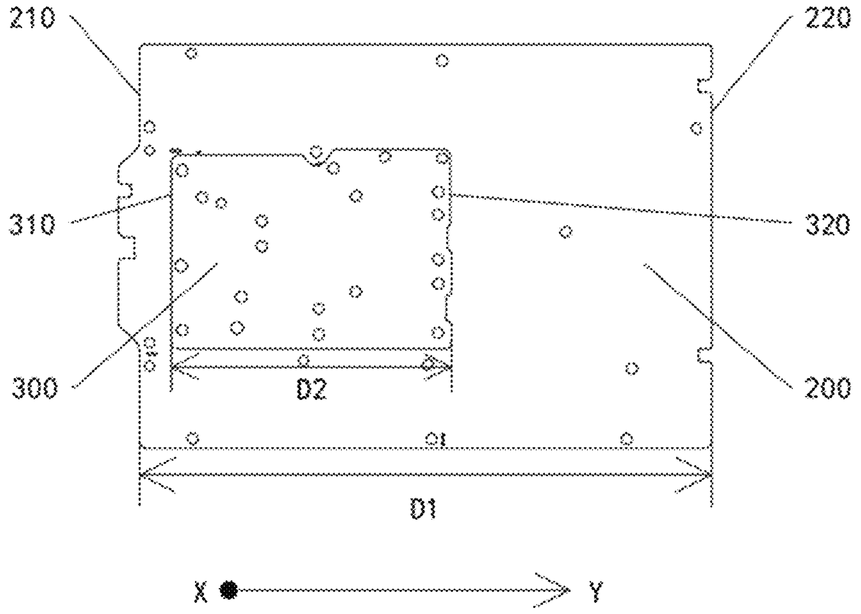
FIG. 6 is a schematic diagram of a structure of an upper-layer PCB board and a lower-layer PCB board according to an implementation.

FIG. 5 is a schematic diagram of a structure of the upper-layer PCB board 200 and the lower-layer PCB board 300 according to an implementation. FIG. 6 is a schematic diagram of a structure of the upper-layer PCB board 200 and the lower-layer PCB board 300 according to an implementation. In an implementation, the upper-layer PCB board 200 is spaced from the lower-layer PCB board 300 (as shown in FIG. 5). An area of a surface of the upper-layer PCB board 200 is greater than an area of a surface of the lower-layer PCB board 300 (as shown in FIG. 6), where both the surface of the upper-layer PCB board 200 and the surface of the lower-layer PCB board 300 are perpendicular to the height direction X of the vehicle-mounted power supply apparatus 10 (as shown in FIG. 6).

In this implementation, spacing is provided between the upper-layer PCB board 200 and the lower-layer PCB board 300 in the height direction X of the vehicle-mounted power supply apparatus 10, to provide space for disposing the power conversion circuit 600 between the upper-layer PCB board 200 and the lower-layer PCB board 300. This reduces a volume required for mounting the power conversion circuit 600. The area of the surface of the upper-layer PCB board 200 is greater than the area of the surface of the lower-layer PCB board 300, so that a large quantity (and/or with large volumes) of power conversion circuits 600 can be mounted on the upper-layer PCB board 200. In this way, mounting space of the surface of the upper-layer PCB board 200 and the surface of the lower-layer PCB board 300 are flexibly used, which helps improve space utilization of the vehicle-mounted power supply apparatus 10. The height direction X of the vehicle-mounted power supply apparatus 10 is a direction in which the surface of the lower-layer PCB board 300 points to the surface of the upper-layer PCB board 200. The surface of the upper-layer PCB board 200 is disposed in parallel with the surface of the lower-layer PCB board 300. This facilitates fastened connection between the upper-layer PCB board 200, the lower-layer PCB board 300, and the bottom cover 100 by using screws.

Still refer to FIG. 5. In an implementation, the surface of the upper-layer PCB board 200 and the surface of the lower-layer PCB board 300 are disposed in parallel, and the surface of the upper-layer PCB board 200 and the surface of the lower-layer PCB board 300 are perpendicular to the height direction X of the vehicle-mounted power supply apparatus 10.

In this implementation, the surface of the upper-layer PCB board 200 is disposed to be parallel to the surface of the lower-layer PCB board 300, and both surfaces are perpendicular to the height direction X of the vehicle-mounted power supply apparatus 10. Therefore, during fastening the upper-layer PCB board 200, the lower-layer PCB board 300, and the bottom cover 100 by using screws or the like, mounting operations are more convenient, and stability of a connection between the upper-layer PCB board 200, the lower-layer PCB board 300, and the bottom cover 100 is improved.

Still refer to FIG. 6. In an implementation, the upper-layer PCB board 200 includes an upper-layer front side edge 210 and an upper-layer rear side edge 220 that are disposed opposite to each other along a front-rear direction Y of the vehicle-mounted power supply apparatus 10: and the lower-layer PCB board 300 includes a lower-layer front side edge 310 and a lower-layer rear side edge 320 that are disposed opposite to each other along the front-rear direction Y. In the front-rear direction Y of the vehicle-mounted power supply apparatus 10, the lower-layer front side edge 310 and the lower-layer rear side edge 320 are located between the upper-layer front side edge 210 and the upper-layer rear side edge 220.

In this implementation, the upper-layer front side edge 210 is a front side edge of the upper-layer PCB board 200, and the upper-layer rear side edge 220 is a rear side edge of the upper-layer PCB board 200. The lower-layer front side edge 310 is a front side edge of the lower-layer PCB board 300, and the lower-layer rear side edge 320 is a rear side edge of the lower-layer PCB board 300. The front side edge and rear side edge of the upper-layer PCB board 200 and the front side edge and rear side edge of the lower-layer PCB board 300 are referred to as upper-layer front side edge 210, upper-layer rear side edge 220, lower-layer front side edge 310, and lower-layer rear side edge 320 respectively for distinguishing between them.

In this implementation, in the front-rear direction Y of the vehicle-mounted power supply apparatus 10, the upper-layer front side edge 210 and the upper-layer rear side edge 220 of the upper-layer PCB board 200 are respectively located on outer sides of the lower-layer front side edge 310 and the lower-layer rear side edge 320 of the lower-layer PCB board 300. The outer side of the lower-layer front side edge 310 is a side, of the lower-layer front side edge 310, away from the lower-layer rear side edge 320 along the front-rear direction Y, and the outer side of the lower-layer rear side edge 320 is a side, of the lower-layer rear side edge 320, away from the lower-layer front side edge 310 along the front-rear direction Y. A value of a distance between the upper-layer front side edge 210 and the upper-layer rear side edge 220 in the front-rear direction Y of the vehicle-mounted power supply apparatus 10 is D1, and a value of a distance between the lower-layer front side edge 310 and the lower-layer rear side edge 320 in the front-rear direction Y of the vehicle-mounted power supply apparatus 10 is D2. D1>D2 is set, so that an orthographic projection of the upper-layer PCB board 200 on the lower-layer PCB board 300 can cover the lower-layer PCB board 300 in the front-rear direction Y. This facilitates mounting of a component with a large volume on the upper-layer PCB board 200. In addition, the component with a large volume can be further fastened to the bottom cover 100, thereby improving overall stability of the vehicle-mounted power supply apparatus 10.

Figure 7:
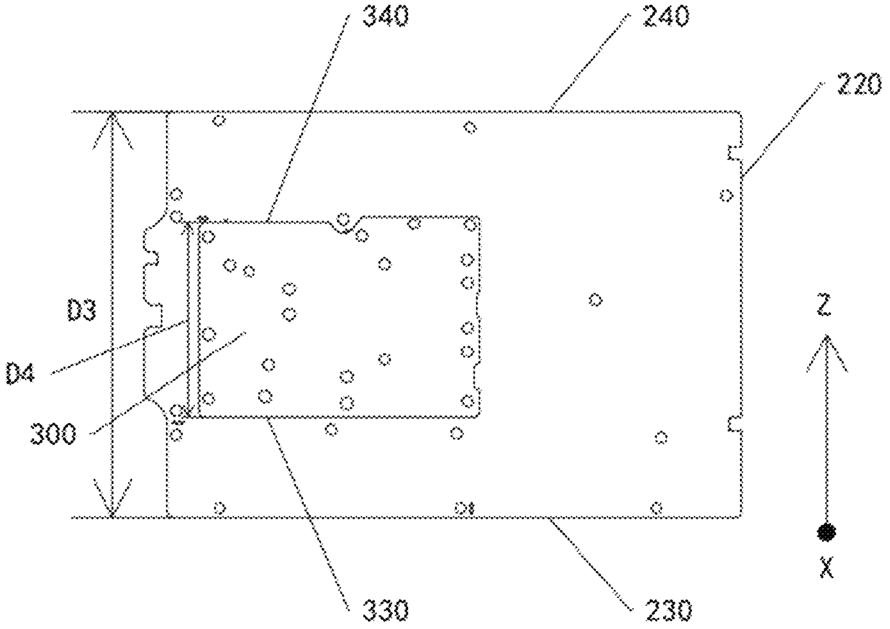
FIG. 7 is a schematic diagram of a structure of an upper-layer PCB board and a lower-layer PCB board according to an implementation.

FIG. 7 is a schematic diagram of a structure of the upper-layer PCB board 200 and the lower-layer PCB board 300 according to an implementation. In an implementation, the upper-layer PCB board 200 includes an upper-layer left side edge 230 and an upper-layer right side edge 240 that are disposed opposite to each other along a left-right direction Z of the vehicle-mounted power supply apparatus 10: and the lower-layer PCB board 300 includes a lower-layer left side edge 330 and a lower-layer right side edge 340 that are disposed opposite to each other along the front-rear direction Y. In the left-right direction Z of the vehicle-mounted power supply apparatus 10, the lower-layer left side edge 330 and the lower-layer right side edge 340 are located between the upper-layer left side edge 230 and the upper-layer right side edge 240.

In this implementation, the upper-layer left side edge 230 is a left side edge of the upper-layer PCB board 200, and the upper-layer right side edge 240 is a right side edge of the upper-layer PCB board 200. The lower-layer left side edge 330 is a left side edge of the lower-layer PCB board 300, and the lower-layer right side edge 340 is a right side edge of the lower-layer PCB board 300. The left side edge and right side edge of the upper-layer PCB board 200 and the left side edge and right side edge of the lower-layer PCB board 300 are referred to as upper-layer left side edge 340, upper-layer right side edge 240, lower-layer left side edge 330, and lower-layer right side edge 340 respectively for distinguishing between them.

In this implementation, in the left-right direction Z of the vehicle-mounted power supply apparatus 10, the upper-layer left side edge 230 and the upper-layer right side edge 240 of the upper-layer PCB board 200 are respectively located on outer sides of the lower-layer left side edge 330 and the lower-layer right side edge 340 of the lower-layer PCB board 300. The outer side of the lower-layer left side edge 330 is a side, of the lower-layer left side edge 330, away from the lower-layer right side edge 340 along the left-right direction Z, and the outer side of the lower-layer right side edge 340 is a side, of the lower-layer right side edge 340, away from the lower-layer left side edge 330 along the left-right direction Z. A value of a distance between the upper-layer left side edge 230 and the upper-layer right side edge 240 in the left-right direction Z of the vehicle-mounted power supply apparatus 10 is D3, and a value of a distance between the lower-layer left side edge 330 and the lower-layer right side edge 340 in the left-right direction Z of the vehicle-mounted power supply apparatus 10 is D4. D3>D4 is set, so that an orthographic projection of the upper-layer PCB board 200 on the lower-layer PCB board 300 can cover the lower-layer PCB board 300 in the left-right direction Z. This facilitates mounting of a component with a large volume on the upper-layer PCB board 200. In addition, the component with a large volume can be further fastened to the bottom cover 100, thereby improving overall stability of the vehicle-mounted power supply apparatus 10.

Figure 8:
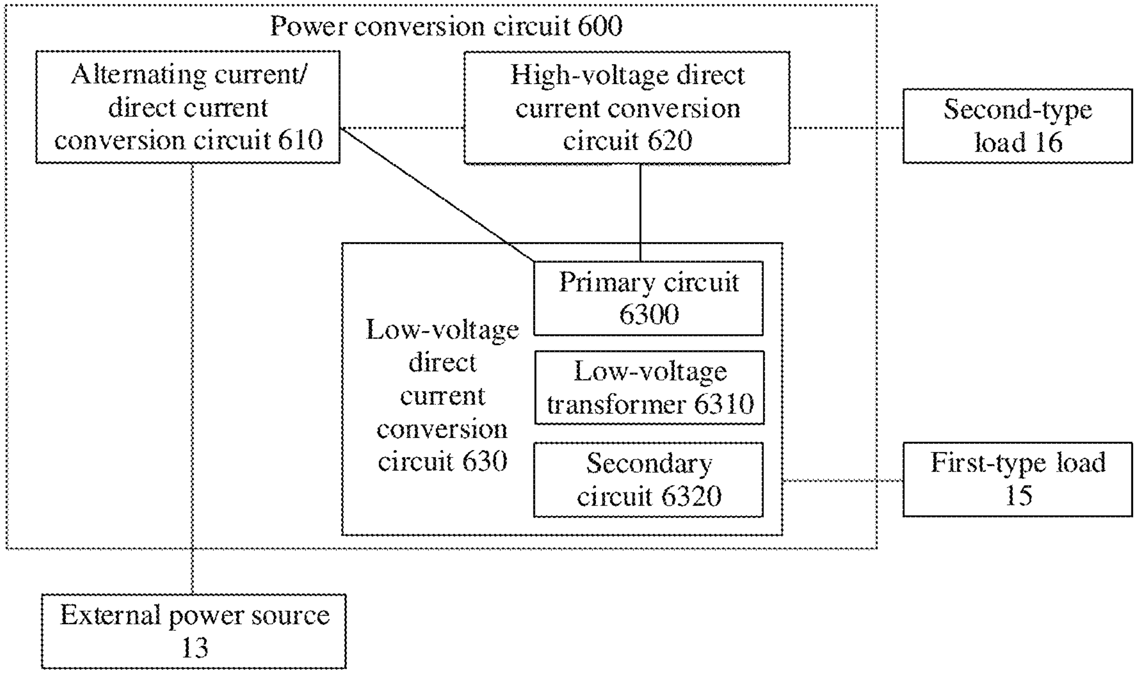
FIG. 8 is a schematic diagram of an application scenario of a power conversion circuit according to an implementation.

FIG. 8 is a schematic diagram of an application scenario of the power conversion circuit 600 according to an implementation. In an implementation, the power conversion circuit 600 includes an alternating current/direct current conversion circuit 610, a low-voltage direct current conversion circuit 630, and a high-voltage direct current conversion circuit 620. The alternating current/direct current conversion circuit 610 is configured to receive an alternating current and supply power to at least one of the high-voltage direct current conversion circuit 620 or the low-voltage direct current conversion circuit 630. The low-voltage direct current conversion circuit 630 is configured to receive power supplied by at least one of the alternating current/direct current conversion circuit 610 or the high-voltage direct current conversion circuit 620, and output a first direct current. The high-voltage direct current conversion circuit 620 is configured to receive power supplied by the alternating current/direct current conversion circuit 610 and output a second direct current, where a voltage of the second direct current is higher than a voltage of the first direct current.

In this implementation, the external power source 13 inputs an alternating current to the power conversion circuit 600. The alternating current is transmitted to at least one of the low-voltage direct current conversion circuit 630 and the high-voltage direct current conversion circuit 620 after passing through the alternating current/direct current conversion circuit 610. After receiving the alternating current, the high-voltage direct current conversion circuit 620 converts the alternating current into the second direct current, and supplies power to the second-type load 16. Alternatively, the high-voltage direct current conversion circuit 620 converts the alternating current into the second direct current, and supplies power to the low-voltage direct current conversion circuit 630. After receiving the alternating current, the low-voltage direct current conversion circuit 630 converts the alternating current into the first direct current, and supplies power to the first-type load. Alternatively, the low-voltage direct current conversion circuit 630 receives the second direct current, converts the second direct current into the first direct current, and supplies power to the first-type load. The voltage of the second direct current is higher than the voltage of the first direct current. After the alternating current provided by the external power source 13 passes through the power conversion circuit 600, the alternating current is converted into a direct current, and a voltage is changed. In this way, the vehicle-mounted power supply apparatus 10 can supply power to different types of vehicle-mounted loads, thereby improving adaptability of the vehicle-mounted power supply apparatus 10.

In an implementation, the voltage of the first direct current is 12 V, the first-type load is a low-voltage load, the second-type load is a high-voltage load, and the voltage of the second direct current is 200 V to 750 V. In some other implementations, specific voltage values of the first direct current and the second direct current may be set based on a requirement, but the voltage of the second direct current needs to be greater than the voltage of the first direct current.

Figure 9:
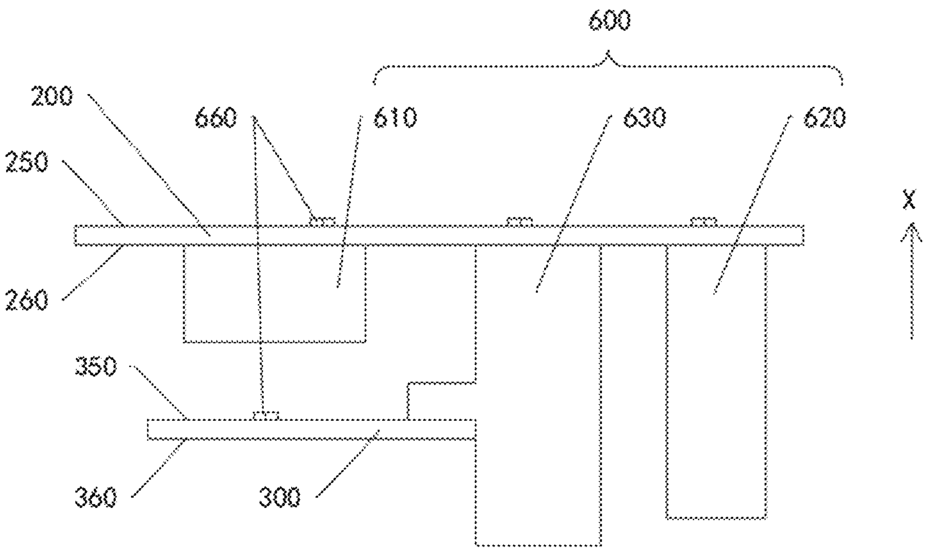
FIG. 9 is a schematic diagram of a structure of an upper-layer PCB board, a lower-layer PCB board, and a power conversion circuit according to an implementation.

FIG. 9 is a schematic diagram of a structure of the upper-layer PCB board 200, the lower-layer PCB board 300, and the power conversion circuit 600 according to an implementation. In an implementation, the alternating current/direct current conversion circuit 610, the high-voltage direct current conversion circuit 620, and a part of the low-voltage direct current conversion circuit 630 are disposed on the upper-layer PCB board 200: and a part of the low-voltage direct current conversion circuit 630 is disposed on the lower-layer PCB board 300.

In this implementation, the alternating current/direct current conversion circuit 610 and the high-voltage direct current conversion circuit 620 are fixedly connected to the upper-layer PCB board 200, and the low-voltage direct current conversion circuit 630 is fixedly connected to both the upper-layer PCB board 200 and the lower-layer PCB board 300. This facilitates arrangement of components on the upper-layer PCB board 200 and the lower-layer PCB board 300 based on different functions of the alternating current/direct current conversion circuit 610, the high-voltage direct current conversion circuit 620, and the low-voltage direct current conversion circuit 630, so that the layout of the power conversion circuit 600 is more appropriate. In an implementation, a part of the alternating current/direct current conversion circuit 610, a part of the high-voltage direct current conversion circuit 620, and the part of the low-voltage direct current conversion circuit 630 that are disposed on the upper-layer PCB board 200 are located around at least two side edges of the lower-layer PCB board 300.

It should be noted that arrangement positions of different components in the power conversion circuit 600 shown in FIG. 9 are merely an example, and do not represent a specific structure, size, and position relationship of the power conversion circuit 600.

Figure 10:
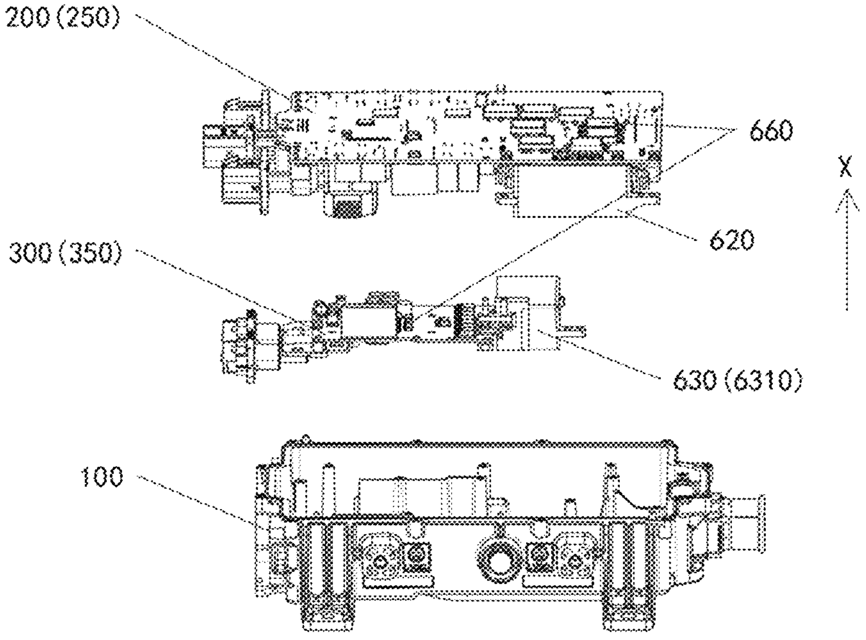
FIG. 10 is a schematic diagram of a structure of a vehicle-mounted power supply apparatus according to an implementation.

Refer to FIG. 9 and FIG. 10. FIG. 10 is a schematic diagram of a structure of the vehicle-mounted power supply apparatus 10 according to an implementation. In an implementation, a lower surface 260 of the upper-layer PCB board 200 is disposed opposite to an upper surface 350 of the lower-layer PCB board 300 (as shown in FIG. 9). An upper surface 250 of the upper-layer PCB board 200 is configured to bear a plurality of power switching transistors 660 of the alternating current/direct current conversion circuit 610, a plurality of power switching transistors 660 of the high-voltage direct current conversion circuit 620, and a plurality of power switching transistors 660 of a primary circuit (as shown in FIG. 9 and FIG. 10). The upper surface 350 of the lower-layer PCB board 300 is configured to bear a plurality of power switching transistors 660 of a secondary circuit (as shown in FIG. 9 and FIG. 10).

In this implementation, the lower surface 260 of the upper-layer PCB board 200 and the upper surface 350 of the lower-layer PCB board 300 are disposed opposite to each other along the height direction X of the vehicle-mounted power supply apparatus 10. Because the lower surface 260 of the upper-layer PCB board 200 is configured to mount more components, some of the power switching transistors 660 are disposed on the upper surface 250 of the upper-layer PCB board 200, which facilitates an overall layout of the alternating current/direct current conversion circuit 610, the high-voltage direct current conversion circuit 620, and the low-voltage direct current conversion circuit 630 on the upper-layer PCB board 200. In an implementation, some of the power switching transistors 660 are located between the upper surface 250 of the upper-layer PCB board 200 and the radiator 400, so that the radiator 400 can effectively cool the power switching transistors 660 through heat dissipation, thereby ensuring that working efficiency of the power switching transistors 660 is not affected by a temperature.

It should be noted that arrangement positions of the power switching transistors 660 shown in FIG. 9 are merely an example, and do not represent a specific structure, size, and position relationship.

Refer to FIG. 8 and FIG. 10. In an implementation, the low-voltage direct current conversion circuit 630 includes a low-voltage transformer 6310, a primary circuit 6300, and a secondary circuit 6320. The primary circuit 6300 is configured to receive power supplied by at least one of the alternating current/direct current conversion circuit 610 or the high-voltage direct current conversion circuit 620. The secondary circuit 6320 is configured to output the first direct current. The upper-layer PCB board 200 is configured to bear a plurality of power switching transistors 660 of the primary circuit 6300 in the low-voltage direct current conversion circuit 630. The lower-layer PCB board 300 is configured to bear a plurality of power switching transistors 660 of the secondary circuit 6320 in the low-voltage direct current conversion circuit 630. The bottom cover 100 is configured to fasten the low-voltage transformer 6310 in the low-voltage direct current conversion circuit 630.

In this implementation, the primary circuit 6300 is electrically connected to the part of the power conversion circuit 600 on the upper-layer PCB board 200. The primary circuit 6300 converts a direct current into a square wave alternating between positive and negative. After the square wave passes through the low-voltage transformer 6310, a voltage of the square wave is reduced. Then, the secondary circuit 6320 converts the square wave with a reduced voltage into the first direct current. For example, a voltage of the direct current is 100 V, a voltage of the square wave alternating between positive and negative is +100 V to −100 V, a voltage, after voltage conversion, of the square wave alternating between positive and negative is +12 V to −12 V, and the voltage of the second direct current is 12 V. In this solution, the primary circuit 6300, the low-voltage transformer 6310, and the secondary circuit 6320 are disposed in the low-voltage direct current conversion circuit 630, so that the vehicle-mounted power supply apparatus 10 can convert a direct current into the second direct current and supply power to a battery.

In this implementation, the upper-layer PCB board 200 and the lower-layer PCB board 300 are respectively configured to bear the plurality of power switching transistors 660 of the primary circuit 6300 and the plurality of power switching transistors 660 of the secondary circuit 6320, so that the low-voltage direct current conversion circuit 630 is distributed on the upper-layer PCB board 200 and the lower-layer PCB board 300. Compared with an implementation in which all the power switching transistors 660 of the low-voltage direct current conversion circuit 630 are borne on one PCB board, in this implementation, the components are distributed more flexibly.

In this implementation, the low-voltage transformer 6310 is fixedly connected to both the upper-layer PCB board 200 and the lower-layer PCB board 300, so that other components electrically connected to the low-voltage transformer 6310 may be disposed on the upper-layer PCB board 200 and the lower-layer PCB board 300, to avoid that all the components in the power conversion circuit 600 are mounted on the upper-layer PCB board 200 or the lower-layer PCB board 300. This can effectively reduce an area of a mounting surface of the upper-layer PCB board 200 and the lower-layer PCB board 300, thereby facilitating a miniaturization design of the vehicle-mounted power supply apparatus 10.

In this implementation, the low-voltage transformer 6310 is also fastened to the bottom cover 100, so that the low-voltage transformer 6310, the lower-layer PCB board 300, the upper-layer PCB board 200, and the radiator 400 are all fastened to the bottom cover 100. This further makes overall structural strength of these parts in the vehicle-mounted power supply apparatus 10 higher.

Figure 11:
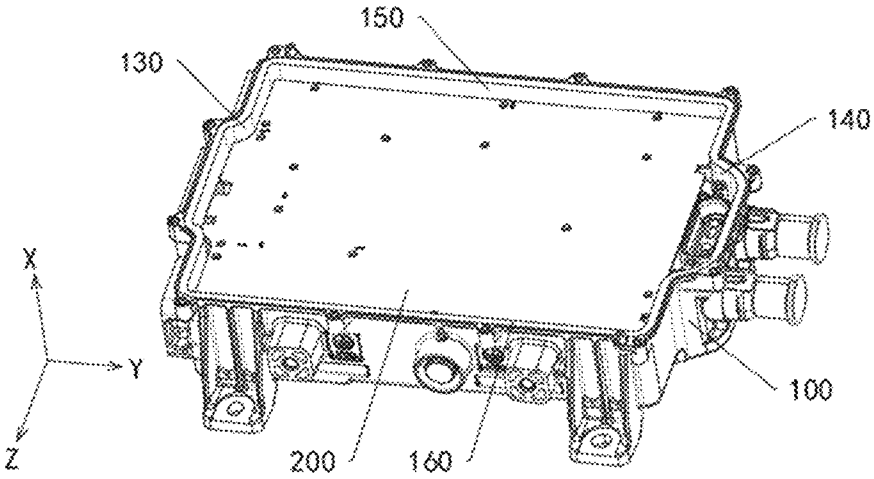
FIG. 11 is a schematic diagram of a structure of a bottom cover and an upper-layer PCB board according to an implementation.
Figure 12:
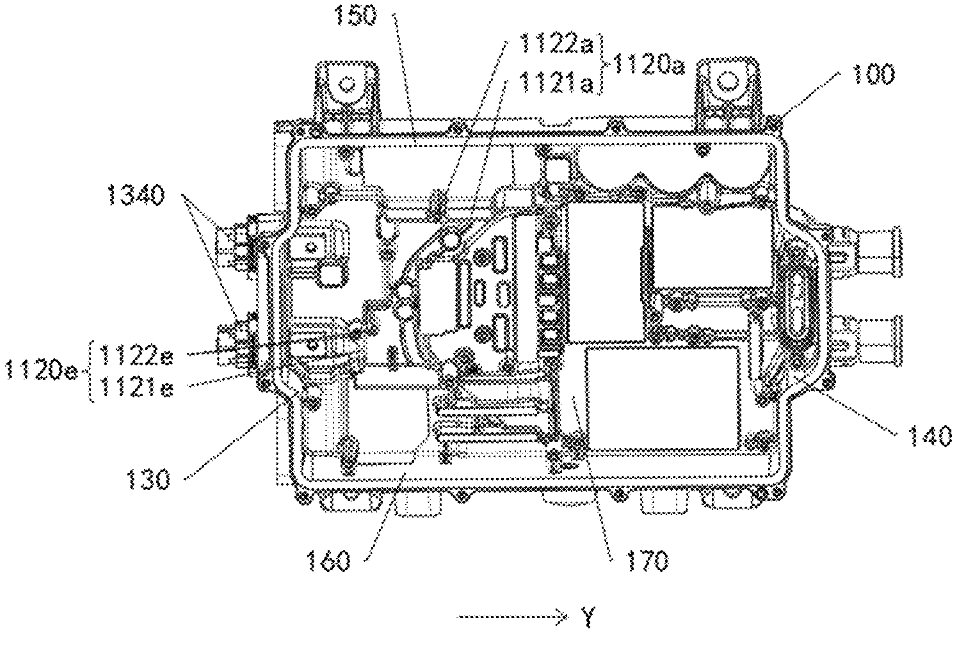
FIG. 12 is a schematic diagram of a structure of a bottom cover according to an implementation.

FIG. 11 is a schematic diagram of a structure of the bottom cover 100 and the upper-layer PCB board 200 according to an implementation. FIG. 12 is a schematic diagram of a structure of the bottom cover 100 according to an implementation. In an implementation, the bottom cover 100 includes a bottom plate 170, a front side wall 130, a rear side wall 140, a left side wall 150, and a right side wall 160 (as shown in FIG. 11 and FIG. 12). The front side wall 130 and the rear side wall 140 are disposed opposite to each other (as shown in FIG. 12). The left side wall 150 and the right side wall 160 are disposed opposite to each other (as shown in FIG. 11 and FIG. 12). The bottom plate 170, the front side wall 130, the rear side wall 140, the left side wall 150, and the right side wall 160 form a groove structure (as shown in FIG. 11). In the height direction X of the vehicle-mounted power supply apparatus 10, a height of any one of the front side wall 130, the rear side wall 140, the left side wall 150, and the right side wall 160 is greater than a height of the upper-layer PCB board 200 (as shown in FIG. 11).

In this implementation, the bottom cover 100 includes four side walls that are sequentially connected. The four side walls are respectively the front side wall 130, the rear side wall 140, the left side wall 150, and the right side wall 160. The front side wall 130 and the rear side wall 140 are arranged along the front-rear direction Y of the vehicle-mounted power supply apparatus 10. The front-rear direction Y of the vehicle-mounted power supply apparatus 10 is a direction in which the front side wall 130 points to the rear side wall 140. The left side wall 150 and the right side wall 160 are arranged along the left-right direction Z of the vehicle-mounted power supply apparatus 10. The left-right direction Z of the vehicle-mounted power supply apparatus 10 is a direction in which the left side wall 150 points to the right side wall 160. The bottom plate 170 and the cover plate 500 are arranged along the height direction X of the vehicle-mounted power supply apparatus 10. The height direction X of the vehicle-mounted power supply apparatus 10 is a direction in which the bottom plate 170 points to the cover plate 500. The front-rear direction Y and the left-right direction Z of the vehicle-mounted power supply apparatus 10 perpendicularly intersect, and both perpendicularly intersect the height direction X.

It should be noted that "front", "rear", "left", and "right" are relative. When the vehicle-mounted power supply apparatus 10 is placed differently, the front-rear direction Y may also be the left-right direction Z, and the left-right direction Z may also be the front-rear direction Y. In an implementation, the left side wall and the right side wall are interchangeable. In an implementation, the front side wall and the rear side wall are interchangeable.

In this implementation, the height of the upper-layer PCB board 200 refers to a distance between the upper-layer PCB board 200 and the bottom plate 170. A height of any side wall in the bottom cover 100 is greater than the height of the upper-layer PCB board 200, so that the upper-layer PCB board 200 is located inside the bottom cover 100, and there is space above the upper-layer PCB board 200 to accommodate the radiator 400 or the plurality of power switching transistors 660 on the upper surface of the upper-layer PCB board 200.

Figure 13:
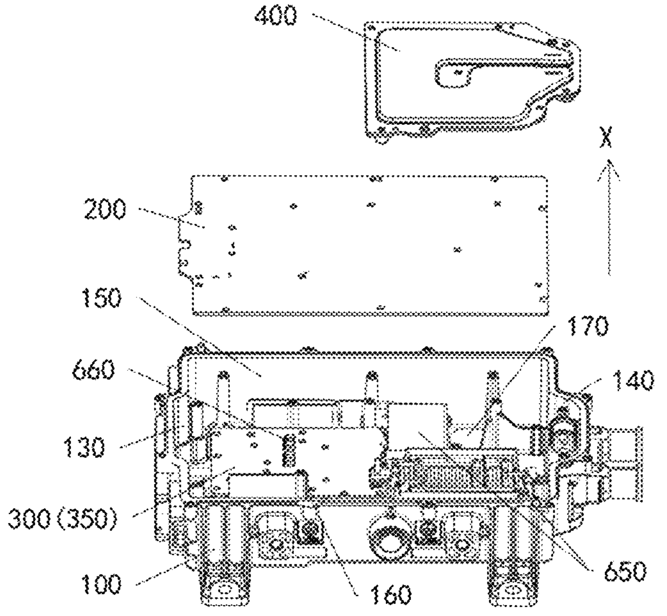
FIG. 13 is a partial exploded view of a vehicle-mounted power supply apparatus according to an implementation.
Figure 14:
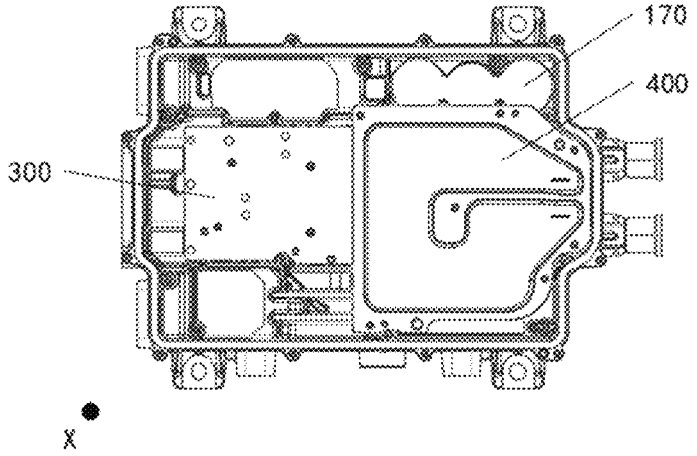
FIG. 14 is a schematic diagram of a partial structure of a vehicle-mounted power supply apparatus according to an implementation.

FIG. 13 is a partial exploded view of the vehicle-mounted power supply apparatus 10 according to an implementation. FIG. 14 is a schematic diagram of a partial structure of the vehicle-mounted power supply apparatus 10 according to an implementation. In an implementation, the lower-layer PCB board 300 and the plurality of transformers 650 are arranged above the bottom plate 170 in a flat manner (as shown in FIG. 13). The upper-layer PCB board 200 is stacked above the lower-layer PCB board 300 and the plurality of transformers 650 (as shown in FIG. 13). The radiator 400 is stacked above the upper-layer PCB board 200 (as shown in FIG. 13). An orthographic projection of the lower-layer PCB board 300 on the bottom plate 170 and an orthographic projection of the radiator 400 on the bottom plate 170 do not overlap (as shown in FIG. 14).

In this implementation, that the lower-layer PCB board 300 and the plurality of transformers 650 are arranged above the bottom plate 170 in a flat manner means that orthographic projections of the lower-layer PCB board 300 and the plurality of transformers 650 on the bottom plate 170 do not overlap. In an implementation, the lower-layer PCB board 300 and the plurality of transformers 650 may be arranged along the left-right direction Z or the front-rear direction Y of the vehicle-mounted power supply apparatus 10. In this flat arrangement manner, space above the bottom plate 170 can be fully used, so that the lower-layer PCB board 300 and the plurality of transformers 650 are distributed in the bottom cover 100 in more compact way, which facilitates miniaturization of the vehicle-mounted power supply apparatus 10.

In this implementation, the upper-layer PCB board 200 is stacked above the lower-layer PCB board 300 and the plurality of transformers 650, so that the upper-layer PCB board 200 covers the lower-layer PCB board 300 and the plurality of transformers 650, and the transformers 650 are electrically connected to the lower surface 260 of the upper-layer PCB board 200 in a plug-in manner.

In an implementation, an area of the surface of the upper-layer PCB board 200 is greater than an area of the surface of the lower-layer PCB board 300, so that the lower-layer PCB board 300 and the plurality of transformers 650 can be arranged in a flat manner between the upper-layer PCB board 200 and the bottom plate 170.

In an implementation, the plurality of transformers 650 include an LLC transformer 6200 in the high-voltage direct current conversion circuit 620 and the low-voltage transformer 6310 in the low-voltage direct current conversion circuit 630.

In this implementation, the plurality of transformers 650 and the lower-layer PCB board 300 are arranged in a flat manner, the orthographic projection of the lower-layer PCB board 300 on the bottom plate 170 and the orthographic projection of the radiator 400 on the bottom plate 170 do not overlap. Therefore, the radiator 400 can maximally be stacked with the plurality of transformers 650 in the height direction X. This helps improve a heat dissipation effect of the radiator 400 on the plurality of transformers 650, thereby improving a heat dissipation effect of the vehicle-mounted power supply apparatus 10, and improving power of the vehicle-mounted power supply apparatus 10.

Figure 15:
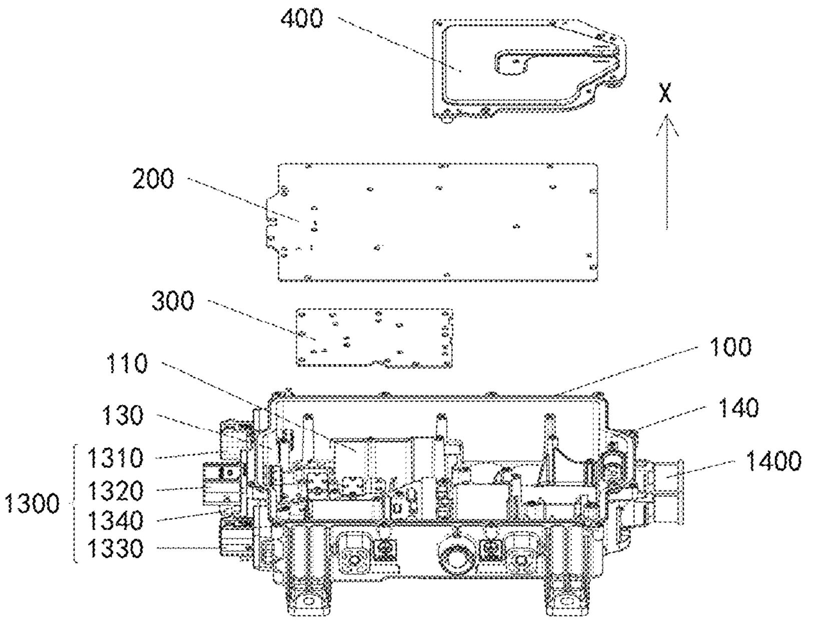
FIG. 15 is a partial exploded view of a vehicle-mounted power supply apparatus according to an implementation.

FIG. 15 is a partial exploded view of the vehicle-mounted power supply apparatus 10 according to an implementation. In an implementation, the front side wall 130 includes a plurality of electrical interfaces 1300, and the rear side wall 140 includes a cooling channel interface 1400. The lower-layer PCB board 300 is closer to the front side wall 130 than the radiator 400. The lower-layer PCB board 300 and the upper-layer PCB board 200 are configured to electrically connect to at least one of the plurality of electrical interfaces 1300. The radiator 400 is closer to the rear side wall 140 than the lower-layer PCB board 300. The radiator 400 is configured to connect to the cooling channel interface 1400.

In an implementation, the plurality of electrical interfaces 1300 include two first direct current interfaces 1340, one second direct current interface 1330, a power interface 1310, and a control signal interface 1320. The first direct current interface 1340 is configured to output the first direct current. The second direct current interface 1330 is configured to output the second direct current. The power interface 1310 is configured to input an alternating current. The control signal interface 1320 is configured to transmit a signal.

In this implementation, the plurality of electrical interfaces 1300 are provided on the front side wall 130, and the cooling channel interface 1400 is provided on the rear side wall 140, so that the electrical interfaces 1300 and the cooling channel interface 1400 are isolated in physical space. This prevents coolant leaked from the cooling channel interface 1400 from affecting electrical performance of the electrical interfaces 1300, so that the vehicle-mounted power supply apparatus 10 is safer.

In this implementation, the front side wall 130 is provided with the electrical interfaces 1300, the secondary circuit 6320 in the low-voltage direct current conversion circuit 630 is located on the lower-layer PCB board 300, and the lower-layer PCB board 300 is disposed close to the front side wall 130 along the front-rear direction Y of the vehicle-mounted power supply apparatus 10. This facilitates transmitting the first direct current output by the secondary circuit 6320 in the low-voltage direct current conversion circuit 630 to the first-type load through the electrical interface 1300. Therefore, a distance between the electrical interface 1300 and an output end of the secondary circuit 6320 in the low-voltage direct current conversion circuit 630 is shortened, and the layout of the vehicle-mounted power supply apparatus 10 is more appropriate.

In this implementation, the rear side wall 140 is provided with the cooling channel interface 1400. The radiator 400 is disposed closer to the rear side wall 140 than the lower-layer PCB board 300. In this way, a connection distance between the radiator 400 and the cooling channel interface 1400 is shorter, which better ensures sealing between the radiator 400 and the cooling channel interface 1400. The lower-layer PCB board 300 is farther away from the cooling channel interface 1400 in the rear side wall 140, to prevent the lower-layer PCB board 300 from being damaged by coolant leaked from the cooling channel.

Figure 16:
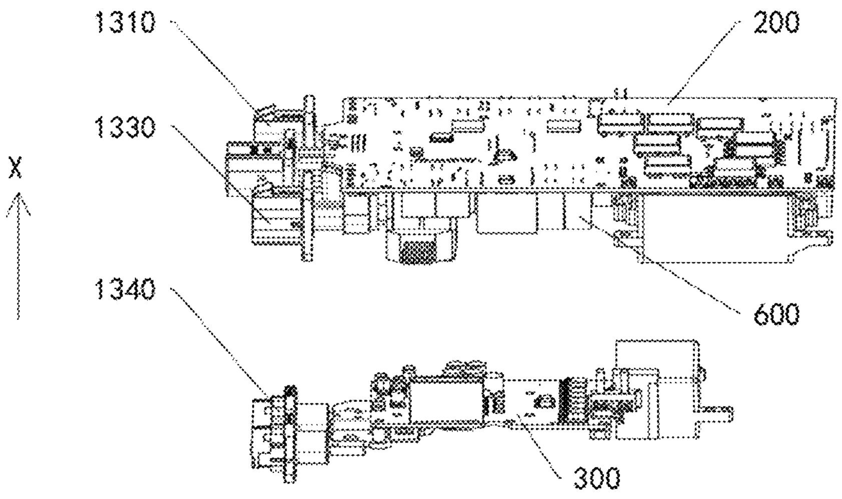
FIG. 16 is a schematic diagram of a partial structure of a vehicle-mounted power supply apparatus according to an implementation.

Refer to FIG. 3 and FIG. 16. In an implementation, the power conversion circuit 600 is configured to receive the external power source 13 through the power interface 1310, and is configured to output a first direct current through the first direct current interface 1340 and output a second direct current through the second direct current interface 1330. A voltage of the second direct current is higher than a voltage of the first direct current. The lower-layer PCB board 300 is configured to electrically connect to the first direct current interface 1340 (as shown in FIG. 16), and the upper-layer PCB board 200 is configured to electrically connect to the second direct current interface 1330 and the power interface 1310 (as shown in FIG. 16).

In this implementation, the power conversion circuit 600 performs functions of alternating current/direct current conversion and voltage conversion. The power conversion circuit 600 converts an alternating current input by the external power source 13 through the power interface 1310 into a first direct current and a second direct current. The second direct current is output, through the second direct current interface 1330, by the part of power conversion circuits 600 located on the upper-layer PCB board 200, and the first direct current is output, through the first direct current interface 1340, by the part of power conversion circuits 600 located on the lower-layer PCB board 300. The voltage of the second direct current is higher than the voltage of the first direct current, so that the vehicle-mounted power supply apparatus 10 can meet power consumption requirements of different loads.

In this implementation, the upper-layer PCB board 200 and the lower-layer PCB board 300 that are stacked are electrically connected to different interfaces. Compared with an implementation in which the different interfaces are electrically connected to one PCB board, in this implementation, the electrical interfaces are arranged more flexibly, and electrical isolation between the electrical interfaces is higher and safer. In addition, the upper-layer PCB board 200 and the lower-layer PCB board 300 are separately configured to bear components having different functions, and the upper-layer PCB board 200 and the lower-layer PCB board 300 are properly arranged for the power conversion circuit 600. This facilitates the miniaturization design of the vehicle-mounted power supply apparatus 10, and optimizes an entire vehicle layout.

Figure 17:
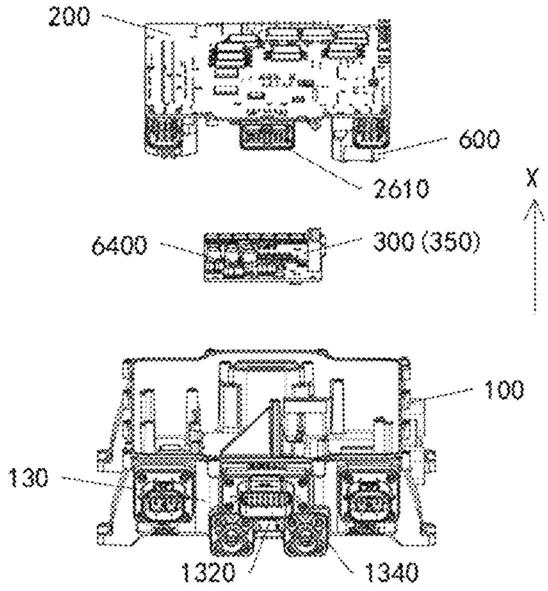
FIG. 17 is a partial exploded view of a vehicle-mounted power supply apparatus according to an implementation.
Figure 18:
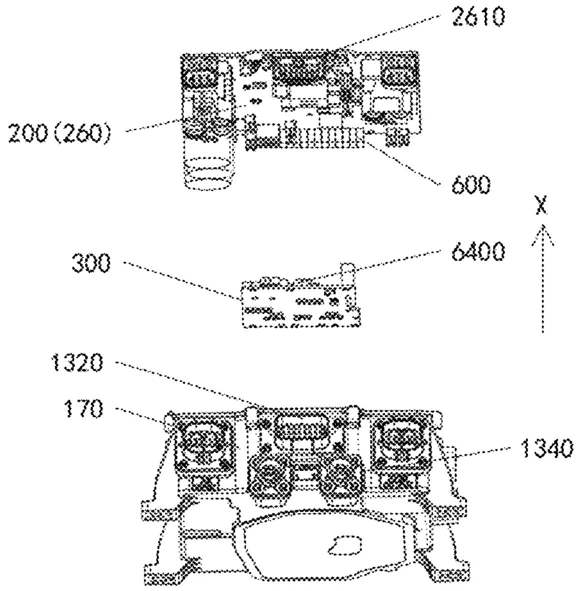
FIG. 18 is a partial exploded view of a vehicle-mounted power supply apparatus according to an implementation.

FIG. 17 is a partial exploded view of the vehicle-mounted power supply apparatus 10 according to an implementation. FIG. 18 is a partial exploded view of the vehicle-mounted power supply apparatus 10 according to an implementation. In an implementation, the front side wall 130 includes the first direct current interface 1340 and the control signal interface 1320. The power conversion circuit 600 outputs a first direct current through the first direct current interface 1340, and receives a control signal through the control signal interface 1320. The lower surface 260 of the upper-layer PCB board 200 includes a control signal connector 2610. The control signal connector 2610 is configured to electrically connect the control signal interface 1320 to the upper-layer PCB board 200. The upper surface 350 of the lower-layer PCB board 300 includes at least a part of a low-voltage filter circuit 6400. The low-voltage filter circuit 6400 is configured to electrically connect the first direct current interface 1340 to the lower-layer PCB board 300.

In this implementation, the control signal connector 2610 is disposed on the lower surface 260 of the upper-layer PCB board 200, and the part of the low-voltage filter circuit 6400 is disposed on the upper surface 350 of the lower-layer PCB board 300, so that space between the upper-layer PCB board 200 and the lower-layer PCB board 300 can be fully used.

In an implementation, the low-voltage filter circuit 6400 includes a capacitor, an inductor, and a copper bar. The capacitor may be disposed on the upper surface 350 of the lower-layer PCB board 300, and the inductor and the copper bar may be disposed on the lower surface 360 of the lower-layer PCB board 300. In another implementation, another arrangement may also be used based on an actual requirement.

Figure 19:
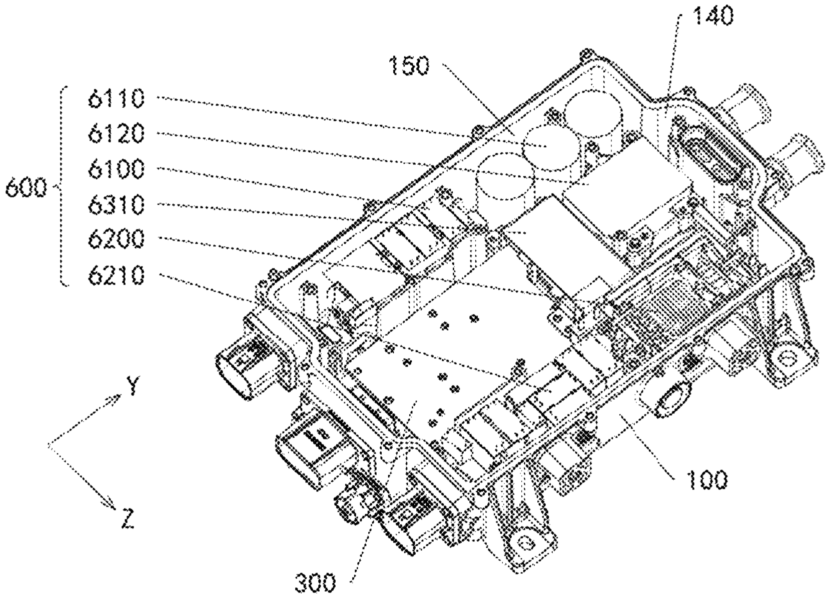
FIG. 19 is a schematic diagram of a partial structure of a vehicle-mounted power supply apparatus according to an implementation.
Figure 20:
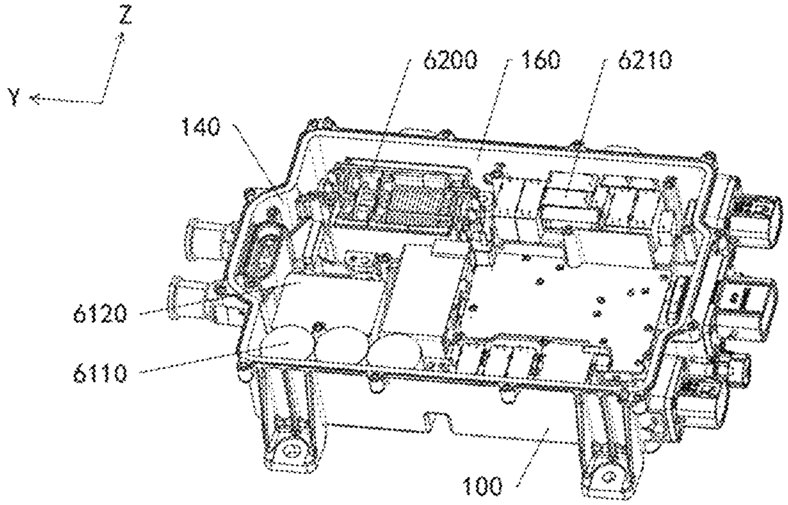
FIG. 20 is a schematic diagram of a partial structure of a vehicle-mounted power supply apparatus according to an implementation.

FIG. 19 is a schematic diagram of a partial structure of the vehicle-mounted power supply apparatus 10 according to an implementation. FIG. 20 is a schematic diagram of a partial structure of the vehicle-mounted power supply apparatus 10 according to an implementation. In an implementation, the power conversion circuit 600 includes an AC filter 6100, a PFC capacitor 6110, a PFC inductor 6120, a low-voltage transformer 6310, an LLC transformer 6200, and an HVDC filter 6210 (as shown in FIG. 19). The PFC capacitor 6110, the PFC inductor 6120, and the LLC transformer 6200 are adjacently arranged close to the rear side wall 140 of the vehicle-mounted power supply apparatus 10 (as shown in FIG. 19). The PFC capacitor 6110 and the AC filter 6100 are adjacently arranged close to the right side wall 160 of the vehicle-mounted power supply apparatus 10 (as shown in FIG. 19). The HVDC filter 6210 and the LLC transformer 6200 are adjacently arranged close to the left side wall 150 of the vehicle-mounted power supply apparatus 10 (as shown in FIG. 20).

In this implementation, the components in the power conversion circuit 600 are disposed close to at least one side wall of the vehicle-mounted power supply apparatus 10, so that other components can be disposed in unoccupied regions between the front side wall 130 and the right side wall 160 and between the left side wall 150 and the right side wall 160. This improves utilization of internal space of the vehicle-mounted power supply apparatus 10.

Refer to FIG. 19. In an implementation, the power conversion circuit 600 includes the AC filter 6100, the PFC capacitor 6110, the PFC inductor 6120, the HVDC filter 6210, the LLC transformer 6200, and the low-voltage transformer 6310. The AC filter 6100, the PFC capacitor 6110, the PFC inductor 6120, the HVDC filter 6210, the LLC transformer 6200, the low-voltage transformer 6310, and the lower-layer PCB board 300 are arranged in a flat manner to the bottom cover 100.

The AC filter 6100 is a filter in the alternating current/direct current conversion circuit 610, and the AC filter 6100 may also be referred to as an alternating current filter. The HVDC filter 6210 is a filter in the high-voltage direct current conversion circuit 620, and the HVDC filter 6210 may also be referred to as a high-voltage direct current filter.

The PFC capacitor 6110 is a capacitor in the alternating current/direct current conversion circuit 610. The PFC inductor 6120 is an inductor in the alternating current/direct current conversion circuit 610.

The LLC transformer 6200 and the low-voltage transformer 6310 are two transformers in the power conversion circuit 600. The LLC transformer 6200 is a transformer in the high-voltage direct current conversion circuit 620, and may also be referred to as a high-voltage transformer. The low-voltage transformer 6310 is a transformer in the low-voltage direct current conversion circuit 630.

In this implementation, the AC filter 6100, the PFC capacitor 6110, the PFC inductor 6120, the HVDC filter 6210, the LLC transformer 6200, and the low-voltage transformer 6310 are all components with a large size and a great height in the vehicle-mounted power supply apparatus 10. These components are arranged in a flat manner and disposed close to the bottom cover 100, so that the power conversion circuit 600 occupies a smaller volume in the height direction X. This helps miniaturize the vehicle-mounted power supply apparatus 10, and makes a mounting process of the power conversion circuit 600 more convenient. The height refers to a size in the height direction X of the vehicle-mounted power supply apparatus 10.

In an implementation, the AC filter 6100, the PFC capacitor 6110, the PFC inductor 6120, the HVDC filter 6210, the LLC transformer 6200, and the low-voltage transformer 6310 are disposed around side edges of the lower-layer PCB board 300. The tight arrangement of the components can improve utilization of internal space of the vehicle-mounted power supply apparatus 10.

Figure 21:
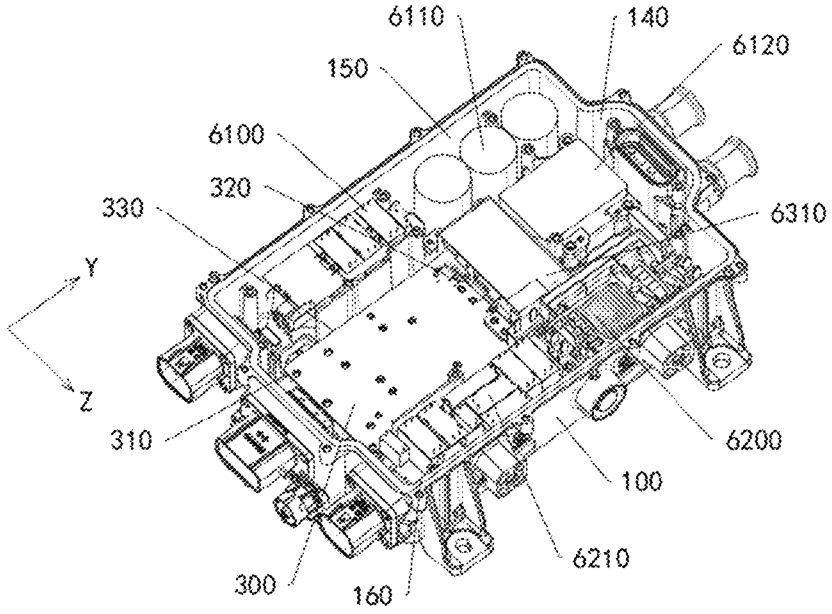
FIG. 21 is a schematic diagram of a structure of a bottom cover and a power conversion circuit according to an implementation.
Figure 22:
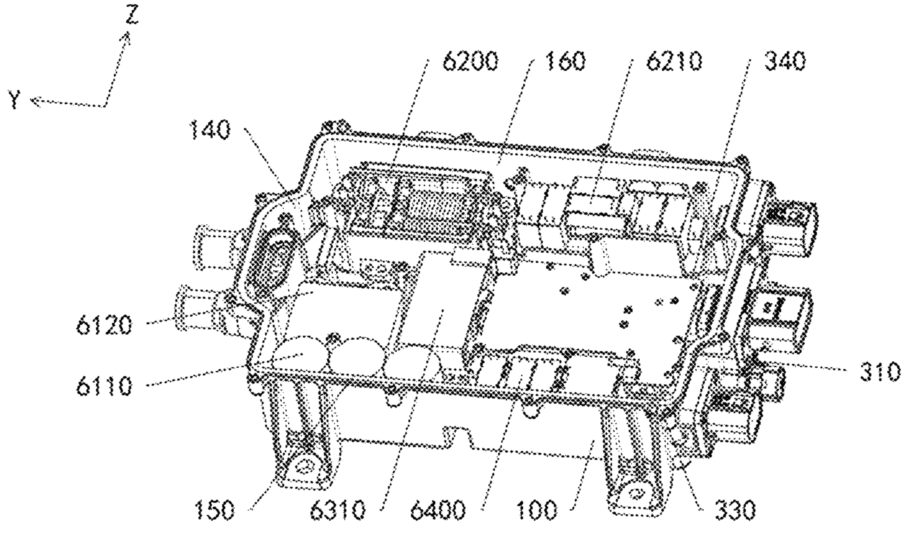
FIG. 22 is a schematic diagram of a structure of a bottom cover and a power conversion circuit according to an implementation.

FIG. 21 is a schematic diagram of a structure of the bottom cover 100 and the power conversion circuit 600 according to an implementation. FIG. 22 is a schematic diagram of a structure of the bottom cover 100 and the power conversion circuit 600 according to an implementation. In an implementation, the bottom plate 170, the front side wall 130, the rear side wall 140, the left side wall 150, and the right side wall 160 of the bottom cover 100 form a groove structure (as shown in FIG. 21 and FIG. 22). The groove structure is configured to bear the AC filter 6100, the HVDC filter 6210, the PFC capacitor 6110, the PFC inductor 6120, and the LLC transformer 6200. The PFC capacitor 6110, the PFC inductor 6120, and the LLC transformer 6200 are sequentially arranged in a flat manner close to the rear side wall 140 of the vehicle-mounted power supply apparatus 10 (as shown in FIG. 21). The PFC capacitor 6110 and the AC filter 6100 are sequentially arranged in a flat manner close to the left side wall 150 of the vehicle-mounted power supply apparatus 10 (as shown in FIG. 22). The HVDC filter 6210 and the LLC transformer 6200 are sequentially arranged in a flat manner close to the right side wall 160 of the vehicle-mounted power supply apparatus 10 (as shown in FIG. 21).

In the alternating current/direct current conversion circuit 610, the AC filter 6100 and the PFC capacitor 6110 are arranged along the front-rear direction Y of the vehicle-mounted power supply apparatus 10, the AC filter 6100 is located between the lower-layer left side edge 330 of the lower-layer PCB board 300 and the left side wall 150, the PFC capacitor 6110 and the PFC inductor 6120 are arranged along the left-right direction Z of the vehicle-mounted power supply apparatus 10, and the PFC inductor 6120 is located between the lower-layer rear side edge 320 of the lower-layer PCB board 300 and the rear side wall 140.

In this implementation, the AC filter 6100 and the PFC capacitor 6110 are located in space around the lower-layer left side edge 330 of the lower-layer PCB board 300, and the PFC inductor 6120 is located in space around the lower-layer rear side edge 320 of the lower-layer PCB board 300. The mounting space between the upper-layer PCB board 200 and the lower-layer PCB board 300 is flexibly used, which helps reduce a volume of the power conversion circuit 600 in the vehicle-mounted power supply apparatus 10.

In an implementation, the AC filter 6100 is disposed close to the front side wall 130 of the vehicle-mounted power supply apparatus 10, so that the AC filter 6100 is electrically connected to the power interface 1310 in the electrical interfaces 1300 on an outer side of the vehicle-mounted power supply apparatus 10.

In the high-voltage direct current conversion circuit 620, the HVDC filter 6210 and the LLC transformer 6200 are arranged along the front-rear direction Y of the vehicle-mounted power supply apparatus 10, the HVDC filter 6210 and the AC filter 6100 are located on two sides of the lower-layer PCB board 300 along the left-right direction Z of the vehicle-mounted power supply apparatus 10, and the PFC capacitor 6110, the PFC inductor 6120, and the LLC transformer 6200 are sequentially arranged along the left-right direction Z of the vehicle-mounted power supply apparatus 10.

In this implementation, the HVDC filter 6210 is located between the lower-layer right side edge 340 and the right side wall 160 of the lower-layer PCB board 300 (as shown in FIG. 22). The LLC transformer 6200 is located in space around the lower-layer right side edge 340 and the lower-layer rear side edge 320 of the lower-layer PCB board 300. The PFC capacitor 6110, the PFC inductor 6120, and the LLC transformer 6200 are all disposed close to the rear side wall 140. The mounting space between the upper-layer PCB board 200 and the lower-layer PCB board 300 is flexibly used, which helps reduce a volume of the power conversion circuit 600 in the vehicle-mounted power supply apparatus 10.

In an implementation, the HVDC filter 6210 is disposed close to the front side wall 130 of the vehicle-mounted power supply apparatus 10, so that the HVDC filter 6210 is electrically connected to the second direct current interface 1330 in the electrical interfaces 1300 on the outer side of the vehicle-mounted power supply apparatus 10.

Figure 23:
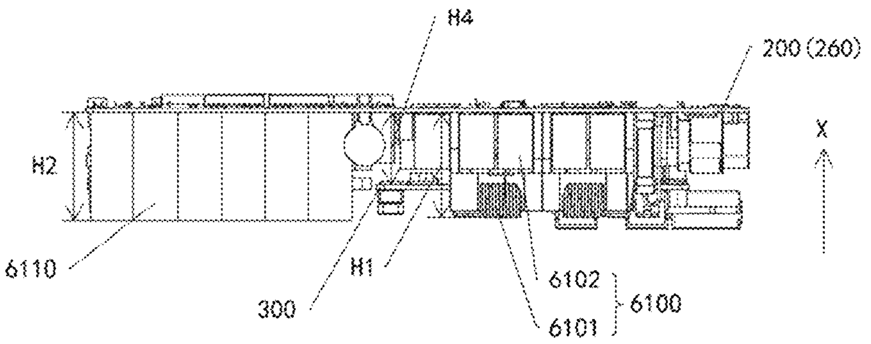
FIG. 23 is a schematic diagram of a structure of an upper-layer PCB board, a lower-layer PCB board, and a part of a power conversion circuit according to an implementation.
Figure 24:
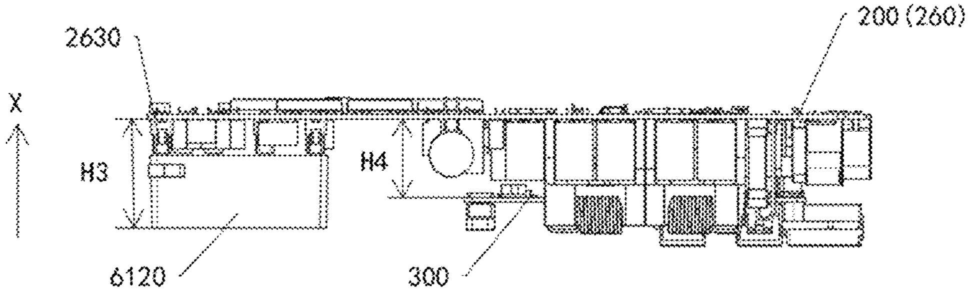
FIG. 24 is a schematic diagram of a structure of an upper-layer PCB board, a lower-layer PCB board, and a part of a power conversion circuit according to an implementation.

FIG. 23 is a schematic diagram of a structure of the upper-layer PCB board 200, the lower-layer PCB board 300, and a part of the power conversion circuit 600 according to an implementation. FIG. 24 is a schematic diagram of a structure of the upper-layer PCB board 200, the lower-layer PCB board 300, and a part of the power conversion circuit 600 according to an implementation. In an implementation, lengths of the AC filter 6100, the PFC capacitor 6110, and the PFC inductor 6120 in the height direction X of the vehicle-mounted power supply apparatus 10 are all greater than a distance between the upper-layer PCB board 200 and the lower-layer PCB board 300 in the height direction X of the vehicle-mounted power supply apparatus 10 (as shown in FIG. 23 and FIG. 24).

In this implementation, the lengths of the AC filter 6100, the PFC capacitor 6110, and the PFC inductor 6120 in the height direction X of the vehicle-mounted power supply apparatus 10 are respectively H1, H2, and H3, and the distance between the upper-layer PCB board 200 and the lower-layer PCB board 300 in the height direction X of the vehicle-mounted power supply apparatus 10 is H4. In this solution, H1>H4, H2>H4, and H3>H4 are set. In one aspect, the lengths of the AC filter 6100, the PFC capacitor 6110, and the PFC inductor 6120 in the height direction X of the vehicle-mounted power supply apparatus 10 all have large values. In this solution, the components are disposed between the lower-layer PCB board 300 and the bottom plate. Compared with an implementation in which the AC filter 6100, the PFC capacitor 6110, and the PFC inductor 6120 are disposed between the upper-layer PCB board 200 and the lower-layer PCB board 300, this solution is more conducive to reducing an overall height of the vehicle-mounted power supply apparatus 10. In another aspect, because the upper-layer PCB board 200, the lower-layer PCB board 300, and the bottom cover 100 are stacked, disposing the AC filter 6100, the PFC capacitor 6110, and the PFC inductor 6120 around side edges of the lower-layer PCB board 300 can enable the components to be directly and fixedly connected to the bottom cover 100. This makes mounting of the vehicle-mounted power supply apparatus 10 less difficult and reduces costs thereof.

In an implementation, the AC filter 6100 includes an AC filter inductor 6101 and an AC filter capacitor 6102. The AC filter inductor 6101 and the AC filter capacitor 6102 are stacked along the height direction X of the vehicle-mounted power supply apparatus 10, and the AC filter inductor 6101 is located on a side that is of the AC filter capacitor 6102 and that is away from the upper-layer PCB board 200. In this solution, the AC filter inductor 6101 and the AC filter capacitor 6102 are stacked, which helps reduce an area occupied by the AC filter 6100 on the upper-layer PCB board 200.

Figure 25:
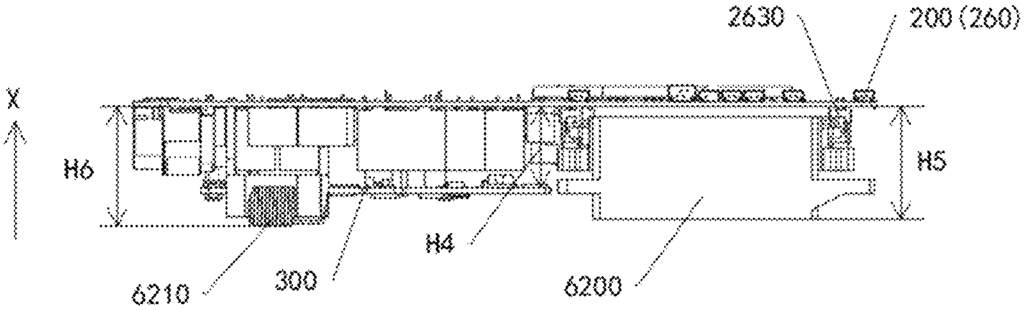
FIG. 25 is a schematic diagram of a structure of an upper-layer PCB board, a lower-layer PCB board, and a part of a power conversion circuit according to an implementation.

FIG. 25 is a schematic diagram of a structure of the upper-layer PCB board 200, the lower-layer PCB board 300, and a part of the power conversion circuit 600 according to an implementation. In an implementation, lengths of the LLC transformer 6200 and the HVDC filter 6210 in the height direction X of the vehicle-mounted power supply apparatus 10 are both greater than the distance between the upper-layer PCB board 200 and the lower-layer PCB board 300 in the height direction X of the vehicle-mounted power supply apparatus 10.

In this implementation, the lengths of the LLC transformer 6200 and the HVDC filter 6210 in the height direction X of the vehicle-mounted power supply apparatus 10 are respectively H5 and H6, and the distance between the upper-layer PCB board 200 and the lower-layer PCB board 300 in the height direction X of the vehicle-mounted power supply apparatus is H4. In this solution, H5>H4 and H6>H4 are set. In one aspect, the lengths of the LLC transformer 6200 and the HVDC filter 6210 in the height direction X of the vehicle-mounted power supply apparatus 10 both have large values. In this solution, the components are disposed between the lower-layer PCB board 300 and the bottom plate. Compared with an implementation in which the LLC transformer 6200 and the HVDC filter 6210 are disposed between the upper-layer PCB board 200 and the lower-layer PCB board 300, this solution is more conducive to reducing the overall height of the vehicle-mounted power supply apparatus 10. In another aspect, because the upper-layer PCB board 200, the lower-layer PCB board 300, and the bottom cover 100 are stacked, disposing the LLC transformer 6200 and the HVDC filter 6210 around the side edges of the lower-layer PCB board 300 can enable the components to be directly and fixedly connected to the bottom cover 100. This makes mounting of the vehicle-mounted power supply apparatus 10 less difficult and reduces costs thereof.

Figure 26:
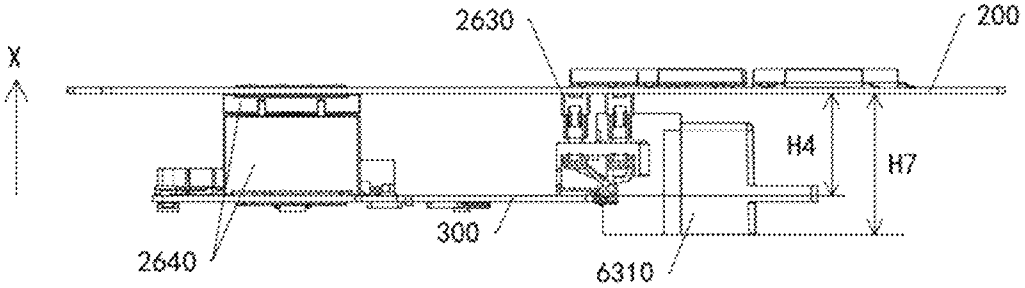
FIG. 26 is a schematic diagram of a structure of an upper-layer PCB board, a lower-layer PCB board, and a part of a power conversion circuit according to an implementation.

FIG. 26 is a schematic diagram of a structure of the upper-layer PCB board 200, the lower-layer PCB board 300, and a part of the power conversion circuit 600 according to an implementation. In an implementation, a length of the low-voltage transformer 6310 in the height direction X of the vehicle-mounted power supply apparatus 10 is greater than the distance between the upper-layer PCB board 200 and the lower-layer PCB board 300 in the height direction X of the vehicle-mounted power supply apparatus 10.

In this implementation, the length of the low-voltage transformer 6310 in the height direction X of the vehicle-mounted power supply apparatus 10 is H7, and the distance between the upper-layer PCB board 200 and the lower-layer PCB board 300 in the height direction X of the vehicle-mounted power supply apparatus 10 is H4. H7>H4 is set in this solution. In one aspect, the length of the low-voltage transformer 6310 in the height direction X of the vehicle-mounted power supply apparatus 10 has a large value. In this solution, the low-voltage transformer 6310 is disposed between the lower-layer PCB board 300 and the bottom plate. Compared with an implementation in which the low-voltage transformer 6310 is disposed between the upper-layer PCB board 200 and the lower-layer PCB board 300, this solution is more conducive to reducing the overall height of the vehicle-mounted power supply apparatus 10. In another aspect, because the upper-layer PCB board 200, the lower-layer PCB board 300, and the bottom cover 100 are stacked, disposing the low-voltage transformer 6310 around the side edges of the lower-layer PCB board 300 can enable the low-voltage transformer 6310 to be directly and fixedly connected to the bottom cover 100. This makes mounting of the vehicle-mounted power supply apparatus 10 less difficult and reduces costs thereof.

Figure 27:
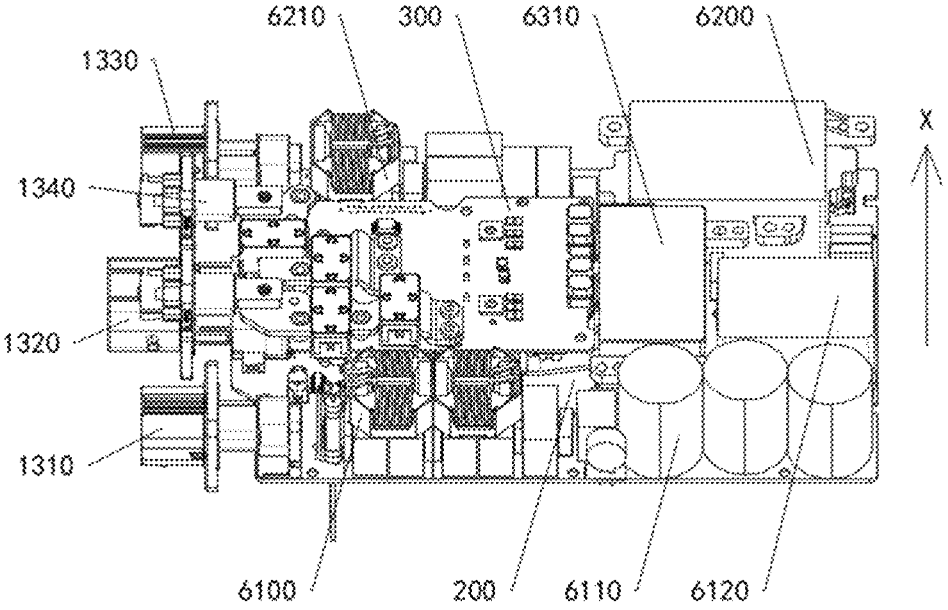
FIG. 27 is a schematic diagram of a partial structure of a vehicle-mounted power supply apparatus according to an implementation.

FIG. 27 is a schematic diagram of a partial structure of the vehicle-mounted power supply apparatus 10 according to an implementation. In an implementation, the AC filter 6100, the PFC capacitor 6110, and the PFC inductor 6120 are electrically connected to the upper-layer PCB board 200. The HVDC filter 6210 and the LLC transformer 6200 are electrically connected to the upper-layer PCB board 200. The low-voltage transformer 6310 is electrically connected to the upper-layer PCB board 200 and the lower-layer PCB board 300.

The AC filter 6100, the PFC capacitor 6110, and the PFC inductor 6120 are electronic components in the alternating current/direct current conversion circuit 610. The AC filter 6100 is configured to receive an alternating current and filter out a harmonic in the alternating current. The alternating current/direct current conversion circuit 610 is electrically connected to an output end of the AC filter 6100 and converts the alternating current output by the AC filter 6100 into a direct current. In this implementation, the AC filter 6100, the PFC capacitor 6110, and the PFC inductor 6120 are electrically connected through the upper-layer PCB board 200, so that the vehicle-mounted power supply apparatus 10 can implement a function of converting a power source into a direct current. This facilitates subsequent conversion of the direct current into a first direct current and a second direct current.

The HVDC filter 6210 and the LLC transformer 6200 are electronic components in the high-voltage direct current conversion circuit 620. An input end of the LLC transformer 6200 is electrically connected to the alternating current/direct current conversion circuit 610, and converts a direct current output by the alternating current/direct current conversion circuit 610 into the second direct current. An output end of the LLC transformer 6200 is electrically connected to the HVDC filter 6210. The HVDC filter 6210 is configured to filter out a harmonic in the second direct current output by the LLC transformer 6200 and transmit the second direct current to a battery. In this implementation, the HVDC filter 6210 and the LLC transformer 6200 are electrically connected through the upper-layer PCB board 200, so that the vehicle-mounted power supply apparatus 10 can implement a function of converting a direct current into the second direct current, thereby meeting a charging requirement of the battery.

The low-voltage transformer 6310 is an electronic component in the low-voltage direct current conversion circuit 630. The low-voltage transformer 6310 is electrically connected to the upper-layer PCB board 200 through the primary circuit 6300. The low-voltage transformer 6310 is electrically connected to the lower-layer PCB board 300 through the secondary circuit 6320. The low-voltage transformer 6310 receives at least one of the direct current transmitted by the alternating current/direct current conversion circuit 610 and the second direct current transmitted by the high-voltage direct current conversion circuit 620, and inputs the first direct current to the first-type load. In an implementation, the power conversion circuit 600 further includes an LVDC filter 6400, and the LVDC filter 6400 and the low-voltage transformer 6310 are electrically connected to the lower-layer PCB board 300. In this implementation, the LVDC filter 6400 is a filter in the low-voltage direct current conversion circuit 630. The LVDC filter 6400 may also be referred to as a low-voltage filter. An output end of the low-voltage transformer 6310 is electrically connected to the LVDC filter 6400. The LVDC filter 6400 is configured to filter out a harmonic in the first direct current output by the low-voltage transformer 6310. In this solution, the low-voltage transformer 6310 is set to be electrically connected to the LVDC filter 6400 through the lower-layer PCB board 300, so that the vehicle-mounted power supply apparatus 10 can implement a function of outputting the first direct current, thereby meeting a power consumption requirement of the first-type load.

Figure 28:
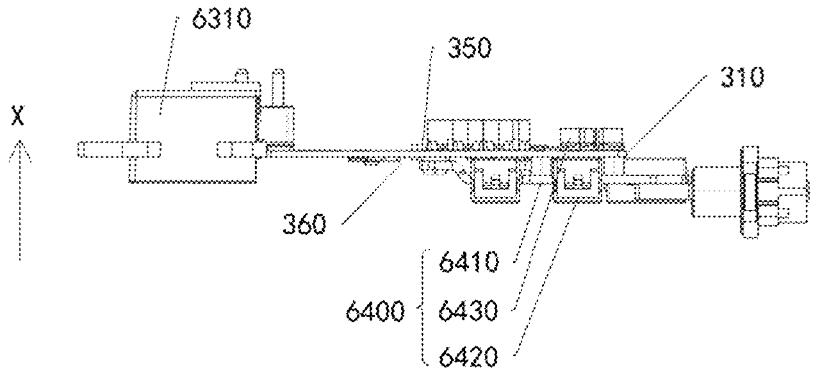
FIG. 28 is a schematic diagram of a structure of a lower-layer PCB board and a part of a power conversion circuit according to an implementation.

FIG. 28 is a schematic diagram of a structure of the lower-layer PCB board 300 and a part of the power conversion circuit 600 according to an implementation. In an implementation, the low-voltage direct current conversion circuit 630 further includes the LVDC filter 6400. The LVDC filter 6400 includes an LVDC filter copper bar assembly 6410, an LVDC filter magnetic ring 6420, and an LVDC filter capacitor 6430. The LVDC filter copper bar assembly 6410 and the LVDC filter magnetic ring 6420 are fastened to the lower surface 360 of the lower-layer PCB board 300. The LVDC filter capacitor 6430 is plugged on the upper surface 350 of the lower-layer PCB board 300.

The LVDC filter copper bar assembly 6410 is configured to electrically connect the LVDC filter magnetic ring 6420 to the LVDC filter capacitor 6430. The LVDC filter magnetic ring 6420 functions as a filter inductor, and the LVDC filter magnetic ring 6420 and the LVDC filter capacitor 6430 jointly implement a function of filtering the first direct current.

In this implementation, the LVDC filter copper bar assembly 6410 is fastened to the lower-layer PCB board 300 by using screws, and the LVDC filter magnetic ring 6420 is electrically connected to the lower-layer PCB board 300 and the LVDC filter capacitor 6430 through the LVDC filter copper bar assembly 6410. The LVDC filter capacitor 6430 is provided with a pin. The LVDC filter capacitor 6430 is fixedly connected to the lower-layer PCB board 300 through the pin.

In this implementation, the LVDC filter copper bar assembly 6410 and the LVDC filter magnetic ring 6420 are located on the upper surface 350 of the lower-layer PCB board 300, and the LVDC filter capacitor 6430 is located on the lower surface 360 of the lower-layer PCB board 300. Compared with an implementation in which the LVDC filter copper bar assembly 6410, the LVDC filter magnetic ring 6420, and the LVDC filter capacitor 6430 are all disposed on the upper surface 350 or the lower surface 360 of the lower-layer PCB board 300, this solution helps reduce a mounting area occupied by the LVDC filter 6400 on a same surface of the lower-layer PCB board 300, and helps provide space for mounting another component on the upper surface 350 or the lower surface 360 of the lower-layer PCB board 300.

In this implementation, the LVDC filter capacitor 6430 is disposed close to the lower-layer front side edge 310 of the lower-layer PCB board 300, and the LVDC filter capacitor 6430 and the low-voltage transformer 6310 are spaced. This helps provide space for mounting another component between the LVDC filter capacitor 6430 and the low-voltage transformer 6310.

Figure 29:
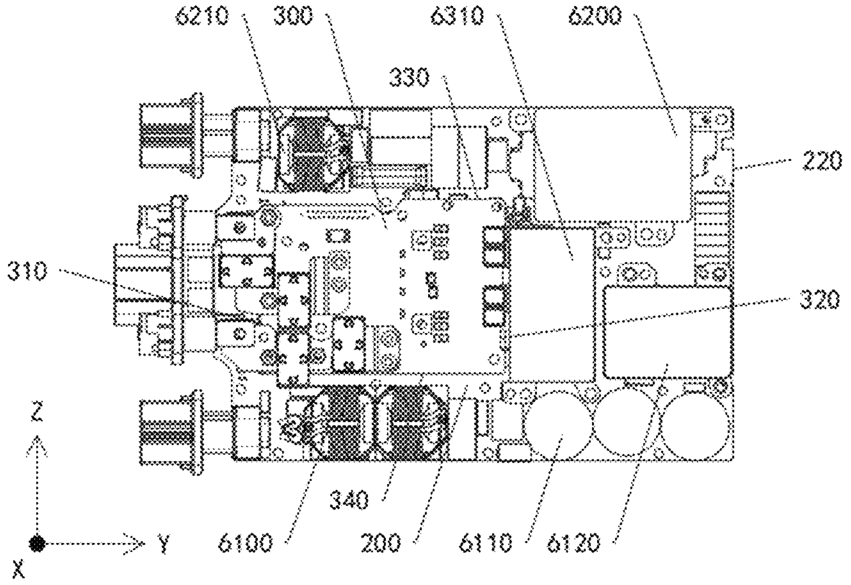
FIG. 29 is a schematic diagram of a partial structure of a vehicle-mounted power supply apparatus according to an implementation.

FIG. 29 is a schematic diagram of a partial structure of the vehicle-mounted power supply apparatus 10 according to an implementation. In an implementation, the upper-layer PCB board 200 is stacked above the AC filter 6100, the PFC capacitor 6110, the PFC inductor 6120, the HVDC filter 6210, the LLC transformer 6200, the low-voltage transformer 6310, and the lower-layer PCB board 300. The PFC capacitor 6110, the PFC inductor 6120, and the LLC transformer 6200 are arranged along the left-right direction Z of the vehicle-mounted power supply apparatus 10. The AC filter 6100 and the PFC capacitor 6110 are arranged along the front-rear direction Y of the vehicle-mounted power supply apparatus 10. The lower-layer PCB board 300, the low-voltage transformer 6310, and the PFC inductor 6120 are arranged along the front-rear direction Y of the vehicle-mounted power supply apparatus 10. The AC filter 6100, the lower-layer PCB board 300, and the HVDC filter 6210 are arranged along the left-right direction Z of the vehicle-mounted power supply apparatus 10.

In this implementation, the AC filter 6100, the PFC capacitor 6110, the PFC inductor 6120, the HVDC filter 6210, the LLC transformer 6200, and the low-voltage transformer 6310 are disposed around side edges of the lower-layer PCB board 300, in a tight arrangement. In the alternating current/direct current conversion circuit 610, the AC filter 6100 and the PFC capacitor 6110 are arranged along the front-rear direction Y of the vehicle-mounted power supply apparatus 10, and are disposed close to the lower-layer left side edge 330 of the lower-layer PCB board 300; and the PFC capacitor 6110 and the PFC inductor 6120 are arranged along the left-right direction Z of the vehicle-mounted power supply apparatus 10, and are disposed close to the upper-layer rear side edge 220 of the upper-layer PCB board 200. In the high-voltage direct current conversion circuit 620, the LLC transformer 6200 and the HVDC filter 6210 are arranged along the front-rear direction Y of the vehicle-mounted power supply apparatus 10, and are disposed close to the lower-layer right side edge 340 of the lower-layer PCB board 300. Along the front-rear direction Y of the vehicle-mounted power supply apparatus 10, the low-voltage transformer 6310 is located between the lower-layer PCB board 300 and the PFC inductor 6120, and the low-voltage transformer 6310 is disposed close to the lower-layer rear side edge 320 of the lower-layer PCB board 300. In this solution, the components in the power conversion circuit 600 are properly arranged, which helps improve utilization of internal space of the vehicle-mounted power supply apparatus 10.

Figure 30:
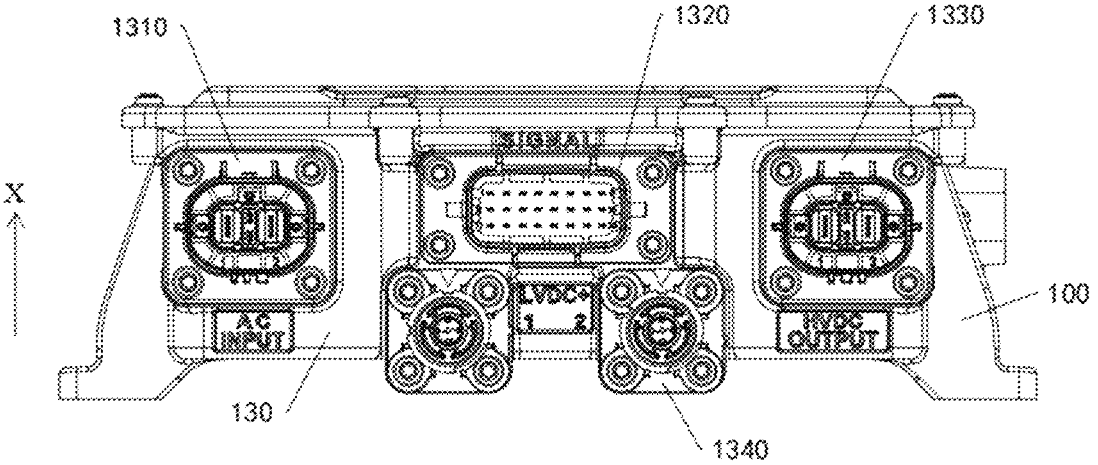
FIG. 30 is a schematic diagram of a structure of a bottom cover and an electrical interface according to an implementation.
Figure 31:
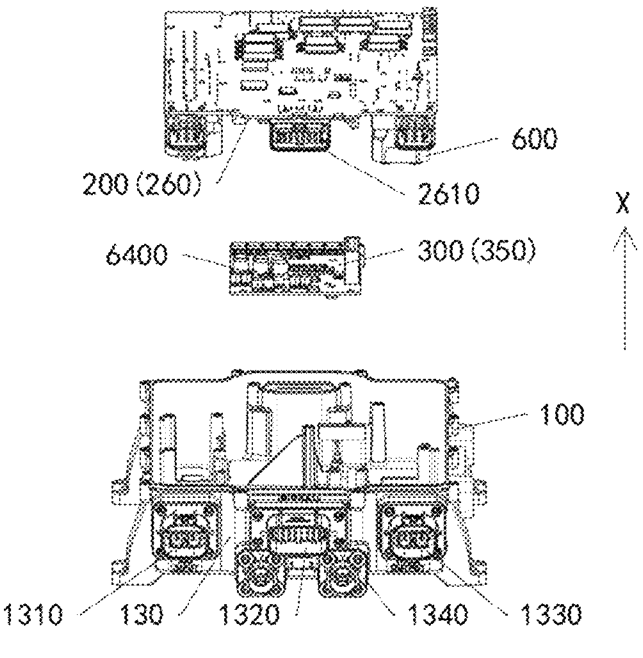
FIG. 31 is a partial exploded view of a vehicle-mounted power supply apparatus according to an implementation.
Figure 32:
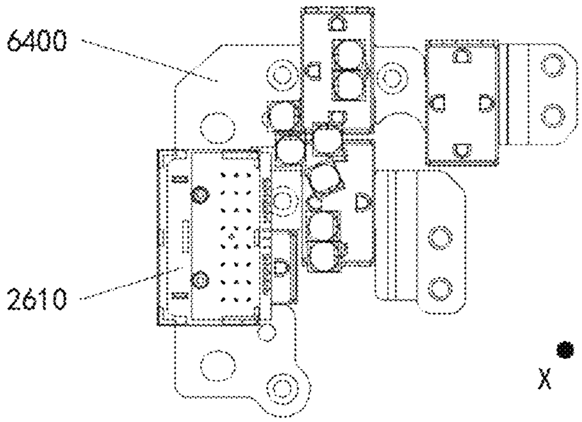
FIG. 32 is a schematic diagram of a structure of a control signal connector and a low-voltage filter circuit in a vehicle-mounted power supply apparatus according to an implementation.

FIG. 30 is a schematic diagram of a structure of a bottom cover and electrical interfaces of the vehicle-mounted power supply apparatus 10 according to an implementation. FIG. 31 is a partial exploded view of the vehicle-mounted power supply apparatus 10 according to an implementation. FIG. 32 is a schematic diagram of a structure of the control signal connector 2610 and the low-voltage filter circuit 6400 in the vehicle-mounted power supply apparatus 10 according to an implementation. In an implementation, the front side wall 130 includes the control signal interface 1320, the power interface 1310, and the first direct current interface 1340 (as shown in FIG. 31), the lower surface 260 of the upper-layer PCB board 200 includes the control signal connector 2610 (as shown in FIG. 32), and the upper surface 350 of the lower-layer PCB board 300 includes a part of the low-voltage filter circuit 6400 (as shown in FIG. 32). The control signal connector 2610 is configured to electrically connect the control signal interface 1320 to the upper-layer PCB board 200 (as shown in FIG. 31). The low-voltage filter circuit 6400 is configured to electrically connect the first direct current interface 1340 to the lower-layer PCB board 300 (as shown in FIG. 31). An orthographic projection of the control signal connector 2610 overlaps an orthographic projection of the part of the low-voltage filter circuit 6400 (as shown in FIG. 32).

In this implementation, the control signal connector 2610 is disposed on the lower surface 260 of the upper-layer PCB board 200, and the part of the low-voltage filter circuit 6400 is disposed on the upper surface 350 of the lower-layer PCB board 300, so that space between the upper-layer PCB board 200 and the lower-layer PCB board 300 can be fully used. In an implementation, the low-voltage filter circuit 6400 includes a capacitor, an inductor, and a copper bar. The capacitor may be disposed on the upper surface 350 of the lower-layer PCB board 300, and the inductor and the copper bar may be disposed on the lower surface 360 of the lower-layer PCB board 300. In another implementation, another arrangement may also be used based on an actual requirement.

In this implementation, the projection of the control signal connector 2610 in the height direction X of the vehicle-mounted power supply apparatus 10 overlaps the projection of the low-voltage filter circuit 6400 in the height direction X of the vehicle-mounted power supply apparatus 10. This facilitates disposing a common shielding can between the control signal connector 2610 and the low-voltage filter circuit 6400, so that the shielding structure can reduce electrical interference between the control signal connector 2610 and the low-voltage filter circuit 6400.

Figure 33:
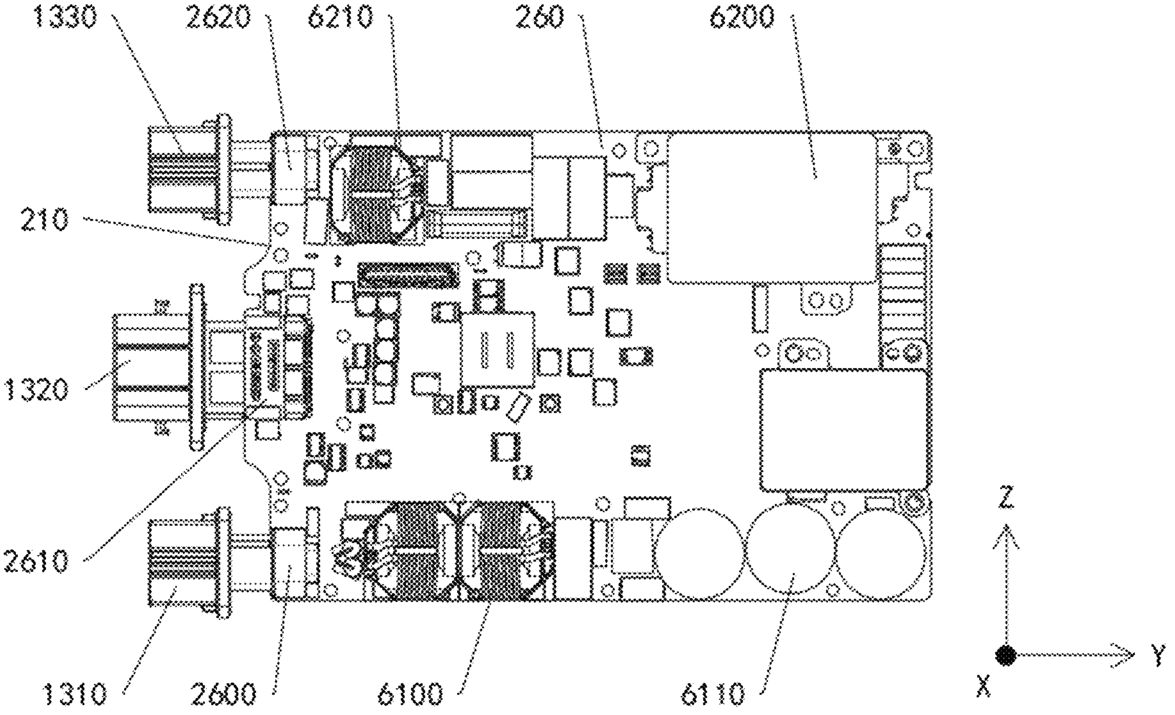
FIG. 33 is a schematic diagram of a structure of an upper-layer PCB board and a part of a power conversion circuit according to an implementation.
Figure 34:
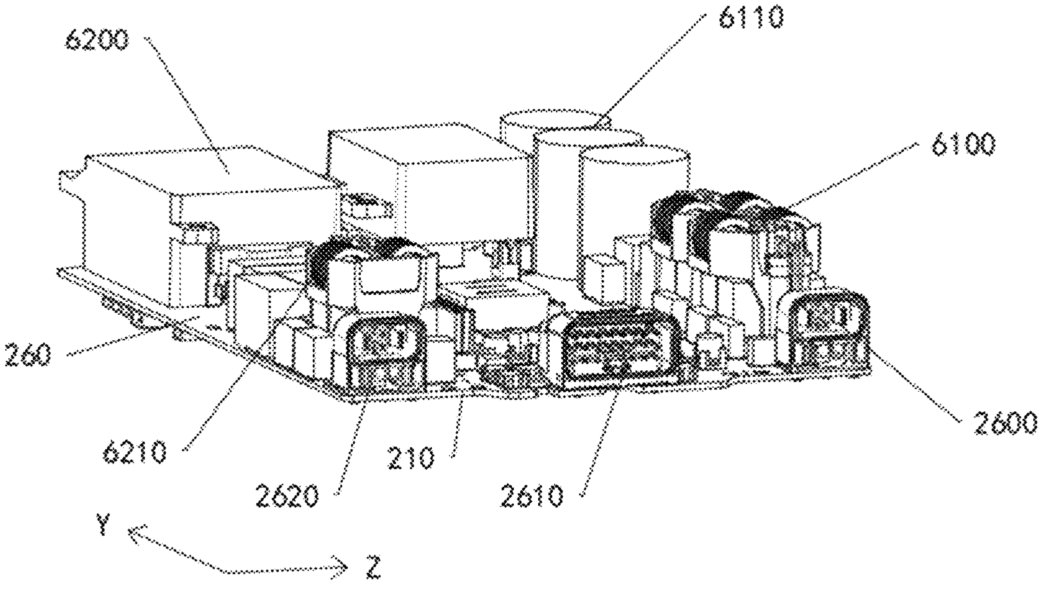
FIG. 34 is a schematic diagram of a structure of an upper-layer PCB board and a part of a power conversion circuit according to an implementation.

FIG. 33 is a schematic diagram of a structure of the upper-layer PCB board 200 and a part of the power conversion circuit 600 according to an implementation. FIG. 34 is a schematic diagram of a structure of the upper-layer PCB board 200 and a part of the power conversion circuit 600 according to an implementation.

In an implementation, a power connector 2600, the control signal connector 2610, and a second direct current connector 2620 are fastened to the lower surface 260 of the upper-layer PCB board 200. The power connector 2600 is configured to be plugged in the power interface 1310 (as shown in FIG. 33 and FIG. 34). The control signal connector 2610 is configured to be plugged in the control signal interface 1320 (as shown in FIG. 33 and FIG. 34). The second direct current connector 2620 is configured to be plugged in the second direct current interface 1330 (as shown in FIG. 33 and FIG. 34). The power connector 2600, the control signal connector 2610, and the second direct current connector 2620 are sequentially arranged along the left-right direction Z of the vehicle-mounted power supply apparatus 10, and are fastened to the upper-layer front side edge 210 of the upper-layer PCB board 200 (as shown in FIG. 33). The power connector 2600 is located on a side that is of the AC filter 6100 and that is away from the PFC capacitor 6110, and is electrically connected to an input end of the AC filter 6100 (as shown in FIG. 33). The second direct current connector 2620 is located on a side that is of the HVDC filter 6210 and that is away from the LLC transformer 6200, and is electrically connected to an output end of the HVDC filter 6210 (as shown in FIG. 33).

In an implementation, the power connector 2600, the control signal connector 2610, and the second direct current connector 2620 are plug-in type connectors, and are all fastened to the upper-layer PCB board 200 and located on the upper-layer front side edge 210 of the upper-layer PCB board 200. The upper-layer front side edge 210 of the upper-layer PCB board 200 is disposed close to the front side wall 130 of the vehicle-mounted power supply apparatus 10. In an implementation, the power interface 1310, the control signal interface 1320, and the second direct current interface 1330 are disposed on the side surface of the vehicle-mounted power supply apparatus 10 that is opposite to the front side wall 130. The power interface 1310, the control signal interface 1320, and the second direct current interface 1330 can be electrically connected to the power conversion circuit 600 after the three connectors are plugged in the interfaces, which makes assembly of electrical connection less difficult.

In an implementation, the power connector 2600 is located between the lower-layer left side edge 330 of the lower-layer PCB board 300 and the left side wall 150 of the vehicle-mounted power supply apparatus 10. The power connector 2600, the AC filter 6100, and the PFC capacitor 6110 are sequentially arranged along the front-rear direction Y of the vehicle-mounted power supply apparatus 10. The power connector 2600 is electrically connected to the input end of the AC filter 6100, so that the external power source 13 is transmitted to the PFC capacitor 6110 and the PFC inductor 6120 after passing through the power interface 1310, the power connector 2600, and the AC filter 6100 in sequence, thereby converting the external power source 13 into a direct current.

In an implementation, the second direct current connector 2620 is located between the lower-layer right side edge 340 of the lower-layer PCB board 300 and the right side wall 160 of the vehicle-mounted power supply apparatus 10. The second direct current connector 2620, the HVDC filter 6210, and the LLC transformer 6200 are sequentially arranged along the front-rear direction Y of the vehicle-mounted power supply apparatus 10. The second direct current connector 2620 is electrically connected to the output end of the HVDC filter 6210, so that a direct current is transmitted to the second direct current interface 1330 after passing through the LLC transformer 6200, the HVDC filter 6210, and the second direct current connector 2620 in sequence, thereby convert the direct current into a second direct current and supply power to the second-type load.

Figure 35:
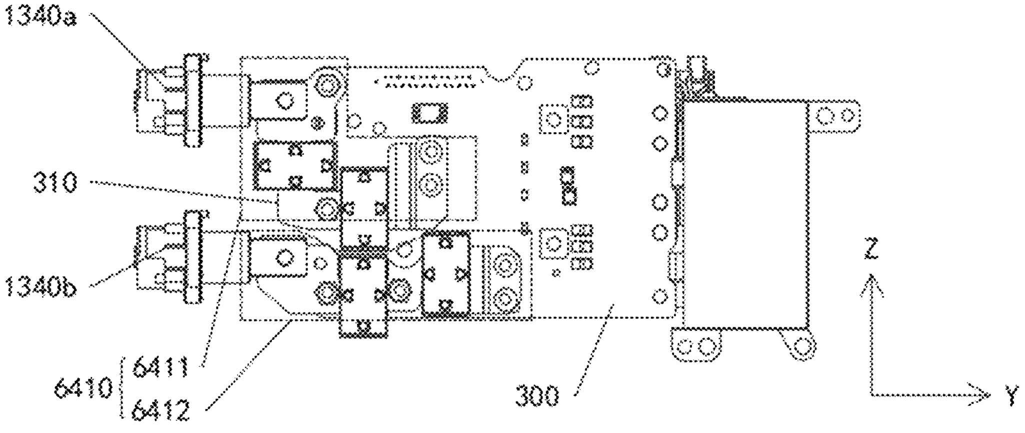
FIG. 35 is a schematic diagram of a structure of a lower-layer PCB board and a part of a power conversion circuit according to an implementation.

FIG. 35 is a schematic diagram of a structure of the lower-layer PCB board 300 and a part of the power conversion circuit 600 according to an implementation. In an implementation, the vehicle-mounted power supply apparatus 10 further includes two first direct current interfaces

1340. The LVDC filter copper bar assembly 6410 includes a first LVDC filter copper bar 6411 and a second LVDC filter copper bar 6412. The first LVDC filter copper bar 6411 and the second LVDC filter copper bar 6412 are fastened to the lower-layer PCB board 300 and extend to an outer side of the lower-layer front side edge 310 of the lower-layer PCB board 300. A part of the first LVDC filter copper bar 6411 and a part of the second LVDC filter copper bar 6412 located on the outer side of the lower-layer front side edge 310 of the lower-layer PCB board 300 are respectively fastened and electrically connected to the two first direct current interfaces 1340.

In this implementation, the first LVDC filter copper bar 6411 is arranged in an "L" shape. The part of the first LVDC filter copper bars 6411 located on an inner side of the lower-layer front side edge 310 of the lower-layer PCB board 300 is arranged in the left-right direction Z of the vehicle-mounted power supply apparatus 10. The part of the first LVDC filter copper bars 6411 located on the outer side of the lower-layer front side edge 310 of the lower-layer PCB board 300 is arranged in the front-rear direction Y of the vehicle-mounted power supply apparatus 10. The second LVDC filter copper bar 6412 extends along the front-rear direction Y of the vehicle-mounted power supply apparatus 10. The two first direct current interfaces 1340 are arranged along the left-right direction Z of the vehicle-mounted power supply apparatus 10. The first LVDC filter copper bar 6411 and the second LVDC filter copper bar 6412 are fixedly connected to the two first direct current interfaces 1340 respectively by using screws.

Figure 36:
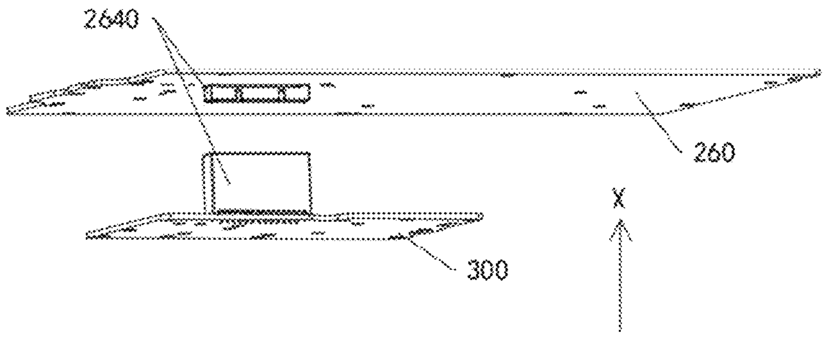
FIG. 36 is a schematic diagram of a partial structure of a vehicle-mounted power supply apparatus according to an implementation.

Refer to FIG. 23 to FIG. 26 and FIG. 36. FIG. 36 is a schematic diagram of a partial structure of the vehicle-mounted power supply apparatus 10 according to an implementation. In an implementation, the lower surface 260 of the upper-layer PCB board 200 includes a flat cable connector 2640 and a plurality of plug-in connectors 2630. The plurality of plug-in connectors 2630 are respectively configured to electrically connect to the AC filter 6100, the HVDC filter 6210, the PFC capacitor 6110, the PFC inductor 6120, the low-voltage transformer 6310, and the LLC transformer 6200 (as shown to FIG. 23 to FIG. 26). The flat cable connector 2640 is configured to electrically connect the upper-layer PCB board 200 to the lower-layer PCB board 300 (as shown in FIG. 26 and FIG. 36).

In an implementation, the AC filter 6100, the HVDC filter 6210, the PFC capacitor 6110, the PFC inductor 6120, the low-voltage transformer 6310, and the LLC transformer 6200 are all provided with plug terminals. The plug terminals are plugged in the plug-in connectors 2630, so that the AC filter 6100, the HVDC filter 6210, the PFC capacitor 6110, the PFC inductor 6120, the low-voltage transformer 6310, and the LLC transformer 6200 are fastened to the lower surface 260 of the upper-layer PCB board 200 and electrically connected to the upper-layer PCB board 200. In some other implementations, the AC filter 6100, the HVDC filter 6210, the PFC capacitor 6110, the PFC inductor 6120, the low-voltage transformer 6310, and the LLC transformer 6200 may also be fastened to the upper-layer PCB board 200 in another manner, for example, by using pins or screws, or by welding.

Figure 37:
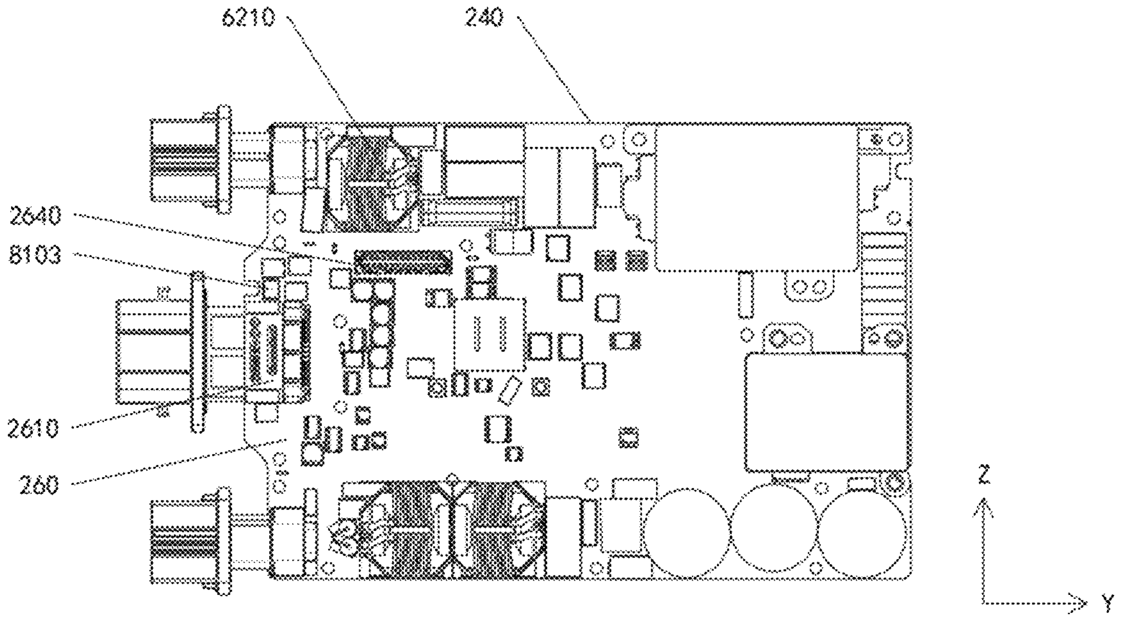
FIG. 37 is a schematic diagram of a partial structure of a vehicle-mounted power supply apparatus according to an implementation.

FIG. 37 is a schematic diagram of a partial structure of the vehicle-mounted power supply apparatus 10 according to an implementation. In this implementation, the flat cable connector 2640 may also be referred to as a board-to-board connector. The flat cable connector 2640 on the upper-layer PCB board 200 is located on a side that is of the HVDC filter 6210 and that is away from the upper-layer right side edge 240, and the upper-layer PCB board 200 is fixedly connected to the lower-layer PCB board 300, which can ensure stability of an overall structure of the vehicle-mounted power supply apparatus 10. In addition, the flat cable connectors 2640 are located in unoccupied regions between different components on the upper-layer PCB board 200, and do not increase the area of the surface of the upper-layer PCB board 200. This helps reduce a volume of the vehicle-mounted power supply apparatus 10.

Still refer to FIG. 23 to FIG. 26 and FIG. 36. In an implementation, the upper surface of the lower-layer PCB includes a flat cable connector 2640 and a plug-in connector 2630 (as shown in FIG. 23 to FIG. 26). The flat cable connector 2640 is configured to electrically connect to the upper-layer PCB. The plug-in connector 2630 is configured to electrically connect to the low-voltage transformer 6310 (as shown in FIG. 26 and FIG. 36).

In this implementation, the upper-layer PCB board 200 and the lower-layer PCB board 300 are fixedly and electrically connected through the flat cable connectors 2640. The flat cable connector 2640 on the lower-layer PCB board 300 is disposed close to the lower-layer right side edge 340. The flat cable connectors 2640 are disposed in unoccupied regions between different components on the lower-layer PCB board 300, and do not increase the area of the surface of the lower-layer PCB board 300. This helps reduce the volume of the vehicle-mounted power supply apparatus 10.

Figure 38:
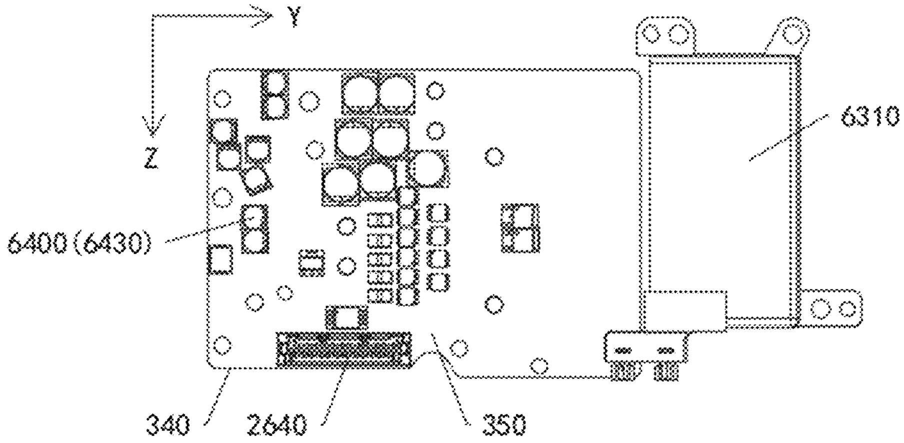
FIG. 38 is a schematic diagram of a partial structure of a vehicle-mounted power supply apparatus according to an implementation.

FIG. 38 is a schematic diagram of a partial structure of the vehicle-mounted power supply apparatus 10 according to an implementation. In this implementation, the low-voltage transformer 6310 is provided with a plug terminal (not shown in the figure). The plug terminal is plugged in the plug-in connector 2630, so that the low-voltage transformer 6310 is fastened to the upper surface 350 of the lower-layer PCB board 300 and is electrically connected to the lower-layer PCB board 300. In some other implementations, the low-voltage transformer 6310 may also be fastened to the lower-layer PCB board 300 in another manner, for example, by using a pin or a screw, or by welding.

Figure 39:
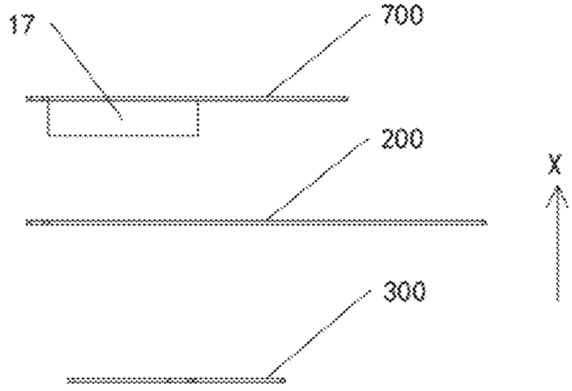
FIG. 39 is a schematic diagram of a partial structure of a vehicle-mounted power supply apparatus according to an implementation.

FIG. 39 is a schematic diagram of a partial structure of the vehicle-mounted power supply apparatus 10 according to an implementation. In an implementation, the vehicle-mounted power supply apparatus 10 further includes a top-layer PCB board 700. The top-layer PCB board 700 is configured to dispose a power distribution unit 17. The top-layer PCB board 700, the upper-layer PCB board 200, and the lower-layer PCB board 300 are arranged along the height direction X of the vehicle-mounted power supply apparatus 10. The top-layer PCB board 700 is fixedly connected to the upper-layer PCB board 200. The power distribution unit 17 is configured to distribute power of the external power source 13 to various components and power transistors in need of power.

In this implementation, the power distribution unit 17 is disposed on the top-layer PCB board 700, which helps improve integration of the vehicle-mounted power supply apparatus 10 and enhance functions and practicability of the vehicle-mounted power supply apparatus 10. In addition, the top-layer PCB board 700, the upper-layer PCB board 200, and the lower-layer PCB board 300 are stacked in parallel, which can make mounting less difficult.

Figure 40:
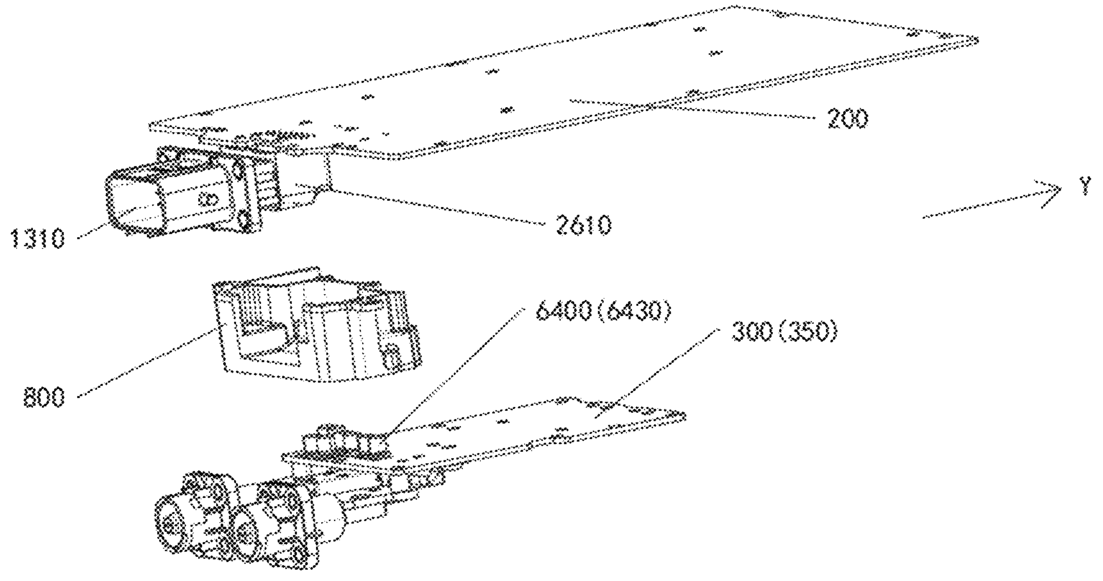
FIG. 40 is a schematic diagram of a partial structure of a vehicle-mounted power supply apparatus according to an implementation.
Figure 41:
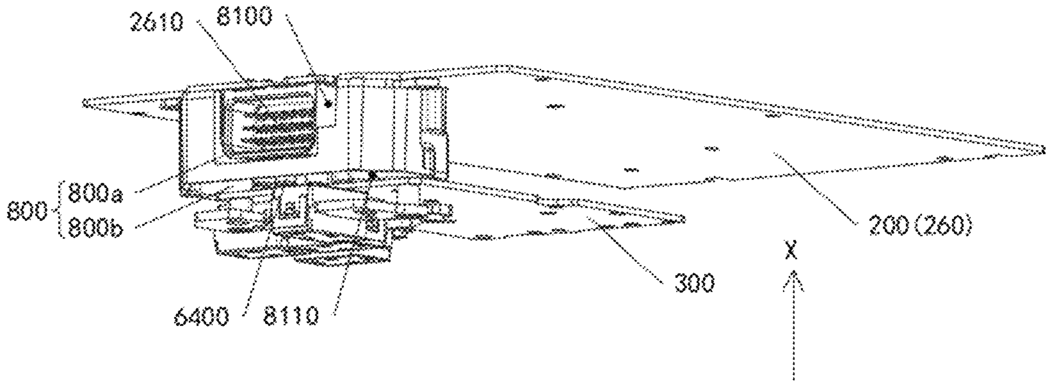
FIG. 41 is a schematic diagram of a partial structure of a vehicle-mounted power supply apparatus according to an implementation.

FIG. 40 is a schematic diagram of a partial structure of the vehicle-mounted power supply apparatus 10 according to an implementation. FIG. 41 is a schematic diagram of a partial structure of the vehicle-mounted power supply apparatus 10 according to an implementation. In an implementation, a shielding can 800 (as shown in FIG. 40) is disposed between the upper-layer PCB board 200 and the lower-layer PCB board 300. The shielding can 800 is configured to form a control signal shielding cavity 800*a* (as shown in FIG. 41) with the lower surface 260 of the upper-layer PCB board 200. The control signal shielding cavity 800*a* is configured to accommodate the control signal connector 2610. The shielding can 800 is further configured to form a low-voltage filter shielding cavity 800*b* with the upper surface 350 of the lower-layer PCB board 300. The low-voltage filter shielding cavity 800*b* is configured to accommodate at least part of the low-voltage filter circuit (as shown in FIG. 41).

In this implementation, the space between the upper-layer PCB board 200 and the lower-layer PCB board 300 is used to place the shielding can 800, which fully uses the space between the two PCB boards. In addition, a shielding wall may be formed between the shielding can 800 and the two PCB boards, to shield electrical components on the two PCB boards.

In this implementation, the shielding can 800 shields the isolates the control signal connector 2610 and the at least part of the low-voltage filter circuit 6400, to prevent the low-voltage filter circuit 6400 from interfering with a signal transmitted in the control signal connector 2610, thereby improving signal transmission quality.

Figure 42:
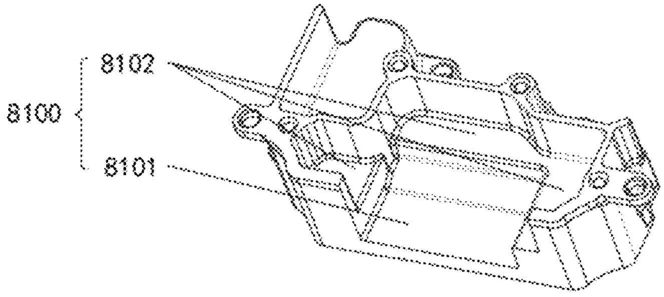
FIG. 42 is a schematic diagram of a structure of a shielding can according to an implementation.
Figure 43:
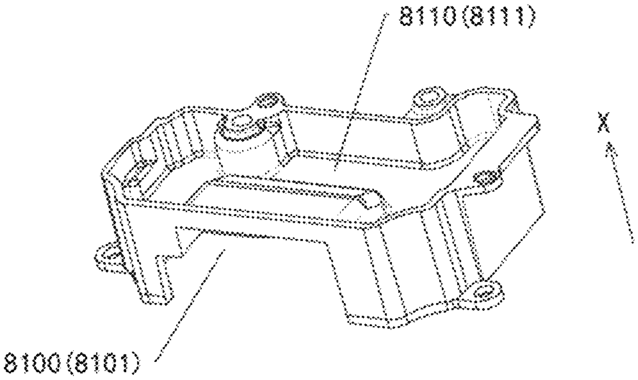
FIG. 43 is a schematic diagram of a structure of a shielding can according to an implementation.

Refer to FIG. 41, FIG. 42, and FIG. 43. FIG. 42 is a schematic diagram of a structure of the shielding can 800 according to an implementation. FIG. 43 is a schematic diagram of a structure of the shielding can 800 according to an implementation. In an implementation, the shielding can 800 includes a first shielding can 8100 (as shown in FIG. 42) and a second shielding can 8110 (as shown in FIG. 43) that are disposed back to each other in the height direction X of the vehicle-mounted power supply apparatus 10. The first shielding can 8100 and the lower surface 260 of the upper-layer PCB board 200 form the control signal shielding cavity 800*a*. The control signal shielding cavity 800*a* is configured to reduce electrical interference to the control signal connector 2610. The second shielding can 8110 and the upper surface 350 of the lower-layer PCB board 300 form the low-voltage filter shielding cavity 800*b*. The low-voltage filter shielding cavity 800*b* is configured to reduce electrical interference to the low-voltage filter circuit 6400.

In this implementation, the control signal shielding cavity 800*a* may also be referred to as a first shielding cavity, and the low-voltage filter shielding cavity 800*b* may also be referred to as a second shielding cavity. The first shielding can 8100 and the second shielding can 8110 are used to shield and isolate the control signal connector 2610 and the at least part of the low-voltage filter circuit 6400, to prevent the low-voltage filter circuit 6400 from interfering with a signal transmitted in the control signal connector 2610, thereby improving signal transmission quality.

Still refer to FIG. 40. In an implementation, the shielding can 800 may also be referred to as an LVDC shielding can. The shielding can 800 is configured to shield the control signal connector 2610 located below the upper-layer PCB board 200 and the low-voltage filter circuit 6400 located on the lower-layer PCB board 300. The control signal connector 2610 is configured to plug in the control signal interface 1320 on an outer side of the bottom cover 100.

In this implementation, the low-voltage filter circuit 6400 is also referred to as an LVDC filter 6400, and the LVDC filter 6400 is configured to filter out a harmonic in a first direct current. The shielding can 800 is located between the upper-layer PCB board 200 and the lower-layer PCB board 300 along the height direction X of the vehicle-mounted power supply apparatus 10.

In this implementation, a part of the LVDC filters 6400 is fastened to the upper surface 350 of the lower-layer PCB board 300, a part of the shielding can 800 is located on a side close to the upper surface 350 of the lower-layer PCB board 300, and the part of the shielding can 800 is configured to shield the part of the LVDC filters 6400 located on the upper surface 350 of the lower-layer PCB board 300.

In this implementation, a part of the shielding can 800 is located on a side close to the lower surface 260 of the upper-layer PCB board 200, and the part of the shielding can 800 is configured to shield the control signal connector 2610.

Still refer to FIG. 41, FIG. 42, and FIG. 43. In this implementation, the first shielding can 8100 is recessed in a direction away from the lower surface 260 of the upper-layer PCB board 200 (as shown in FIG. 41 and FIG. 42), and the first shielding can 8100 is disposed on an outer side of the control signal connector 2610 along the height direction X of the vehicle-mounted power supply apparatus 10. The second shielding can 8110 is recessed in a direction away from the upper surface 350 of the lower-layer PCB board 300 (as shown in FIG. 41 and FIG. 43), and the second shielding can 8110 is disposed on an outer side of the part of the LVDC filter 6400 along the height direction X of the vehicle-mounted power supply apparatus 10. The shielding can 800 shields the control signal connector 2610 and the part of the LVDC filter 6400 separately, which fully uses the space between the upper-layer PCB board 200 and the lower-layer PCB board 300. In addition, the shielding can 800 does not increase the volume of the vehicle-mounted power supply apparatus 10 in the height direction X, which facilitates miniaturization design of the vehicle-mounted power supply apparatus 10.

Figure 44:
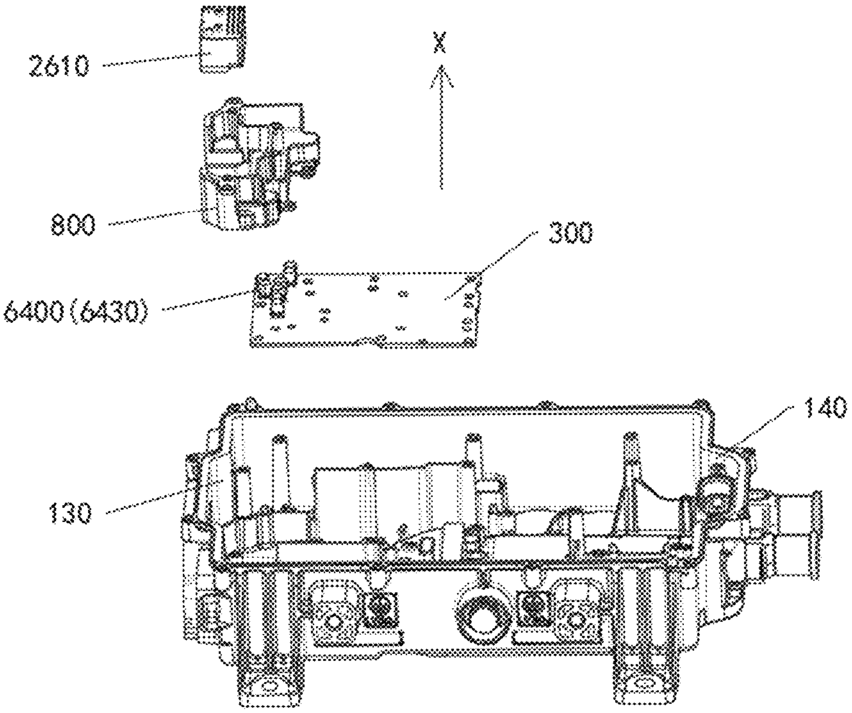
FIG. 44 is a partial exploded view of a vehicle-mounted power supply apparatus according to an implementation.

FIG. 44 is a partial exploded view of the vehicle-mounted power supply apparatus 10 according to an implementation. In an implementation, the LVDC filter 6400 includes the LVDC filter capacitor 6430, and the LVDC filter capacitor 6430 is located in the second shielding can 8110.

In this implementation, the LVDC filter capacitor 6430 is located on the upper surface 350 of the lower-layer PCB board 300, and the second shielding can 8110 is disposed on an outer side of the LVDC filter capacitor 6430 along the height direction X of the vehicle-mounted power supply apparatus 10. In an implementation, the LVDC filter 6400 further includes the LVDC filter magnetic ring 6420. The LVDC filter capacitor 6430 and the LVDC filter magnetic ring 6420 form an LC circuit to implement filtering on a first direct current.

Figure 45:
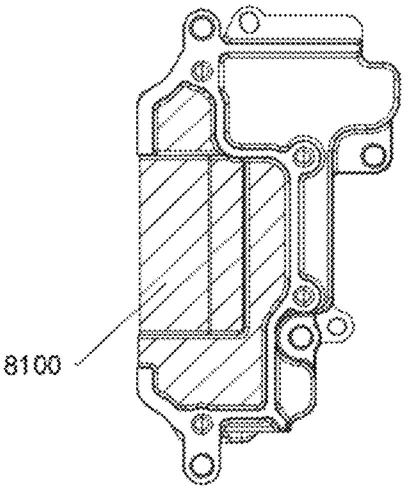
FIG. 45 is a schematic diagram of a structure of a first shielding can in a shielding can according to an implementation.
Figure 46:
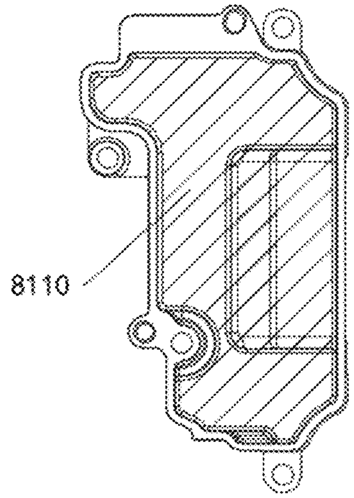
FIG. 46 is a schematic diagram of a structure of a second shielding can in a shielding can according to an implementation.

FIG. 45 is a schematic diagram of a structure of the first shielding can 8100 in the shielding can 800 according to an implementation. FIG. 46 is a schematic diagram of a structure of the second shielding can 8110 in the shielding can 800 according to an implementation. In an implementation, an area of a projection of the first shielding can 8100 on the upper-layer PCB board 200 along the height direction X of the vehicle-mounted power supply apparatus 10 is less than an area of a projection of the second shielding can 8110 on the upper-layer PCB board 200 along the height direction X of the vehicle-mounted power supply apparatus 10 (as shown in FIG. 45 and FIG. 46).

Still refer to FIG. 44. In this implementation, the vehicle-mounted power supply apparatus 10 includes the front side wall 130 and the rear side wall 140 that are disposed opposite to each other in the front-rear direction Y. The first shielding can 8100 is configured to shield the control signal connector 2610, and the second shielding can 8110 is configured to shield a part of the LVDC filter 6400. The part of the LVDC filter 6400 is located, along the front-rear direction Y, on a side that is of the control signal connector 2610 and that is away from the front side wall 130, and the part of the LVDC filters 6400 is scatteringly distributed on the lower-layer PCB board 300. Therefore, it is required to set the area of the projection of the second shielding can 8110 in the height direction X of the vehicle-mounted power supply apparatus 10 to be greater than the area of the projection of the first shielding can 8100 in the height direction X of the vehicle-mounted power supply apparatus 10, so that the shielding can 800 provides shielding effects on the control signal connector 2610 and the LVDC filter 6400 at the same time.

Refer to FIG. 42 and FIG. 44. FIG. 42 is a schematic diagram of a structure of the first shielding can 8100 in the shielding can 800 according to an implementation. In an implementation, the first shielding can 8100 includes a connector accommodating recess 8101 and a signal filter accommodating recess 8102 (as shown in FIG. 42). The signal filter accommodating recess 8102 is located around the connector accommodating recess 8101. The control signal connector 2610 is located in the connector accommodating recess 8101 (as shown in FIG. 42 and FIG. 44). The signal filter accommodating recess 8102 is configured to dispose a signal filtering component 8103 (as shown in FIG. 37).

In this implementation, the signal filtering component 8103 is configured to perform filtering on an input signal, and the signal filtering component 8103 is fastened to the lower surface 260 of the upper-layer PCB board 200 and is located around the control signal connector 2610.

In this implementation, a length of the signal filtering component 8103 in the height direction X of the vehicle-mounted power supply apparatus 10 is less than a length of the control signal connector 2610 in the height direction X of the vehicle-mounted power supply apparatus 10. Therefore, the signal filter accommodating recess 8102 is provided in a step shape, and a recess bottom of the signal filter accommodating recess 8102 is located, in the height direction X, on a side that is of the connector accommodating recess 8101 and that is away from the second shielding can 8110.

In this solution, the connector accommodating recess 8101 and the signal filter accommodating recess 8102 are disposed in the first shielding can 8100, so that the first shielding can 8100 can shield more components, thereby improving electromagnetic compatibility of the power conversion circuit 600.

Figure 47:
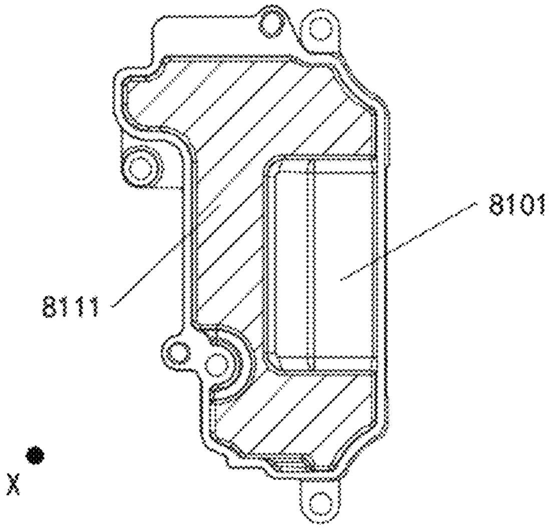
FIG. 47 is a schematic diagram of a structure of a shielding can according to an implementation.

Refer to FIG. 43 and FIG. 47. FIG. 47 is a schematic diagram of a structure of the shielding can 800 according to an implementation. In an implementation, the second shielding can 8110 includes a filter accommodating recess 8111 (as shown in FIG. 43). A projection of the filter accommodating recess 8111 on the upper-layer PCB board 200 along the height direction X of the vehicle-mounted power supply apparatus 10 and a projection of the connector accommodating recess 8101 on the upper-layer PCB board 200 along the height direction X of the vehicle-mounted power supply apparatus 10 do not overlap (as shown in FIG. 47). A recess direction of the filter accommodating recess 8111 is opposite to a recess direction of the connector accommodating recess 8101 (as shown in FIG. 43). The filter accommodating recess 8111 is configured to accommodate the part of the LVDC filter 6400.

In this implementation, the filter accommodating recess 8111 and the connector accommodating recess 8101 both need to occupy some space in the height direction X of the vehicle-mounted power supply apparatus 10, and the recess direction of the filter accommodating recess 8111 is opposite to the recess direction of the connector accommodating recess 8101. Therefore, the filter accommodating recess 8111 and the connector accommodating recess 8101 are set to be staggeringly distributed in the height direction X of the vehicle-mounted power supply apparatus 10. This improves space utilization between the upper-layer PCB board 200 and the lower-layer PCB board 300.

In an implementation, the LVDC filter 6400 is also referred to as a low-voltage filter circuit 6400, and the filter accommodating recess 8111 is configured to accommodate the LVDC filter capacitor 6430 in the LVDC filter 6400 (as shown in FIG. 38 or FIG. 40).

Figure 48:
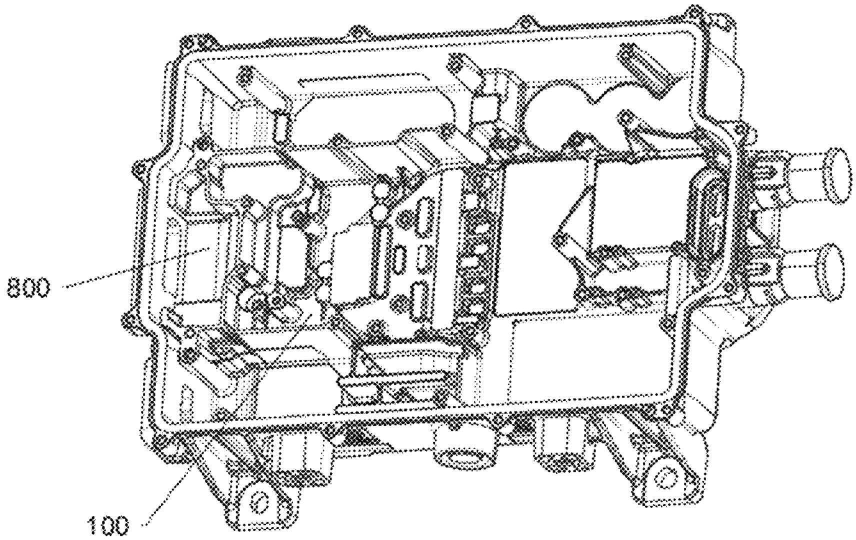
FIG. 48 is a schematic diagram of a structure of a shielding can and a bottom cover according to an implementation.

FIG. 48 is a schematic diagram of a structure of the shielding can 800 and the bottom cover 100 according to an implementation. In an implementation, the shielding can 800 is fixedly connected to the bottom cover 100 by using screws.

In this implementation, the shielding can 800 is fastened to the bottom cover 100 by using screws, so that the shielding can 800 is more fastened in the vehicle-mounted power supply apparatus 10, which helps the shielding can 800 implement shielding stably.

Figure 49:
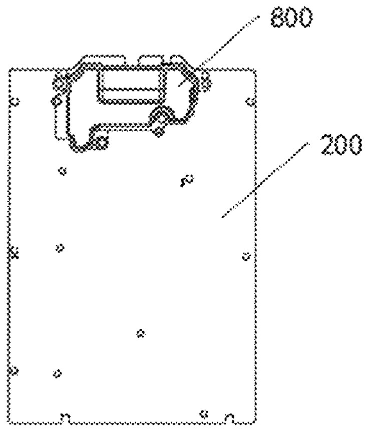
FIG. 49 is a schematic diagram of a structure of a shielding can and an upper-layer PCB board according to an implementation.
Figure 50:
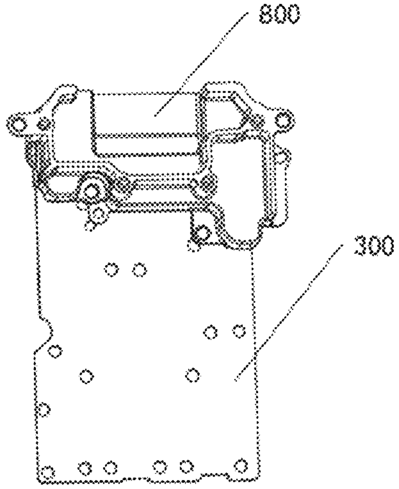
FIG. 50 is a schematic diagram of a structure of a shielding can and a lower-layer PCB board according to an implementation.
Figure 51:
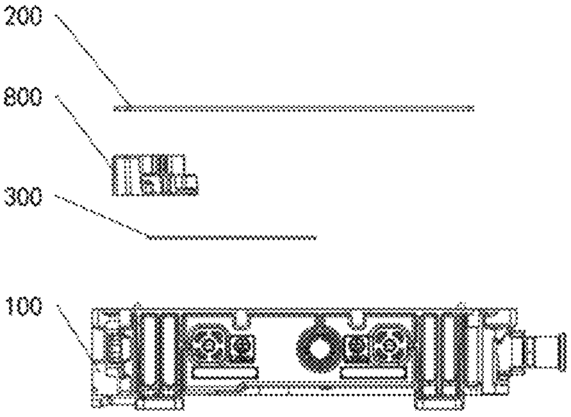
FIG. 51 is a partial exploded view of a vehicle-mounted power supply apparatus according to an implementation.

FIG. 49 is a schematic diagram of a structure of the shielding can 800 and the upper-layer PCB board 200. FIG. 50 is a schematic diagram of a structure of the shielding can 800 and the lower-layer PCB board 300. FIG. 51 is a partial exploded view of the vehicle-mounted power supply apparatus 10 according to an implementation. In an implementation, the shielding can 800 is fixedly connected to the upper-layer PCB board 200 and the lower-layer PCB board 300 by using screws (as shown in FIG. 49 and FIG. 50). In the height direction X of the vehicle-mounted power supply apparatus 10, the upper-layer PCB board 200, the shielding can 800, the lower-layer PCB board 300, and the bottom cover 100 are stacked (as shown in FIG. 51).

Figure 52:
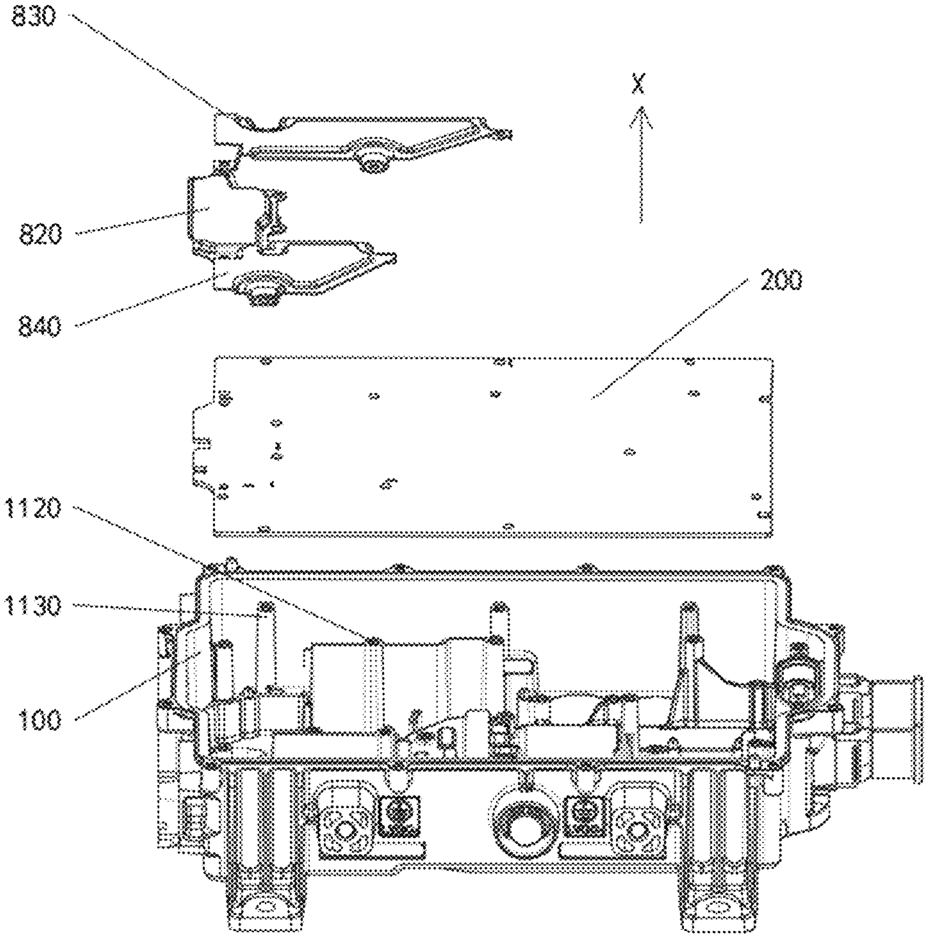
FIG. 52 is a schematic diagram of a partial structure of a vehicle-mounted power supply apparatus according to an implementation.

FIG. 52 is a schematic diagram of a partial structure of the vehicle-mounted power supply apparatus 10 according to an implementation. In an implementation, the vehicle-mounted power supply apparatus 10 further includes a signal filtering shielding can 820, an AC filtering shielding can 830, and an HVDC filtering shielding can 840 that are located above the upper-layer PCB board 200. The AC filtering shielding can 830 is configured to shield an alternating current filter circuit of the power conversion circuit 600. The HVDC filtering shielding can 840 is configured to shield a high-voltage filter circuit of the power conversion circuit 600. The signal filtering shielding can 820, the AC filtering shielding can 830, and the HVDC filtering shielding can 840 are fastened to a fastening protrusion 1130 and a shielding protrusion 1120 of the bottom cover 100 through the upper-layer PCB board 200.

The alternating current filter circuit includes the AC filter 6100. The AC filter 6100 is configured to filter out a harmonic in an alternating current. The high-voltage filter circuit includes the HVDC filter 6210. The HVDC filter 6210 is configured to filter out a harmonic in a second direct current.

In this implementation, the signal filtering shielding can 820, the AC filtering shielding can 830, and the HVDC filtering shielding can 840 are respectively configured to enhance shielding effects on the signal transmission circuit, the alternating current filter circuit, and the high-voltage filter circuit, thereby improving signal transmission quality, and reducing electrical interference to the power conversion circuit 600.

In this implementation, the signal filtering shielding can 820, the AC filtering shielding can 830, and the HVDC filtering shielding can 840 are all fixedly connected to the bottom cover 100 through the upper-layer PCB board 200. The AC filtering shielding can 830 is used as an example. A fastening manner is fastening by using a screw. The screw is successively sequentially put through the AC filtering shielding can 830, the upper-layer PCB board 200, and the bottom cover 100 along the height direction X of the vehicle-mounted power supply apparatus 10, and fastened to the fastening protrusion 1130 and the shielding protrusion 1120.

Figure 53:
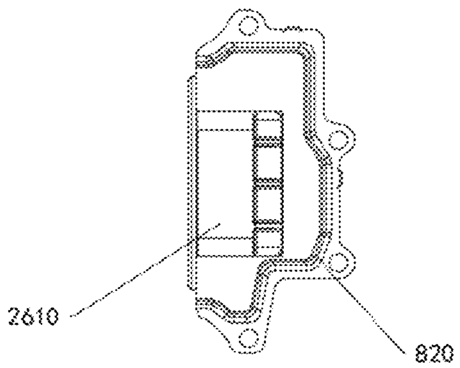
FIG. 53 is a schematic diagram of a structure of a signal filtering shielding can and a control signal connector according to an implementation.

FIG. 53 is a schematic diagram of a structure of the signal filtering shielding can 820 and the control signal connector 2610 according to an implementation. In an implementation, an orthographic projection of the signal filtering shielding can 820 on the upper-layer PCB board 200 at least partially overlaps an orthographic projection of the control signal connector 2610 on the upper-layer PCB board 200, so that the signal filtering shielding can 820 can effectively shield against external electromagnetic interference.

Figure 54:
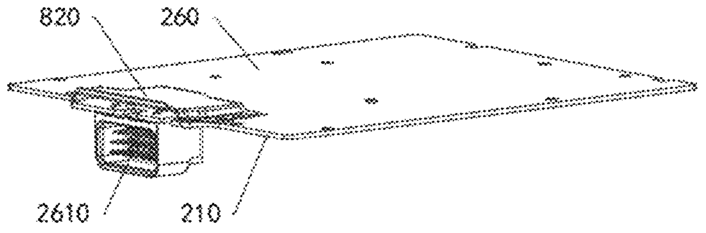
FIG. 54 is a schematic diagram of a partial structure of a vehicle-mounted power supply apparatus according to an implementation.
Figure 55:
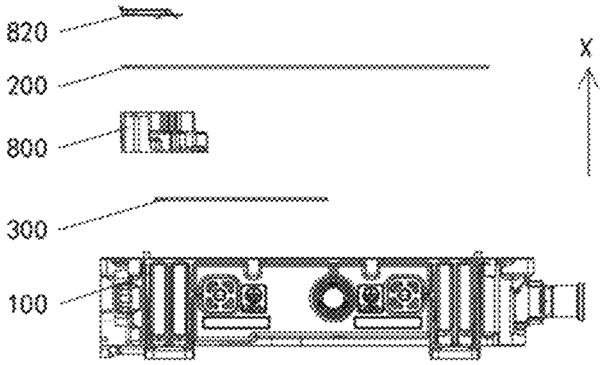
FIG. 55 is a partial exploded view of a vehicle-mounted power supply apparatus according to an implementation.

FIG. 54 is a schematic diagram of a partial structure of the vehicle-mounted power supply apparatus 10 according to an implementation. FIG. 55 is a partial exploded view of the vehicle-mounted power supply apparatus 10 according to an implementation. In this implementation, the signal filtering shielding can 820 is disposed close to the upper-layer front side edge 210 of the upper-layer PCB board 200, and the signal filtering shielding can 820 covers at least a part of the control signal connector 2610 in the height direction X. The signal filtering shielding can 820 and the shielding can 800 are located on two sides of the control signal connector 2610 along the height direction X, and are configured to shield the control signal connector 2610 from different components. The signal filtering shielding can 820 may be configured to shield against electrical interference generated by another component on the upper-layer PCB board 200. The shielding can 800 may be configured to shield against electrical interference generated by the LVDC filter 6400 on the lower-layer PCB board 300.

Figure 56:
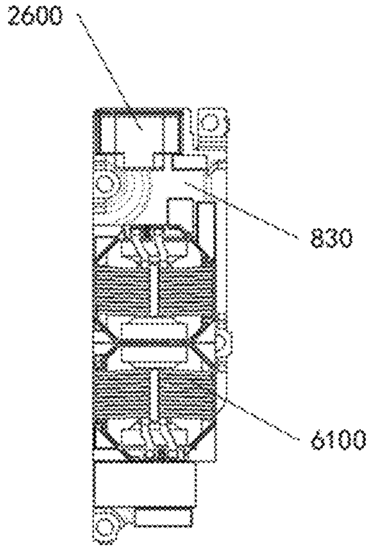
FIG. 56 is a schematic diagram of a partial structure of a vehicle-mounted power supply apparatus according to an implementation.

FIG. 56 is a schematic diagram of a partial structure of the vehicle-mounted power supply apparatus 10 according to an implementation. In an implementation, an orthographic projection of the AC filtering shielding can 830 on the upper-layer PCB board 200 at least partially overlaps an orthographic projection of the AC filter 6100 on the upper-layer PCB board 200.

In this implementation, the vehicle-mounted power supply apparatus 10 further includes the power connector 2600. The power connector 2600 is configured to plug in the power interface 1310. The power connector 2600 is fastened to the upper-layer front side edge 210 of the upper-layer PCB board 200, and is sequentially arranged with the AC filter 6100 along the front-rear direction Y of the vehicle-mounted power supply apparatus 10. The power connector 2600 is electrically connected to the input end of the AC filter 6100. The AC filtering shielding can 830 covers at least a part of the power connector 2600 in the height direction X. In this solution, the AC filtering shielding can 830 is disposed to shield the AC filter 6100 and the power connector 2600, which increases a shielding range that can be covered by the AC filtering shielding can 830, thereby helping improve electromagnetic compatibility of the power conversion circuit 600 in the vehicle-mounted power supply apparatus 10.

The AC filter 6100 is an alternating current filter circuit of the power conversion circuit.

Figure 57:
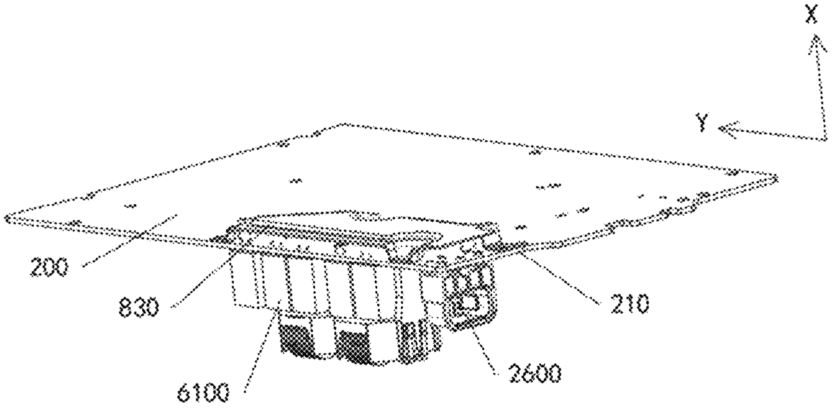
FIG. 57 is a schematic diagram of a partial structure of a vehicle-mounted power supply apparatus according to an implementation.

FIG. 57 is a schematic diagram of a partial structure of the vehicle-mounted power supply apparatus 10 according to an implementation. In this implementation, the AC filtering shielding can 830 is disposed close to the upper-layer front side edge 210 of the upper-layer PCB board 200, and the AC filtering shielding can 830 covers at least a part of the AC filter 6100 in the height direction X. This is to improve a shielding effect of the AC filtering shielding can 830 on the AC filter 6100, and further improve electromagnetic compatibility of the power conversion circuit 600 in the vehicle-mounted power supply apparatus 10.

Figure 58:
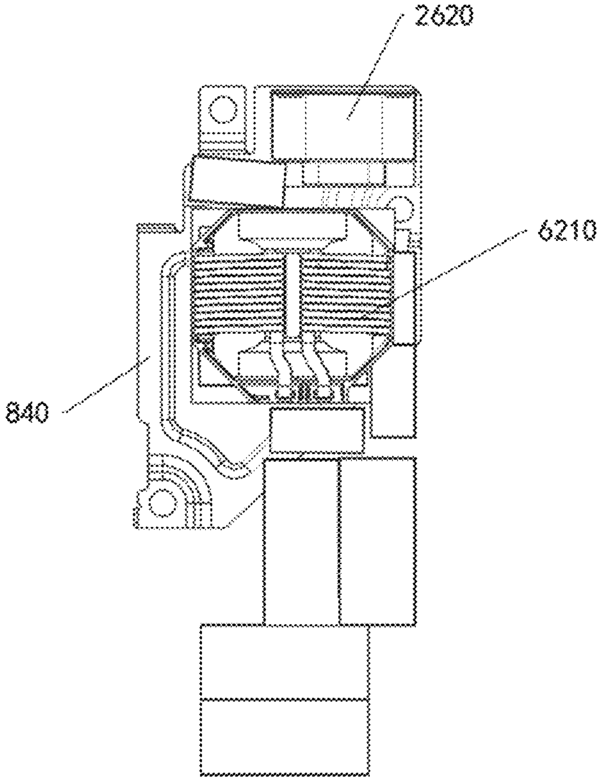
FIG. 58 is a schematic diagram of a partial structure of a vehicle-mounted power supply apparatus according to an implementation.

FIG. 58 is a schematic diagram of a partial structure of the vehicle-mounted power supply apparatus 10 according to an implementation. In an implementation, an orthographic projection of the HVDC filtering shielding can 840 on the upper-layer PCB board 200 at least partially overlaps an orthographic projection of the HVDC filter 6210 on the upper-layer PCB board 200.

In this implementation, the vehicle-mounted power supply apparatus 10 further includes the second direct current connector 2620. The second direct current connector 2620 is configured to be plugged in the second direct current interface 1330. The second direct current connector 2620 is fastened to the upper-layer front side edge 210 of the upper-layer PCB board 200, and is sequentially arranged with the HVDC filter 6210 along the front-rear direction Y of the vehicle-mounted power supply apparatus 10. The second direct current connector 2620 is electrically connected to an input end of the HVDC filter 6210. The HVDC filtering shielding can 840 covers at least a part of the second direct current connector 2620 in the height direction X. In this solution, the HVDC filtering shielding can 840 is disposed to shield the HVDC filter 6210 and the second direct current connector 2620, which increases a shielding range that can be covered by the HVDC filtering shielding can 840, thereby helping improve electromagnetic compatibility of the power conversion circuit 600 in the vehicle-mounted power supply apparatus 10.

The HVDC filter 6210 is a high-voltage filter circuit of the power conversion circuit.

Figure 59:
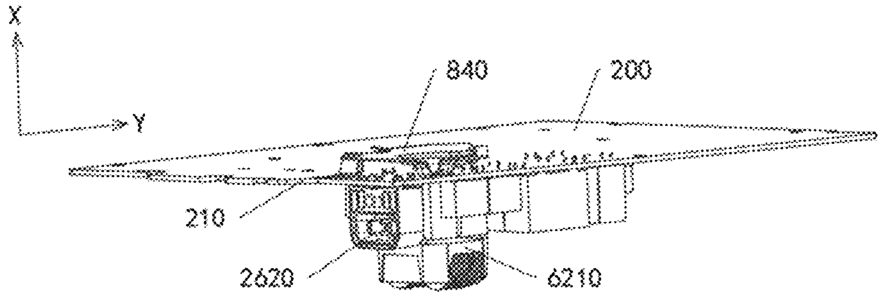
FIG. 59 is a schematic diagram of a partial structure of a vehicle-mounted power supply apparatus according to an implementation.

FIG. 59 is a schematic diagram of a partial structure of the vehicle-mounted power supply apparatus 10 according to an implementation. In this implementation, the HVDC filtering shielding can 840 is disposed close to an upper-layer front side edge 210 of the upper-layer PCB board 200, and the HVDC filtering shielding can 840 covers at least a part of the HVDC filter 6210 in the height direction X. This is to improve a shielding effect of the HVDC filtering shielding can 840 on the HVDC filter 6210, and further improve electromagnetic compatibility of the power conversion circuit 600 in the vehicle-mounted power supply apparatus 10.

Figure 60:
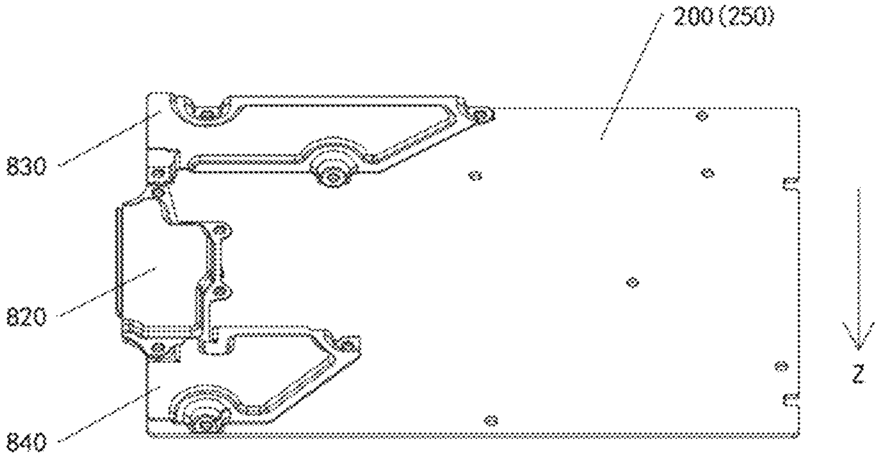
FIG. 60 is a schematic diagram of a partial structure of a vehicle-mounted power supply apparatus according to an implementation.

FIG. 60 is a schematic diagram of a partial structure of the vehicle-mounted power supply apparatus 10 according to an implementation. In an implementation, the AC filtering shielding can 830, the signal filtering shielding can 820, and the HVDC filtering shielding can 840 are arranged in the left-right direction Z of the vehicle-mounted power supply apparatus 10. The orthographic projection of the AC filtering shielding can 830 and the orthographic projection of the HVDC filtering shielding can 840 on the upper-layer PCB board 200 have at least a part that does not overlap an orthographic projection of the lower-layer PCB board 300 on the upper-layer PCB board 200.

In this implementation, arrangement of the AC filtering shielding can 830, the signal filtering shielding can 820, and the HVDC filtering shielding can 840 on the upper surface 250 of the upper-layer PCB board 200 corresponds to arrangement of the AC filter 6100, the control signal connector 2610, and the HVDC filter 6210 on the lower surface 260 of the upper-layer PCB board 200, so that the AC filtering shielding can 830, the signal filtering shielding can 820, and the HVDC filtering shielding can 840 can implement shielding functions.

In an implementation, the orthographic projection of the AC filtering shielding can 830 and the orthographic projection of the HVDC filtering shielding can 840 on the upper-layer PCB board 200 completely do not overlap the orthographic projection of the lower-layer PCB board 300 on the upper-layer PCB board 200. This improves shielding effects of the AC filtering shielding can 830 and the HVDC filtering shielding can 840 on the AC filter 6100 and the HVDC filter, and further improves electromagnetic compatibility of the power conversion circuit 600 in the vehicle-mounted power supply apparatus 10.

Figure 61:
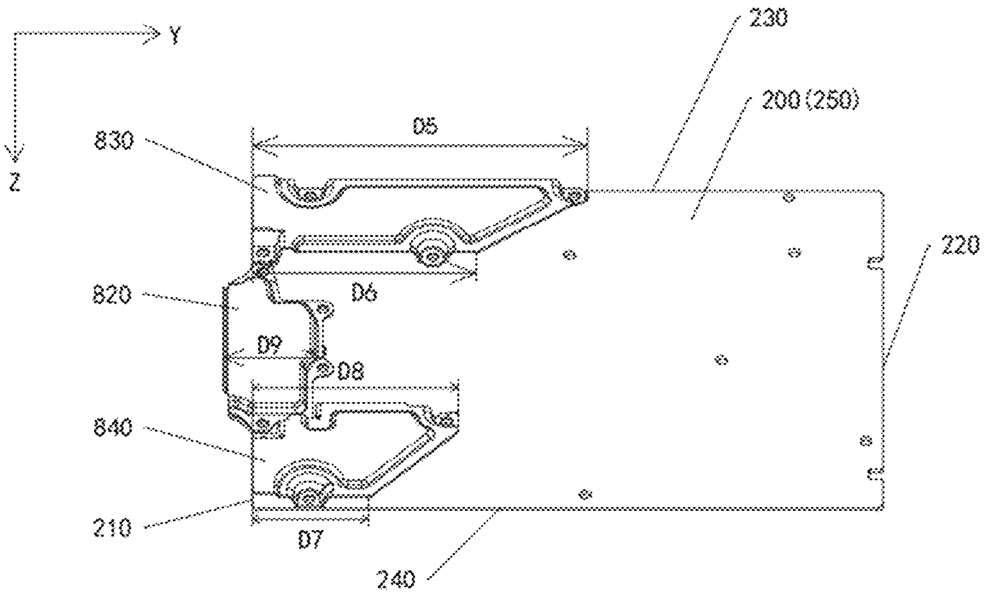
FIG. 61 is a schematic diagram of a partial structure of a vehicle-mounted power supply apparatus according to an implementation.

FIG. 61 is a schematic diagram of a partial structure of the vehicle-mounted power supply apparatus 10 according to an implementation. In an implementation, the AC filtering shielding can 830 is close to the upper-layer left side edge 230 along the left-right direction Z, and is close to the upper-layer front side edge 210 along the front-rear direction Y. A length of an end that is of the AC filtering shielding can 830 and that is close to the upper-layer left side edge 230 along the front-rear direction Y is greater than a length that is of an end of the AC filtering shielding can 830 and that is away from the upper-layer left side edge 230 along the front-rear direction Y.

In this implementation, the length of the end that is of the AC filtering shielding can 830 and that is close to the upper-layer left side edge 230 along the front-rear direction Y is D5, and the length of the end that is of the AC filtering shielding can 830 and that is away from the upper-layer left side edge 230 along the front-rear direction Y is D6. In this solution, D5>D6 is set. In one aspect, the end that is of the AC filtering shielding can 830 and that is close to the upper-layer left side edge 230 can cover a larger part of the AC filter 6100, which helps reduce costs of the AC filtering shielding can 830. In another aspect, because the AC filtering shielding can 830 needs to be fixedly connected to the bottom cover 100 through the upper-layer PCB board 200, setting of D5 and D6 needs to ensure that a position at which the AC filtering shielding can 830 and the upper-layer PCB board 200 are fastened is not blocked by another component and the lower-layer PCB board 300. If D5 is set to be equal to D6, there is no sufficient space on the upper-layer PCB board 200 for fastening the end that is of the AC filtering shielding can 830 and that is away from the upper-layer left side edge 230. Therefore, in this solution, D5>D6 is set, which makes mounting of the AC filtering shielding can 830 less difficult.

Still refer to FIG. 61. In an implementation, the HVDC filtering shielding can 840 is close to the upper-layer right side edge 240 along the left-right direction Z of the vehicle-mounted power supply apparatus 10, and is close to the upper-layer front side edge 210 along the front-rear direction Y. A length of the end that is of the HVDC filtering shielding can 840 and that is close to the upper-layer right side edge 240 along the front-rear direction Y is less than a length of the end that is of the HVDC filtering shielding can 840 and that is away from the upper-layer right side edge 240 along the front-rear direction Y.

In this implementation, the length of the end that is of the HVDC filtering shielding can 840 and that is close to the upper-layer right side edge 240 along the front-rear direction Y is D7, and the length of the end that is of the HVDC filtering shielding can 840 and that is away from the upper-layer right side edge 240 along the front-rear direction Y is D8. In this solution, D7<D8 is set. In one aspect, the end that is of the HVDC filtering shielding can 840 and that is away from the upper-layer right side edge 240 can cover a larger part of the HVDC filter 6210, which helps reduce costs of the HVDC filtering shielding can 840. In another aspect, because the HVDC filtering shielding can 840 needs to be fixedly connected to the bottom cover 100 through the upper-layer PCB board 200, setting of D7 and D8 needs to ensure that a position at which the HVDC filtering shielding can 840 and the upper-layer PCB board 200 are fastened is not blocked by another component and the lower-layer PCB board 300. If D7 is set to be equal to D8, there is no sufficient space on the upper-layer PCB board 200 for fastening the end that is of the HVDC filtering shielding can 840 and that is close to the upper-layer right side edge 240. Therefore, in this solution, D7>D8 is set, which makes mounting of the HVDC filtering shielding can 840 less difficult.

Still refer to FIG. 61. In an implementation, a length of the signal filtering shielding can 820 in the front-rear direction Y of the vehicle-mounted power supply apparatus 10 is less than the length that is of the end that is of the AC filtering shielding can 830 and that is away from the upper-layer left side edge 230 along the front-rear direction Y. Alternatively, the length of the signal filtering shielding can 820 in the front-rear direction Y is less than the length that is of the end of the HVDC filtering shielding can 840 and that is close to the upper-layer right side edge 240 along the front-rear direction Y.

In this implementation, the length of the signal filtering shielding can 820 in the front-rear direction Y is D9, and D6<D9 or D7<D9 is set. This ensures that the signal filtering shielding can 820 can generate a shielding effect on the control signal connector 2610, and further reduces manufacturing costs of the signal filtering shielding can 820 and an occupied mounting area on the upper-layer PCB board 200, which facilitates miniaturization design of the vehicle-mounted power supply apparatus 10.

Figure 62:
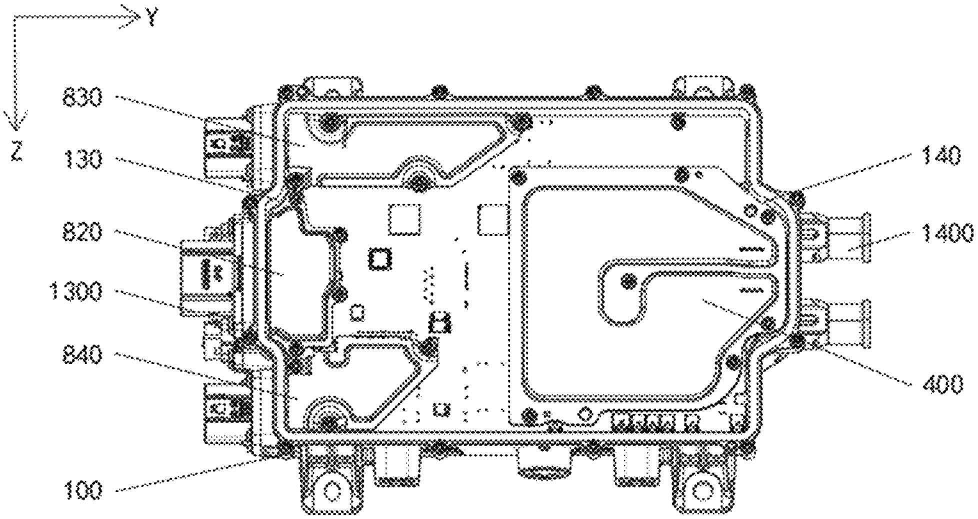
FIG. 62 is a schematic diagram of a partial structure of a vehicle-mounted power supply apparatus according to an implementation.

FIG. 62 is a schematic diagram of a partial structure of the vehicle-mounted power supply apparatus 10 according to an implementation. In an implementation, the AC filtering shielding can 830, the signal filtering shielding can 820, and the HVDC filtering shielding can 840 are aligned with a side wall, of the bottom cover 100, on which the electrical interfaces 1300 are provided. The radiator 400 is connected to the cooling channel interface 1400 of the bottom cover 100, and the side wall on which the electrical interfaces 1300 are provided is opposite to a side wall on which the cooling channel interface 1400 is provided.

In this implementation, the electrical interfaces 1300 are provided on the front side wall 130 of the vehicle-mounted power supply apparatus 10, and the AC filtering shielding can 830, the signal filtering shielding can 820, and the HVDC filtering shielding can 840 are disposed close to the front side wall 130 along the front-rear direction Y, which facilitates electrical shielding for a part of the power conversion circuit 600 electrically connected to the electrical interfaces 1300. The cooling channel interface 1400 is disposed on the rear side wall 140 of the vehicle-mounted power supply apparatus 10, and the radiator 400 is disposed close to the rear side wall 140 along the front-rear direction Y. This helps shorten a distance to the radiator 400 for coolant from an external cooling system, and improve a cooling effect of the coolant in the vehicle-mounted power supply apparatus 10. The electrical interfaces 1300 are provided opposite to the cooling channel interface 1400.

Because the electrical interfaces 1300 and the cooling channel interface 1400 are isolated in physical space, it can be avoided that coolant leaks from the cooling channel interface 1400 and affects electrical performance of the electrical interfaces 1300, and security performance of the vehicle-mounted power supply apparatus 10 is improved.

In some other implementations, the electrical interfaces 1300 may be disposed on another side wall of the bottom cover 100, provided that it is ensured that the electrical interfaces 1300 and the cooling channel interface 1400 are provided on different side walls.

Figure 63:
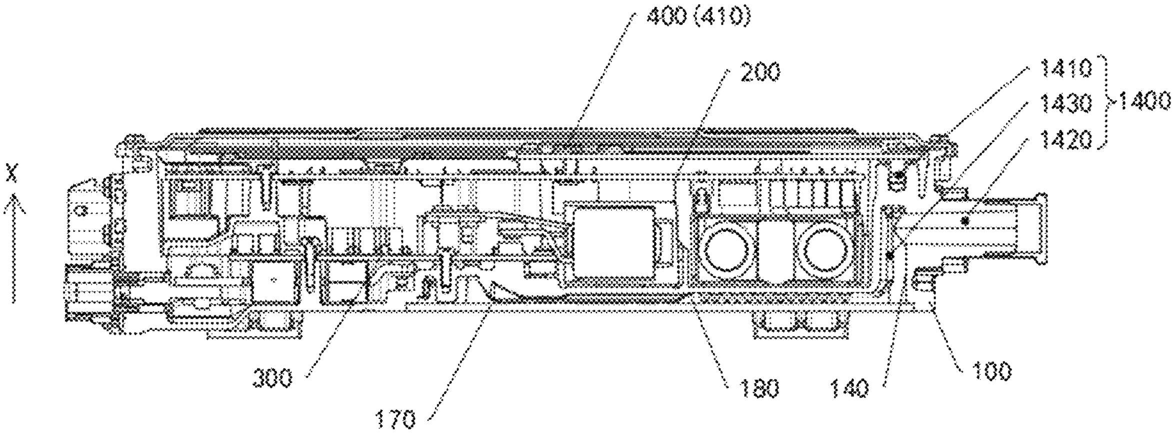
FIG. 63 is a sectional view of a vehicle-mounted power supply apparatus according to an implementation.

Refer to FIG. 13 and FIG. 63. FIG. 63 is a sectional view of the vehicle-mounted power supply apparatus 10 according to an implementation. In an implementation, the bottom cover 100 includes a bottom plate 170 and four side walls. The lower-layer PCB board 300 and the plurality of transformers 650 are fastened to the bottom plate 170, and the radiator 400 and the upper-layer PCB board 200 are sequentially stacked above the lower-layer PCB board 300 and the plurality of transformers 650 (as shown in FIG. 13). The radiator 400 includes an upper-layer cooling channel 410 (as shown in FIG. 63). The bottom cover 100 includes a lower-layer cooling channel 180. The upper-layer cooling channel 410 communicates with the lower-layer cooling channel 180 of the bottom cover 100 through a side wall.

In this implementation, the power switching transistor 660 and the transformers 650 are heat generation components in the power conversion circuit 600. The power switching transistor 660 is distributed on the upper surface 250 of the upper-layer PCB board 200 and the upper surface 350 of the lower-layer PCB board 300. The plurality of transformers 650 are fastened between the lower surface 260 of the upper-layer PCB board 200 and the bottom cover 100. The upper-layer cooling channel 410 in the radiator 400 is provided close to the upper surface 250 of the upper-layer PCB board 200, and the lower-layer cooling channel 180 of the bottom cover 100 is provided close to the lower-layer PCB board 300 and the plurality of transformers 650. When the vehicle-mounted power supply apparatus 10 is connected to the external cooling system, coolant flows into the upper-layer cooling channel 410 and the lower-layer cooling channel 180, heat generated by components in different positions of the vehicle-mounted power supply apparatus 10 can be taken away by the coolant. The use of the upper-layer cooling channel 410 and the lower-layer cooling channel 180 in combination helps improve a cooling effect.

In this implementation, the bottom cover 100 includes four side walls: the front side wall 130, the rear side wall 140, the left side wall 150, and the right side wall 160. The rear side wall 140 is located between the upper-layer cooling channel 410 and the lower-layer cooling channel 180 along the height direction X of the vehicle-mounted power supply apparatus 10. Both the upper-layer cooling channel 410 and the lower-layer cooling channel 180 are provided close to the rear side wall 140 of the bottom cover 100. There is no barrier between the upper-layer cooling channel 410 and the lower-layer cooling channel 180, so that the coolant is less resisted when flowing in the vehicle-mounted power supply apparatus 10, and has a faster flow speed and larger flow rate, which can facilitate a capability of dissipating heat of the heat generation component. This helps improve a cooling effect of the coolant on the vehicle-mounted power supply apparatus 10. In some other implementations, the upper-layer cooling channel 410 and the lower-layer cooling channel 180 may alternatively communicate with each other through another side wall of the bottom cover 100.

Figure 64:
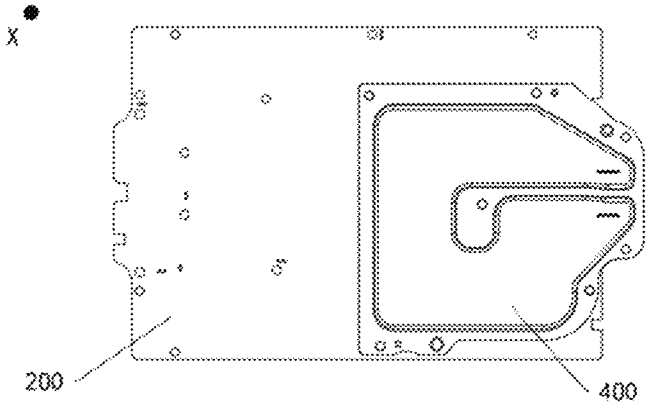
FIG. 64 is a schematic diagram of a structure of an upper-layer PCB board and a radiator according to an implementation.
Figure 65:
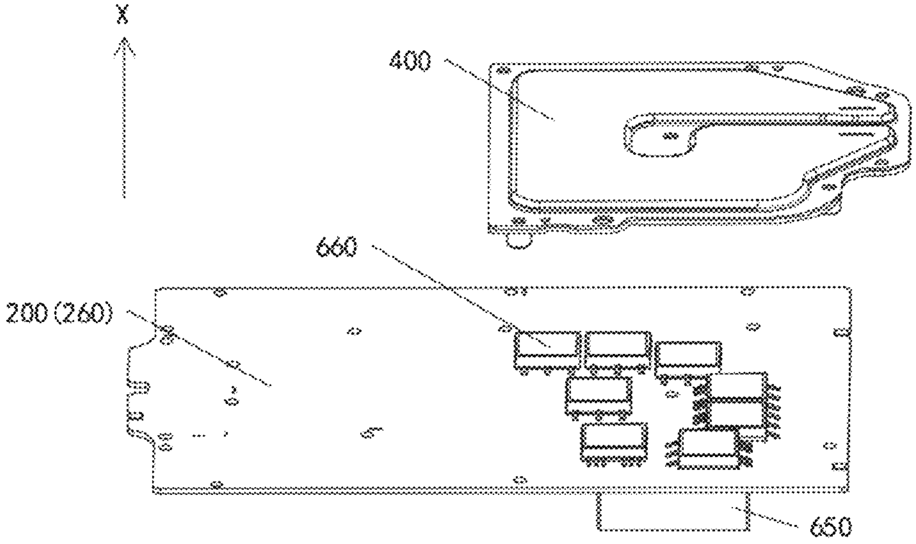
FIG. 65 is a schematic diagram of a partial structure of a vehicle-mounted power supply apparatus according to an implementation.

FIG. 64 is a schematic diagram of a structure of the upper-layer PCB board 200 and the radiator 400 according to an implementation. FIG. 65 is a schematic diagram of a partial structure of the vehicle-mounted power supply apparatus 10 according to an implementation. In an implementation, an area of an orthographic projection of the radiator 400 on the upper-layer PCB board 200 is less than an area of the upper-layer PCB board 200 (as shown in FIG. 64). The orthographic projection of the radiator 400 covers the plurality of transformers 650 and the plurality of power switching transistors 660 borne on the upper-layer PCB board 200 (as shown in FIG. 65).

In this implementation, a cross section of the radiator 400 and a surface of the upper-layer PCB board 200 are both perpendicular to the height direction X of the vehicle-mounted power supply apparatus 10. The radiator 400 does not occupy a large area on the upper-layer PCB board 200. In one aspect, more space is available on the upper surface 250 of the upper-layer PCB board 200 for mounting other components, to improve space utilization inside the vehicle-mounted power supply apparatus 10. In another aspect, the radiator 400 may be flexibly arranged on the upper-layer PCB board 200 based on a position of the heat generation component, to effectively dissipate heat of the heat generation component, improve a local heat dissipation effect, and help reduce manufacturing costs of the radiator 400.

In this implementation, the power switching transistor 660 is one of main heat sources of the power conversion circuit 600. The radiator 400 is provided outside the power switching transistor 660 along the height direction X of the vehicle-mounted power supply apparatus 10. When the coolant flows into the radiator 400, the coolant can take away heat generated by the power switching transistor 660, thereby reducing a temperature of the power switching transistor 660 in a stable working state, and implementing temperature control for the vehicle-mounted power supply apparatus 10.

Figure 66:
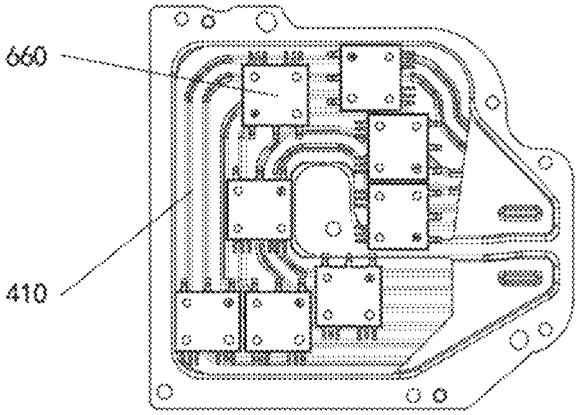
FIG. 66 is a schematic diagram of a structure of an upper-layer cooling channel and a power switching transistor according to an implementation.

FIG. 66 is a schematic diagram of a structure of the upper-layer cooling channel 410 and the power switching transistor 660 according to an implementation. In an implementation, an orthographic projection of the upper-layer cooling channel 410 in the radiator 400 on the upper-layer PCB board 200 covers the plurality of power switching transistors 660.

In this implementation, the radiator 400 can implement the cooling effect through the internal upper-layer cooling channel 410. Both the upper-layer cooling channel 410 and the power switching transistors 660 are located on the upper surface 250 of the upper-layer PCB board 200. The orthographic projection of the upper-layer cooling channel 410 on the upper-layer PCB board 200 covers all the power switching transistors 660, so that when the coolant flows through the upper-layer cooling channel 410, the coolant can cool all the power switching transistors 660 through heat dissipation. This improves cooling efficiency of the radiator 400.

Figure 67:
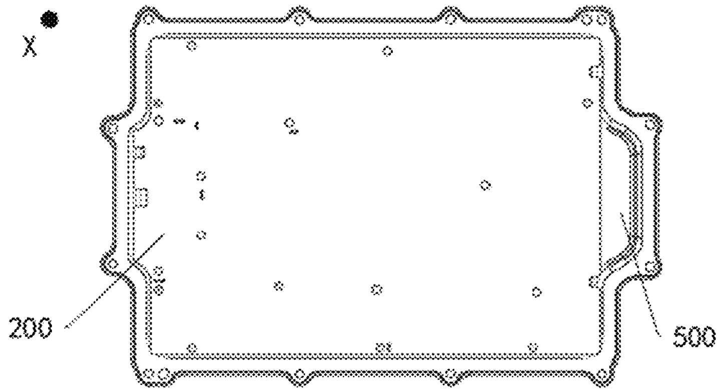
FIG. 67 is a schematic diagram of a structure of a cover plate and an upper-layer PCB board according to an implementation.

Refer to FIG. 3 and FIG. 67. FIG. 67 is a schematic diagram of a structure of the cover plate 500 and the upper-layer PCB board 200 according to an implementation. In an implementation, the vehicle-mounted power supply apparatus 10 includes the cover plate 500 (as shown in FIG. 3). An area of the cover plate 500 is greater than the area of the upper-layer PCB board 200 (as shown in FIG. 67). A gap between the cover plate 500 and the upper-layer PCB board 200 is used to accommodate the radiator 400 (as shown in FIG. 3).

The area of the cover plate 500 is an area of a surface that is of the cover plate 500 and that faces the upper-layer PCB board 200. The area of the upper-layer PCB board 200 is an area of a board surface of the upper-layer PCB board 200, that is, an area of one of board surfaces of the upper-layer PCB board 200, for example, an upper surface or a lower surface of the board surface of the upper-layer PCB board 200. The foregoing area of the board surface of the lower-layer PCB board 300 is an area of an upper surface or a lower surface of the board surface of the lower-layer PCB board 300. Areas of the upper surface and the lower surface are generally the same.

In this implementation, the cover plate 500 is located on a side that is of the upper-layer PCB board 200 and that is away from the bottom cover 100 along the height direction X of the vehicle-mounted power supply apparatus 10. The cover plate 500 can completely cover the upper-layer PCB board 200, so that the cover plate 500 is fixedly connected to the bottom cover 100 on an outer side of the upper-layer PCB board 200, to form an accommodating cavity and protect the power conversion circuit 600 from being affected by an external environment. The radiator 400 is located in the gap between the cover plate 500 and the upper-layer PCB board 200. Even if coolant leaks from the radiator 400, the leaked coolant does not flow out of the vehicle-mounted power supply apparatus 10 due to blocking of the cover plate 500, thereby reducing impact of the coolant leakage on an entire vehicle.

Figure 68:
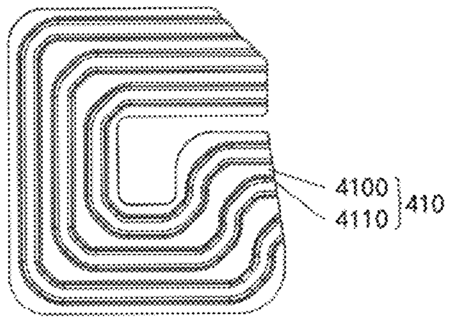
FIG. 68 is a schematic diagram of a structure of an upper-layer cooling channel according to an implementation.

FIG. 68 is a schematic diagram of a structure of the upper-layer cooling channel 410 according to an implementation. In an implementation, the upper-layer cooling channel 410 includes an upper-layer cooling channel body 4100 and an upper-layer spoiler 4110. The upper-layer spoiler 4110 is fastened inside the upper-layer cooling channel body 4100 and is configured to disturb a cooling medium in the upper-layer cooling channel body 4100.

In this implementation, the upper-layer spoiler 4110 has a flow spoiling effect on coolant flowing into the upper-layer cooling channel body 4100, which helps enhance convective heat transfer. In addition, the upper-layer spoiler 4110 can further buffer an impact force of the coolant on a specific direction, thereby improving a heat dissipation effect. In this implementation, a largest surface of the upper-layer spoiler 4110 is perpendicular to a surface of the upper-layer cooling channel body 4100. In some other implementations, an included angle between the largest surface of the upper-layer spoiler 4110 and the surface of the upper-layer cooling channel body 4100 may be less than 90°.

In an implementation, the upper-layer spoiler 4110 and the upper-layer cooling channel body 4100 are an integrally formed structure. In this implementation, the upper-layer cooling channel 410 is formed by die casting by using a sheet metal part, where a protrusion part is the upper-layer spoiler 4110, and a recess part is the upper-layer cooling channel body 4100.

Figure 69:
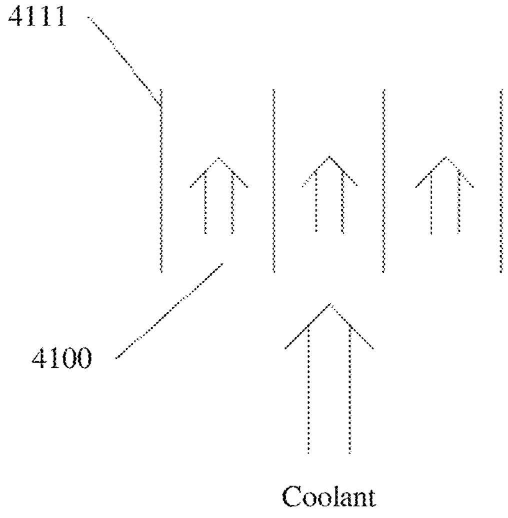
FIG. 69 is a schematic diagram of a structure of an upper-layer cooling channel according to an implementation.

FIG. 69 is a schematic diagram of a structure of the upper-layer cooling channel 410 according to an implementation. In an implementation, the upper-layer spoiler 4110 includes a plurality of spoiling segments 4111, and at least some of the plurality of spoiling segments 4111 are disposed side by side at intervals.

In this implementation, the spoiling segments 4111 are spaced, and a gap between every two parallel spoiling segments 4111 forms an independent passage. After coolant enters the upper-layer cooling channel 410, the coolant is divided into a plurality of branches by the spoiling segments 4111. The plurality of branches flow in separate passages and exchange heat with the plurality of power switching transistors 660. In this solution, the spoiling segments 4111 are disposed in the upper-layer spoiler 4110, so that a contact area between the coolant and the upper-layer cooling channel 410 is increased.

Figure 70:
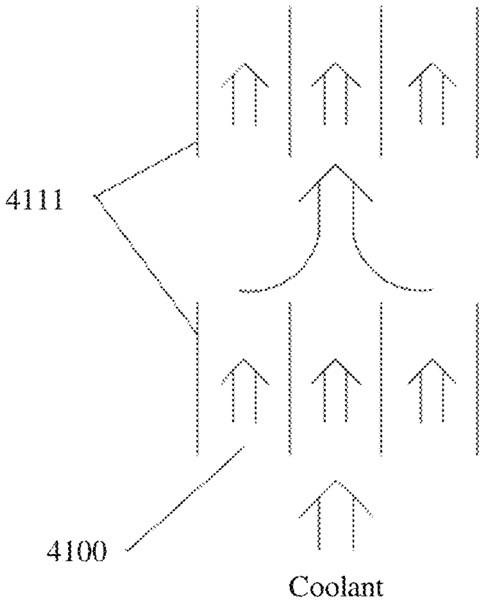
FIG. 70 is a schematic diagram of a structure of an upper-layer cooling channel according to an implementation.

FIG. 70 is a schematic diagram of a structure of the upper-layer cooling channel 410 according to an implementation. In an implementation, the upper-layer spoiler 4110 includes a plurality of spoiling segments 4111. Some of the plurality of spoiling segments 4111 are spaced along an extension direction of the spoiling segments 4111.

In this implementation, some of the spoiling segments 4111 are spaced along the extension direction of the spoiling segments 4111, and are disposed side by side at intervals with other spoiling segments 4111. The upper-layer cooling channel 410 is divided into interconnected passages by gaps along the extension direction of the spoiling segments 4111. The upper-layer cooling channel 410 is divided into mutually independent passages by gaps between the spoiling segments 4111 disposed side by side. After entering the mutually independent passages, coolant is divided into a plurality of branches. The plurality of branches converge as the coolant when passing through a gap along the extension direction of the spoiling segments 4111, and then enter the mutually independent passages again. In this case, when flowing in a gap between the spoiling segments 4111, the coolant may flow to a gap between any two adjacent spoiling segments 4111, so that the coolant circulates in the passages in the upper-layer cooling channel 410. This helps reduce flow resistance of the coolant and improve heat dissipation efficiency.

Figure 71:
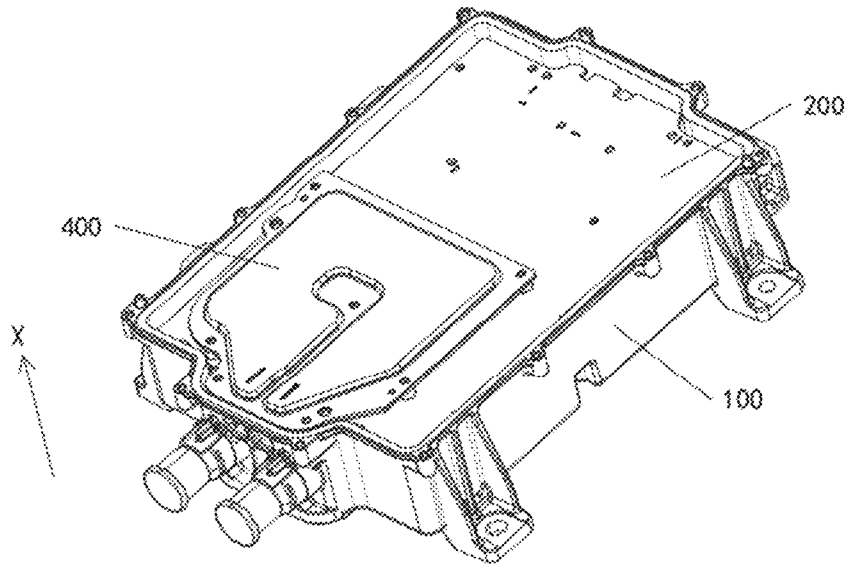
FIG. 71 is a schematic diagram of a partial structure of a vehicle-mounted power supply apparatus according to an implementation.

FIG. 71 is a schematic diagram of a partial structure of the vehicle-mounted power supply apparatus 10 according to an implementation. In an implementation, the upper-layer PCB board 200 is fixedly connected to the radiator 400, and the radiator 400 is fixedly connected to the bottom cover 100 through the upper-layer PCB board 200.

In this implementation, the radiator 400, the upper-layer PCB board 200, and the bottom cover 100 are sequentially arranged along the height direction X of the vehicle-mounted power supply apparatus 10, and the radiator 400, the upper-layer PCB board 200, and the bottom cover 100 are fixedly connected by using screws. Therefore, the radiator 400 is not easily to be interfered by an external force when cooling the power switching transistor 660, so that overall stability of the vehicle-mounted power supply apparatus 10 is improved.

Figure 72:
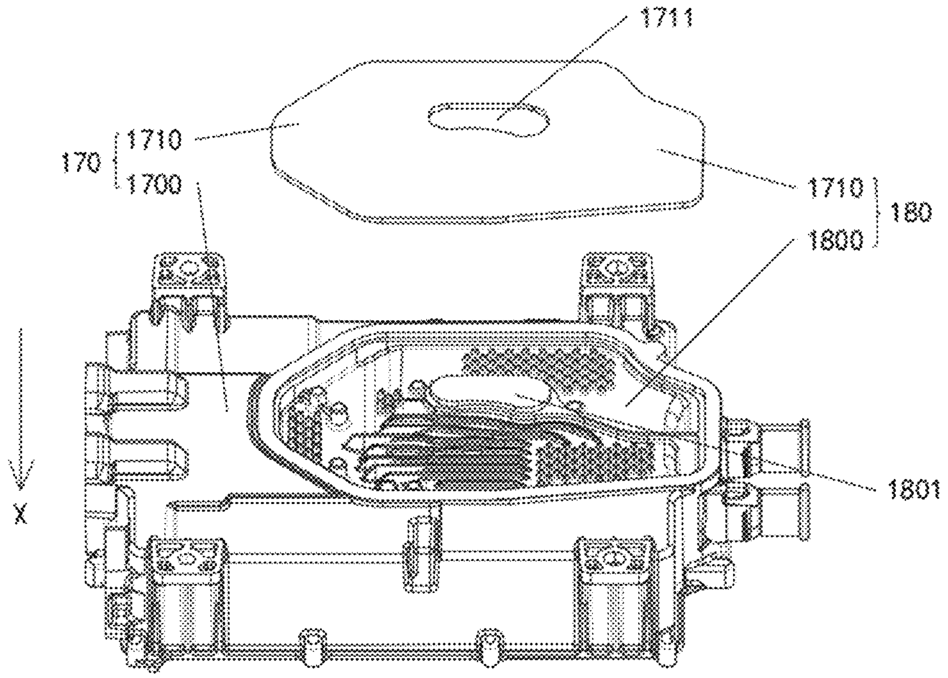
FIG. 72 is a schematic diagram of a partial structure of a vehicle-mounted power supply apparatus according to an implementation.

FIG. 72 is a schematic diagram of a partial structure of the vehicle-mounted power supply apparatus 10 according to an implementation. In an implementation, the bottom plate 170 includes a bottom plate body 1700 and a sealing plate 1710 located on an outer side of the bottom plate body 1700, the outer side of the bottom plate body 1700 is provided with a lower-layer cooling channel body 1800, and the sealing plate 1710 and the lower-layer cooling channel body 1800 are connected in a sealed manner and jointly form the lower-layer cooling channel 180.

In this implementation, the lower-layer cooling channel body 1800 and the bottom plate body 1700 are disposed opposite to each other, and the outer side of the bottom plate body 1700 is a side that is away from the lower-layer PCB board 300 and the upper-layer PCB board 200 along the height direction X of the vehicle-mounted power supply apparatus 10. In this solution, the sealing plate 1710 is disposed in the bottom plate 170. In one aspect, the sealing plate 1710 is configured to form the lower-layer cooling channel 180 with the lower-layer cooling channel body 1800. In another aspect, the sealing plate 1710 can prevent coolant from leakage, so that after the coolant flows into the lower-layer cooling channel body 1800, cooling and heat dissipation can be performed on a heat generation component disposed close to the bottom plate body 1700 without affecting normal operation of the heat generation component.

In an implementation, the lower-layer cooling channel body 1800 includes a sealing plate mounting portion 1801, the sealing plate 1710 is provided with a sealing plate mounting hole 1711 that penetrates through two end surfaces along the height direction X of the vehicle-mounted power supply apparatus 10, and a shape of an edge of the sealing plate 1710 matches a shape of an edge of the lower-layer cooling channel body 1800. When the sealing plate mounting portion 1801 passes through the sealing plate mounting hole 1711, the sealing plate 1710 is connected to the lower-layer cooling channel body 1800 in a sealed manner.

Figure 73:
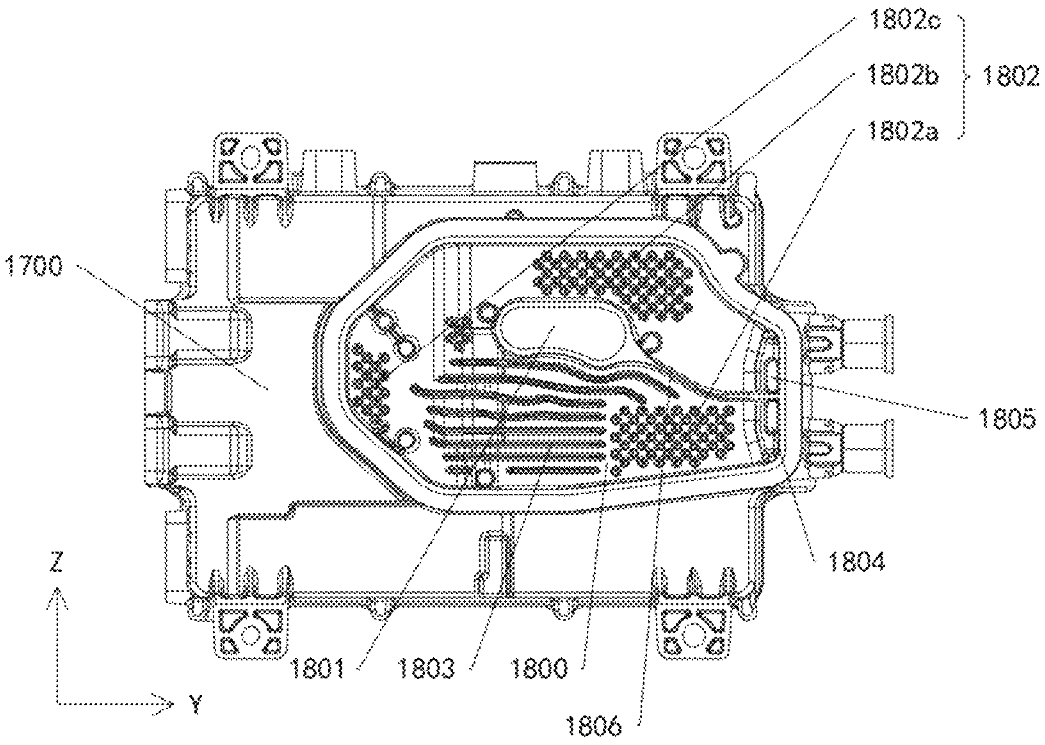
FIG. 73 is a schematic diagram of a partial structure of a vehicle-mounted power supply apparatus according to an implementation.

FIG. 73 is a schematic diagram of a partial structure of the vehicle-mounted power supply apparatus 10 according to an implementation. In an implementation, at least one group of spoiler teeth 1802 and at least one group of spoiler plates 1803 are disposed in the lower-layer cooling channel body 1800, each group of spoiler teeth 1802 has a plurality of spaced spoiler teeth 1802, and each group of spoiler plates 1803 has a plurality of spaced spoiler plates 1803 disposed side by side.

In this implementation, when coolant flows into the lower-layer cooling channel body 1800, outer surfaces of the spoiler teeth 1802 and the spoiler plates 1803 are in contact with the coolant. In this solution, the spoiler teeth 1802 and the spoiler plates 1803 are disposed, so that a contact area between the coolant and the lower-layer cooling channel body 1800 can be increased, and turbulence of the coolant can be enhanced. Gaps between the plurality of spoiler plates 1803 form flow passages. Gaps between the plurality of spoiler teeth 1802 form flow passages. When the coolant flows in the gaps between the plurality of spoiler teeth 1802, the coolant may flow to a gap between any two adjacent spoiler teeth 1802, which helps reduce flow resistance of the coolant and improve heat dissipation efficiency.

In an implementation, the lower-layer cooling channel body 1800 includes a lower-layer channel inlet 1804 and a lower-layer channel outlet 1805. The lower-layer channel inlet 1804 and the lower-layer channel outlet 1805 are arranged along the left-right direction Z of the vehicle-mounted power supply apparatus 10. The lower-layer cooling channel body 1800 includes three groups of spoiler teeth 1802 and one group of spoiler plates 1803. The three groups of spoiler teeth 1802 are respectively marked as spoiler teeth 1802*a*, spoiler teeth 1802*b*, and spoiler teeth 1802*c*. The spoiler teeth 1802*a* and the spoiler teeth 1802*b* are respectively disposed close to the lower-layer channel inlet 1804 and the lower-layer channel outlet 1805, and arranged along the left-right direction Z of the vehicle-mounted power supply apparatus 10. The spoiler teeth 1802*c* are located on a side, of the lower-layer cooling channel body 1800, away from the lower-layer channel inlet 1804. The spoiler teeth 1802*c*, the group of spoiler plates 1803, and the spoiler teeth 1802*a* are arranged along the front-rear direction Y of the vehicle-mounted power supply apparatus 10. In this implementation, the coolant enters the lower-layer cooling channel body 1800 from the lower-layer channel inlet 1804, and flows out from the lower-layer channel outlet 1805. In a process of entering and exiting the lower-layer cooling channel body 1800, the coolant is in contact with the plurality of spoiler teeth 1802 and the plurality of spoiler plates 1803. When heat is transferred from a heat generation component to the lower-layer cooling channel body 1800, a cooling medium between the plurality of spoiler teeth 1802 and a cooling medium between the plurality of spoiler plates 1803 exchange heat with the heat generation component, so that the power conversion circuit 600 can work within a proper temperature range.

In an implementation, both the spoiler teeth 1802 and the spoiler plates 1803 are integrally formed with the bottom plate 170. When the spoiler teeth 1802 and the spoiler plates 1803 are subject to an external force (for example, an action force of the coolant), positions of the spoiler teeth 1802 and the spoiler plates 1803 do not change. This solution helps enhance structural strength of the spoiler teeth 1802 and the spoiler plates 1803.

In an implementation, the lower-layer cooling channel body 1800 further includes a flow isolation segment 1806. The flow isolation segment 1806 is configured to block a part of the lower-layer cooling channel 180 close to the lower-layer channel inlet 1804 and a part of the lower-layer cooling channel 180 close to the lower-layer channel outlet 1805. One end of the flow isolation segment 1806 is located between the lower-layer channel inlet 1804 and the lower-layer channel outlet 1805. The other end of the flow isolation segment 1806 is integrally formed with the sealing plate mounting portion 1801. The spoiler teeth 1802*a* and the spoiling segment 4111, and the spoiler teeth 1802*b* are respectively located on two sides of the flow isolation segment 1806 along the left-right direction Z of the vehicle-mounted power supply apparatus 10. It may be understood that, a temperature of coolant flowing out of the lower-layer cooling channel body 1800 is higher than a temperature of coolant entering the lower-layer cooling channel body 1800 from the lower-layer channel inlet 1804. In this solution, the flow isolation segment 1806 is provided in the lower-layer cooling channel body 1800, which helps improve heat dissipation efficiency of the coolant in the lower-layer cooling channel 180.

In an implementation, the lower-layer cooling channel body 1800 and the bottom plate body 1700 are an integrally formed structure.

In this implementation, the lower-layer cooling channel body 1800 is fastened to the bottom plate body 1700, so that the lower-layer cooling channel body 1800 is also relatively fastened to components fastened to the bottom cover 100. When the lower-layer cooling channel 180 is subject to an external force (for example, an action force of coolant), a position can be kept unchanged. This solution helps enhance structural strength of the lower-layer cooling channel body 1800, and at the same time, enables the lower-layer cooling channel body 1800 to stably cool the heat generation component through heat dissipation, to prevent the lower-layer cooling channel body 1800 from being affected by the external environment.

Refer to FIG. 63 and FIG. 72. In an implementation, an area of a cross section of the lower-layer cooling channel 180 is less than an area of a plate surface of the bottom plate 170 (as shown in FIG. 72). Both the cross section of the lower-layer cooling channel 180 and the plate surface of the bottom plate 170 are perpendicular to the height direction X of the vehicle-mounted power supply apparatus 10 (as shown in FIG. 63).

In this implementation, cross sections of the plate surface of the bottom plate 170, the upper-layer cooling channel 410, and the lower-layer cooling channel 180 are all perpendicular to the height direction X of the vehicle-mounted power supply apparatus 10. The lower-layer cooling channel 180 does not occupy a large area on the bottom plate 170. The lower-layer cooling channel 180 may be flexibly arranged on the lower-layer PCB board 300 based on a position of a heat generation component, to effectively dissipate heat of the heat generation component, improve a local heat dissipation effect, and help reduce manufacturing costs of the lower-layer cooling channel 180.

Figure 74:
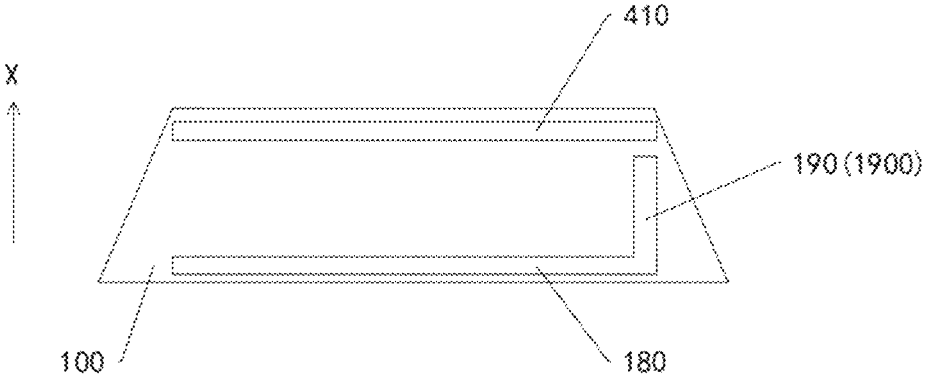
FIG. 74 is a schematic diagram of a partial structure of a vehicle-mounted power supply apparatus according to an implementation.
Figure 75:
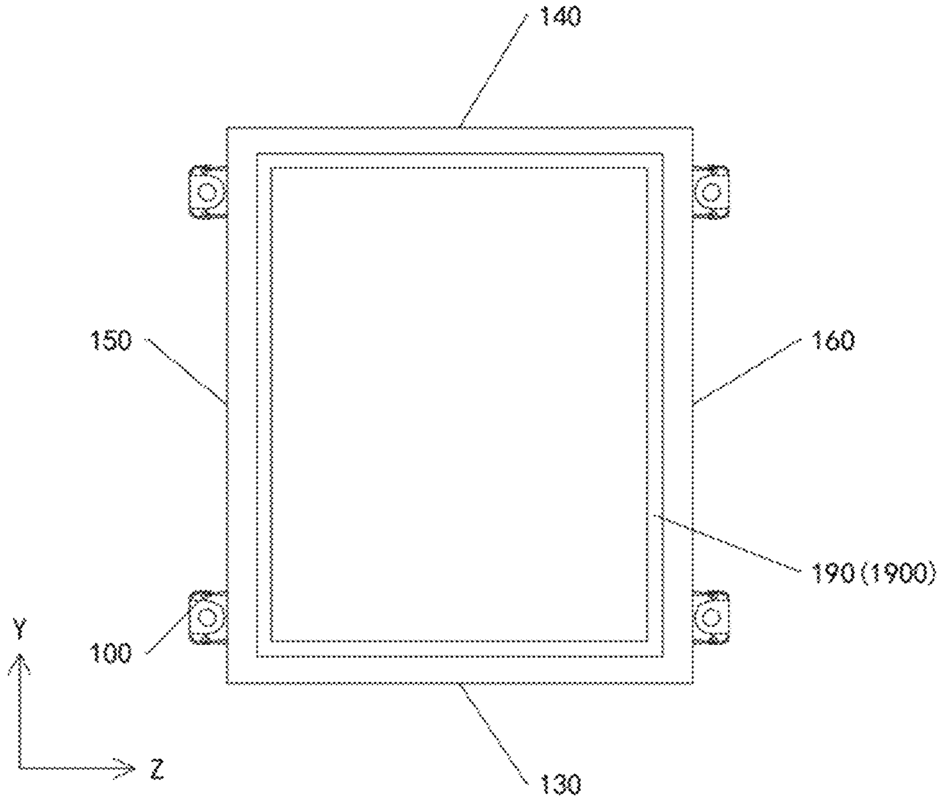
FIG. 75 is a schematic diagram of a partial structure of a vehicle-mounted power supply apparatus according to an implementation.

FIG. 74 is a schematic diagram of a partial structure of the vehicle-mounted power supply apparatus 10 according to an implementation. FIG. 75 is a schematic diagram of a partial structure of the vehicle-mounted power supply apparatus 10 according to an implementation. In an implementation, the bottom cover 100 further includes a side frame 190 (as shown in FIG. 74) surrounding the periphery of the bottom plate 170, and a side cooling channel 1900 (as shown in FIG. 74) is provided in the side frame 190.

In this implementation, the side frame 190 is integrally annular, and has two openings along the height direction X of the vehicle-mounted power supply apparatus 10. An edge of one opening is fastened to an upper surface of the bottom plate 170. The side frame 190 and the bottom plate 170 are in a groove shape. The left side wall 150, the right side wall 160, the front side wall 130, and the rear side wall 140 of the vehicle-mounted power supply apparatus 10 form the side frame 190. The side cooling channel 1900 is provided in the side frame 190, where the side cooling channel 1900 is located in any one, two, three, or four of the left side wall 150, the right side wall 160, the front side wall 130, and the rear side wall 140 (as shown in FIG. 75). The side cooling channel 1900 surrounds a part or all of the power conversion circuit 600. After the coolant flows into the side cooling channel 1900, the coolant may cool through heat dissipation the heat generation component in the power conversion circuit 600 along the front-rear direction Y and the left-right direction Z of the vehicle-mounted power supply apparatus 10.

In an implementation, the side frame 190 and the bottom plate 170 are an integrally formed structure. The side frame 190 and the bottom plate 170 are fastened, so that the side cooling channel 1900 in the side frame 190 and the power conversion circuit 600 are also relatively fastened. When the lower-layer cooling channel 180 is affected by an external force (for example, an action force of the coolant), a position can be kept unchanged. In addition, the side cooling channel 1900 can stably dissipate heat of the heat generation component, so that the side cooling channel 1900 is not affected by the external environment.

In an implementation, the side cooling channel 1900 includes at least one of a side spoiler plate and side spoiler teeth. In this solution, the side spoiler plate and the side spoiler teeth are provided, which helps increase a contact area between the coolant and the side cooling channel 1900, and improve cooling efficiency.

In an implementation, a part of the side frame 190 is connected to the bottom plate 170 in a sealed manner, and the side cooling channel 1900 in the side frame 190 is connected to the lower-layer cooling channel 180. This solution is helpful in forming a three-dimensional waterway in the vehicle-mounted power supply apparatus 10, so that the coolant can dissipate heat of different parts of the heat generation component.

Refer to FIG. 27 and FIG. 63. In an implementation, the power conversion circuit 600 includes the PFC inductor 6120, the PFC capacitor 6110, and two transformers (as shown in FIG. 27). The lower-layer cooling channel 180 and the bottom cover 100 are of an integrally formed structure. The PFC inductor 6120, the PFC capacitor 6110, and the two transformers are in contact with the bottom of the bottom cover 100 through a heat-conductive material and are arranged above the lower-layer cooling channel 180 and below the upper-layer PCB board 200 in a flat manner (as shown in FIG. 27 and FIG. 63).

The two transformers are the LLC transformer 6200 and the low-voltage transformer 6310. When the capacitor, the inductor, and the transformer in the power conversion circuit 600 are in a working state, heat is generated, and a cooling channel needs to be provided for the heat generation component.

In this implementation, one end of each of the PFC inductor 6120, the PFC capacitor 6110, the LLC transformer 6200, and one end of the low-voltage transformer 6310 is disposed back to the upper-layer cooling channel 410. When cooling the power switching transistor, the upper-layer cooling channel 410 also has a heat dissipation effect for the heat generation component. The other end of each of the PFC inductor 6120, the PFC capacitor 6110, the LLC transformer 6200, and the low-voltage transformer 6310 is in contact with the lower-layer cooling channel 180 through a heat-conductive material. A part of heat generated by the heat generation component is transferred to the coolant in the lower-layer cooling channel 180 through the heat-conductive material. The upper-layer cooling channel 410 and the lower-layer cooling channel 180 cool the heat generation component from both sides along the height direction X of the vehicle-mounted power supply apparatus 10. This helps enhance the heat dissipation effect. The heat-conductive material includes, but is not limited to, a thermal grease, a thermal silicone sheet, a thermal conductive gel, and the like.

Refer to FIG. 63. The radiator 400 includes the upper-layer cooling channel 410. The bottom cover 100 includes the lower-layer cooling channel 180. The rear side wall 140 includes the cooling channel interface 1400. The cooling channel interface 1400 is configured to connect the external cooling system to the lower-layer cooling channel 180 and the upper-layer cooling channel 410. The external cooling system is configured to exchange a cooling medium with the lower-layer cooling channel 180 and the upper-layer cooling channel 410 through the cooling channel interface 1400.

In this implementation, the upper-layer cooling channel 410 may be configured to cool the power switching transistor 660 of the upper-layer PCB board 200 through heat dissipation; and the lower-layer cooling channel 180 may cool through heat dissipation the components such as the plurality of transformers, the inductor, and the capacitor that are fastened to the bottom cover 100. The two layers of channels communicate with each other through the cooling channel interface 1400, so that coolant can circulate between the two layers of cooling channels. This improves an even cooling effect for the vehicle-mounted power supply apparatus 10 and improves temperature uniformity of the vehicle-mounted power supply apparatus 10.

Refer to FIG. 27. In an implementation, the front side wall 130 includes the power interface 1310, the second direct current interface 1330, and the two first direct current interfaces 1340. The power interface 1310 and the second direct current interface 1330 are electrically connected to the upper-layer PCB board 200. The two first direct current interfaces 1340 are electrically connected to the lower-layer PCB board 300.

In this implementation, the power interface 1310, the second direct current interface 1330, and the two first direct current interfaces 1340 are electrical interfaces, and are all used for electrical transmission of the vehicle-mounted power supply apparatus 10. The electrical interfaces are disposed on the front side wall 130, and the cooling channel interface is disposed on the rear side wall 140 opposite to the front side wall 130, so that the electrical interfaces are far away from the cooling channel interface, and electrical transmission and coolant transmission do not affect each other. This helps improve working efficiency and safety performance of the vehicle-mounted power supply apparatus 10.

In this implementation, the power interface 1310 and the second direct current interface 1330 are electrically connected to a part of the power conversion circuit 600 on the upper-layer PCB board 200, and the first direct current interface 1340 is electrically connected to a part of the power conversion circuit 600 on the lower-layer PCB board 300, so that the upper-layer PCB board 200 and the lower-layer PCB board 300 undertake different electrical transmission work.

Refer to FIG. 63. In an implementation, the cooling channel interface 1400 includes two radiator interfaces 1410. The radiator interfaces 1410 are disposed on an upper surface of the rear side wall 140. The two radiator interfaces 1410 are respectively configured to connect an inlet and an outlet of the upper-layer cooling channel. In this implementation, the radiator interfaces 1410 are connected to the external cooling system and the upper-layer cooling channel 410, and have a flow diversion function for coolant.

In an implementation, the cooling channel interface 1400 further includes two external cooling system interfaces 1420. The external cooling system interfaces 1420 are disposed on a side surface that is of the rear side wall 140 and that is away from the upper-layer PCB board 200. The two external cooling system interfaces 1420 are respectively configured to connect an outlet and an inlet of the external cooling system. The coolant enters the cooling channel inside the vehicle-mounted power supply apparatus 10 through the external cooling system interfaces 1420.

In an implementation, the cooling channel interface 1400 further includes two bottom cover interfaces 1430. The two bottom cover interfaces 1430 are respectively configured to connect to an inlet and an outlet of the lower-layer cooling channel. The bottom cover interfaces 1430 are connected to the external cooling system and the lower-layer cooling channel 180, and have a flow diversion function for the coolant. The external cooling system interfaces 1420 communicate with the radiator interfaces 1410 and the bottom cover interfaces 1430 separately. The coolant enters the upper-layer cooling channel 410 and the lower-layer cooling channel 180 through the external cooling system interfaces 1420, flows through the upper-layer cooling channel 410 and the lower-layer cooling channel 180, and then flows out from the external cooling system interfaces 1420. In an implementation, the radiator interfaces 1410 are connected to the bottom cover interfaces 1430, so that the upper-layer cooling channel 410 is connected to the lower-layer cooling channel 180, which helps increase a contact area between the coolant and the vehicle-mounted power supply apparatus 10.

Figure 76:
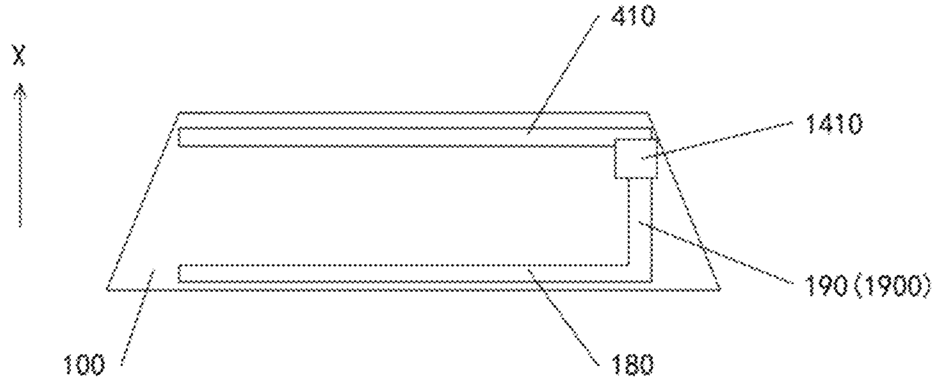
FIG. 76 is a schematic diagram of a partial structure of a vehicle-mounted power supply apparatus according to an implementation.

FIG. 76 is a schematic diagram of a partial structure of the vehicle-mounted power supply apparatus 10 according to an implementation. In an implementation, the radiator interfaces 1410 are disposed on the side frame 190. The radiator interfaces 1410 are connected to both the upper-layer cooling channel 410 and the lower-layer cooling channel 180. The radiator interfaces 1410 are configured to connect to the external cooling system. Coolant enters the upper-layer cooling channel 410 and the lower-layer cooling channel 180 through the radiator interfaces 1410, and flows out from the radiator interfaces 1410 after passing through the upper-layer cooling channel 410 and the lower-layer cooling channel 180.

In this implementation, the side frame 190 and the radiator interfaces 1410 are located between the upper-layer cooling channel 410 and the lower-layer cooling channel 180 along the height direction X of the vehicle-mounted power supply apparatus 10, and orthographic projections of the upper-layer cooling channel 410 and the lower-layer cooling channel 180 in the height direction X at least partially cover orthographic projections of the radiator interfaces 1410 in the height direction X. In this solution, the radiator interfaces 1410 are disposed, so that the upper-layer cooling channel 410 is connected to the lower-layer cooling channel 180, which helps increase a contact area between the coolant and the vehicle-mounted power supply apparatus 10.

Figure 77:
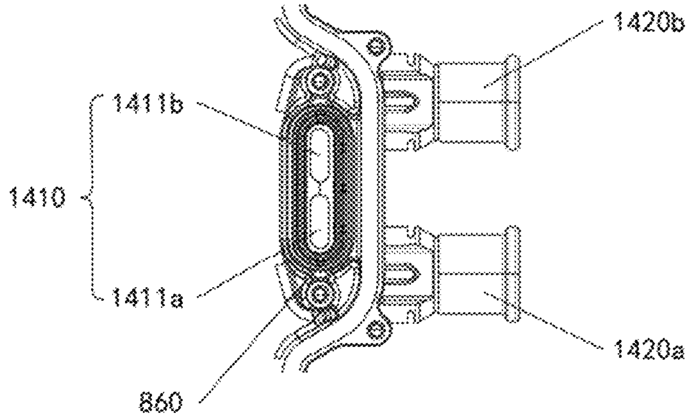
FIG. 77 is a partial enlarged diagram of a vehicle-mounted power supply apparatus according to an implementation.

FIG. 77 is a partial enlarged view of the vehicle-mounted power supply apparatus 10 according to an implementation. In an implementation, the radiator interfaces 1410 include a first transfer channel 1411*a* and a second transfer channel 1411*b* that are spaced along the left-right direction Z of the vehicle-mounted power supply apparatus 10, and both the first transfer channel 1411*a* and the second transfer channel 1411*b* are of a runway shape. The two external cooling system interfaces 1420*a* and 1420*b* are disposed on an outer side of the bottom cover 100. One end of the external cooling system interface 1420*a* is connected to one end of the external cooling system interface 1420*b* through the first transfer channel 1411*a*, the upper-layer cooling channel 410, the second transfer channel 1411*b*, and the lower-layer cooling channel 180. The other end of the external cooling system interface 1420*a* and the other end of the external cooling system interface 1420*b* are configured to connect to a cooling apparatus. This solution describes composition of the radiator interfaces 1410 and a path of coolant in the vehicle-mounted power supply apparatus 10. The first transfer channel 1411*a* and the second transfer channel 1411*b* are spaced, which helps avoid mutual interference between coolant of different temperatures and prevent a heat dissipation effect of the coolant from adverse impact.

Figure 78:
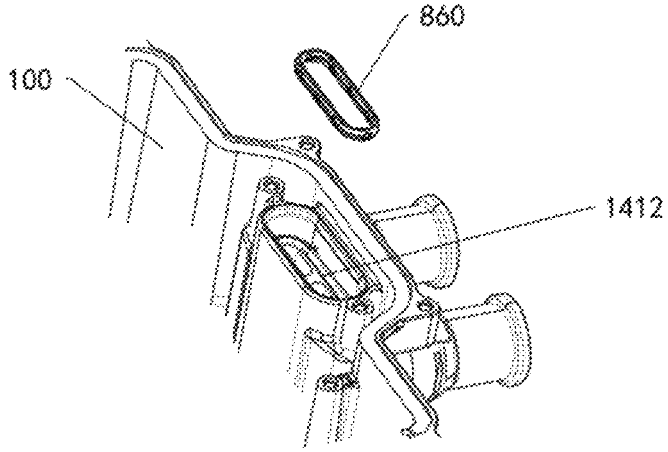
FIG. 78 is a partial enlarged diagram of a vehicle-mounted power supply apparatus according to an implementation.

Refer to FIG. 77 and FIG. 78. FIG. 78 is a partial enlarged diagram of the vehicle-mounted power supply apparatus 10 according to an implementation. In an implementation, the vehicle-mounted power supply apparatus 10 further includes a sealing ring 860. The sealing ring 860 is configured to seal the first transfer channel 1411*a* and the second transfer channel 1411*b* in the height direction X of the vehicle-mounted power supply apparatus 10. A sealing groove 1412 is provided around the first transfer channel 1411*a* and the second transfer channel 1411*b*. The sealing ring 860 is located in the sealing groove 1412. In this solution, the sealing ring 860 is disposed, to prevent coolant from leaking from the first transfer channel 1411*a* and the second transfer channel 1411*b* or even being in direct contact with the power conversion circuit 600, so that effective heat dissipation is performed on a heat generation component without affecting normal operation of the vehicle-mounted power supply apparatus 10.

In an implementation, the radiator interfaces 1410, the bottom cover interfaces 1430, and the bottom cover 100 are an integrally formed structure.

In this implementation, the radiator interfaces 1410 and the bottom cover interfaces 1430 are fastened to the bottom cover 100. When the radiator interfaces 1410 and the bottom cover interfaces 1430 are affected by an external force (for example, an action force of coolant), positions can be kept unchanged, and the radiator interfaces 1410 and the bottom cover interfaces 1430 can stably transmit the coolant to the upper-layer cooling channel 410 and the lower-layer cooling channel 180, so that the coolant is not affected by the external environment.

Figure 79:
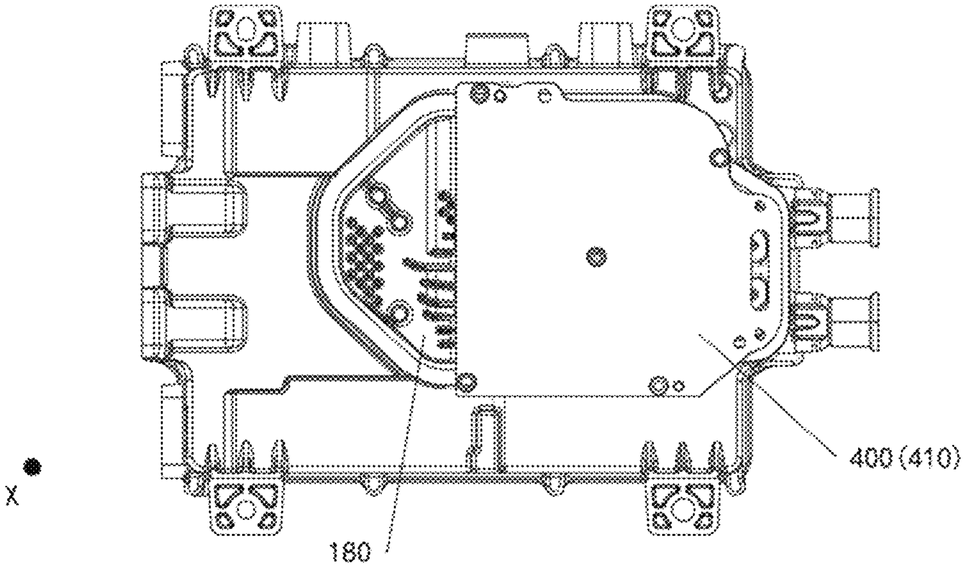
FIG. 79 is a schematic diagram of a partial structure of a vehicle-mounted power supply apparatus according to an implementation.

FIG. 79 is a schematic diagram of a partial structure of the vehicle-mounted power supply apparatus 10 according to an implementation. In an implementation, a projection of the radiator 400 and a projection of the lower-layer cooling channel 180 on the bottom plate 170 along the height direction X of the vehicle-mounted power supply apparatus 10 at least partially overlap.

In this implementation, because the upper-layer cooling channel 410 in the radiator 400 and the lower-layer cooling channel 180 need to be connected through the radiator interfaces 1410, a projection of the upper-layer cooling channel 410 and the projection of the lower-layer cooling channel 180 on the bottom plate 170 along the height direction X are set to at least partially overlap. This enables coolant to flow on a short path when flowing between the upper-layer cooling channel 410 and the lower-layer cooling channel 180, with small flow resistance. In addition, a projection of a part of the power conversion circuit 600 on the bottom plate 170 along the height direction X is located at an overlapping part of the projection of the upper-layer cooling channel 410 and the projection of the lower-layer cooling channel 180, so that the upper-layer cooling channel 410 and the lower-layer cooling channel 180 cool a heat generation component in the part of the power conversion circuit 600 in different directions.

Figure 80:
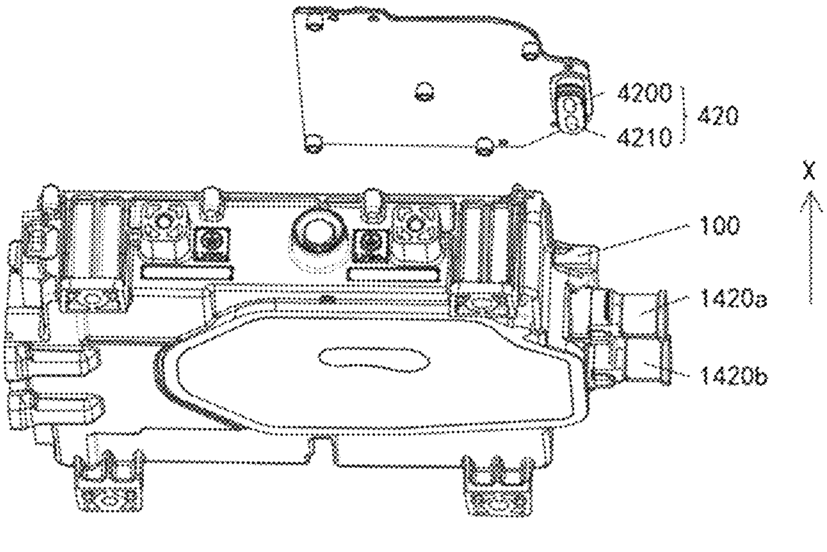
FIG. 80 is a partial exploded view of a vehicle-mounted power supply apparatus according to an implementation.
Figure 81:
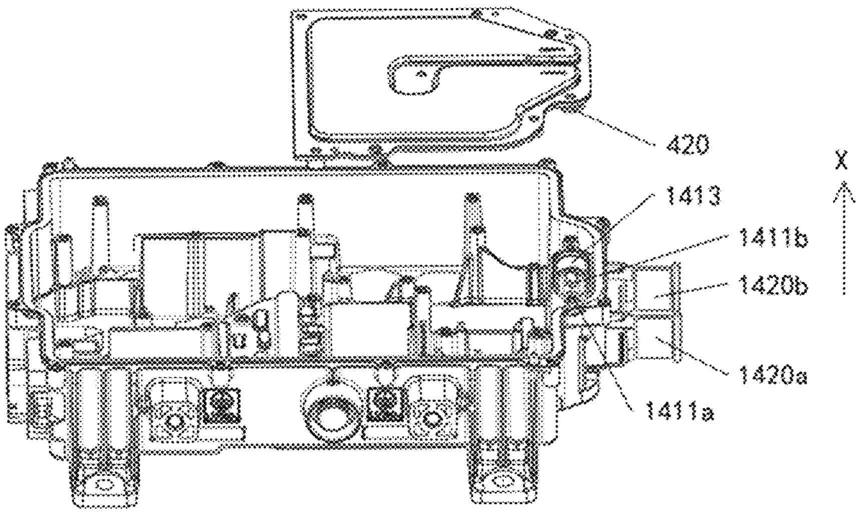
FIG. 81 is a partial exploded view of a vehicle-mounted power supply apparatus according to an implementation.

FIG. 80 is a partial exploded view of the vehicle-mounted power supply apparatus 10 according to an implementation. FIG. 81 is a partial exploded view of the vehicle-mounted power supply apparatus 10 according to an implementation.

In an implementation, a lower surface of the radiator 400 has a radiator connecting portion 420 (as shown in FIG. 80) protruding toward the bottom cover 100, the radiator interfaces 1410 are provided with a connection groove 1413 (as shown in FIG. 81), and the radiator connecting portion 420 is located in the connection groove 1413 and communicates with the radiator interfaces 1410.

In this implementation, the connection groove 1413 is recessed to a side away from the radiator 400 along the height direction X of the vehicle-mounted power supply apparatus 10, the first transfer channel 1411*a* and the second transfer channel 1411*b* are located at the bottom of the connection groove 1413, and the radiator connecting portion 420 is inserted and fastened to the connection groove 1413, so that the first transfer channel 1411*a* and the second transfer channel 1411*b* are connected to the radiator connecting portion 420.

To make an operation of a mechanical connection more convenient, the two external cooling system interfaces 1420*a* and 1420*b* are generally provided in a central region of one side of the vehicle-mounted power supply apparatus 10. In this case, a heat dissipation structure also needs to be disposed in a position close to the two external cooling system interfaces 1420*a* and 1420*b* in the height direction X of the vehicle-mounted power supply apparatus 10, to meet a condition that the heat dissipation structure is connected to the two external cooling system interfaces 1420*a* and 1420*b* in a collaborative manner. Therefore, there is a distance between the heat dissipation structure and the upper-layer cooling channel 410 in the height direction X. In this solution, the radiator connecting portion 420 is disposed in the radiator 400, to compensate for a distance of the first transfer channel 1411*a* and the second transfer channel 1411*b* from the upper-layer cooling channel 410 in the height direction X, and guide coolant entering the radiator interfaces 1410. However, the radiator interfaces 1410 and the bottom cover 100 are integrally formed. The radiator interfaces 1410 directly communicate with the lower-layer cooling channel 180. When the coolant enters the lower-layer cooling channel 180 through the radiator interfaces 1410, an effect of gravity does not need to be overcome. Therefore, no additional connection portion is disposed for the lower-layer cooling channel 180.

In an implementation, the radiator connecting portion 420 includes a first communication hole 4200 and a second communication hole 4210 (as shown in FIG. 80) that are spaced along the left-right direction Z of the vehicle-mounted power supply apparatus 10. The first communication hole 4200 is disposed correspondingly with the first transfer channel 1411*a* along the height direction X of the vehicle-mounted power supply apparatus 10, and the second communication hole 4210 is disposed correspondingly with the second transfer channel 1411*b* along the height direction X of the vehicle-mounted power supply apparatus 10. The first transfer channel 1411*a* communicates with the upper-layer cooling channel 410 through the first communication hole 4200, and the second transfer channel 1411*b* communicates with the upper-layer cooling channel 410 through the second communication hole 4210.

Figure 82:
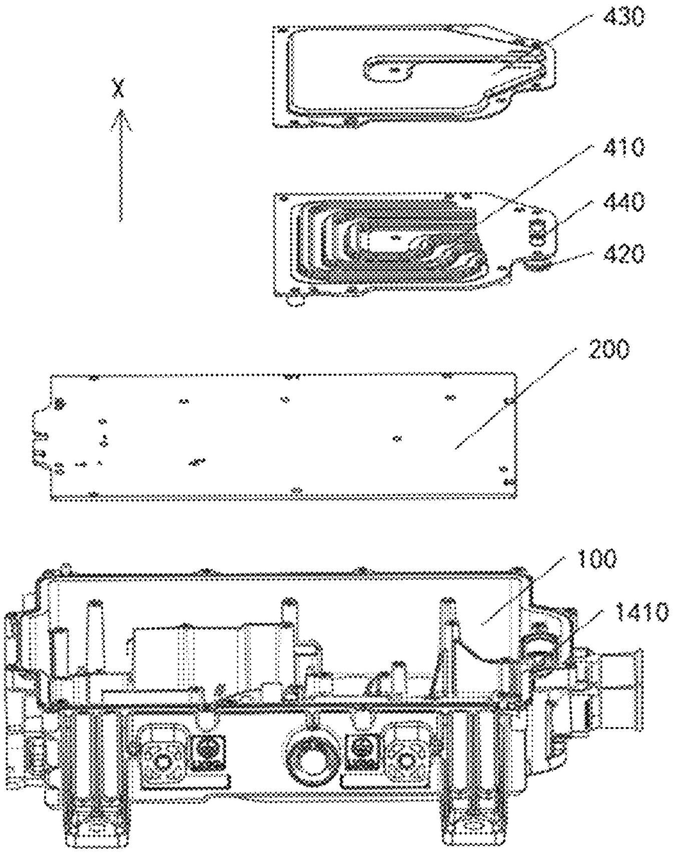
FIG. 82 is a partial exploded view of a vehicle-mounted power supply apparatus according to an implementation.

FIG. 82 is a partial exploded view of the vehicle-mounted power supply apparatus 10 according to an implementation. In a possible implementation, the radiator 400 includes two stacked sheet metal parts and two sealing interfaces 440 located at a same side with the sheet metal parts, edges of the two sheet metal parts are sealed through brazing with filler metal and form the upper-layer cooling channel 410, and the upper-layer cooling channel 410 communicates with the two radiator interfaces 1410 through the two sealing interfaces 440. A thickness of the sheet metal part is less than a thickness of the bottom cover.

In this implementation, the radiator 400 is made of sheet metal. The two sheet metal parts in the radiator 400 are a channel cover plate 430 of the upper-layer cooling channel 410 and an upper-layer cooling channel body 4100 respectively. The channel cover plate 430 is located on a side that is of the upper-layer cooling channel 410 and that is away from the upper-layer PCB board 200 along the height direction X of the vehicle-mounted power supply apparatus 10. The channel cover plate 430 is provided on an outer side of the upper-layer cooling channel 410. An orthographic projection of the channel cover plate 430 on the upper-layer PCB board 200 covers an orthographic projection of the upper-layer cooling channel 410 on the upper-layer PCB board 200. The channel cover plate 430 is configured to prevent coolant from leaking from the upper-layer cooling channel 410. The channel cover plate 430 is fixedly connected to the bottom cover 100 through the upper-layer PCB board 200, for example, by using a screw. The upper-layer cooling channel 410 is fastened to the bottom cover 100, so that the upper-layer cooling channel 410 is not affected by an external force (for example, an action force of coolant), and remains immobile.

In this implementation, the sealing interfaces 440 are disposed opposite to the radiator connecting portion 420 in the height direction X, and the sealing interfaces 440 communicate with the radiator interfaces 1410 through the radiator connecting portion 420.

The thickness of the sheet metal part is less than the thickness of the bottom cover 100, so that the radiator 400 is lighter. In addition, a heat conduction effect is better, for example, heat of the power switching transistor under the radiator 400 can be transferred and absorbed, thereby improving a heat dissipation effect of the vehicle-mounted power supply apparatus.

Still refer to FIG. 15. In an implementation, the bottom cover 100 includes a plurality of protrusions 110. The plurality of protrusions 110 are configured to support at least one of the upper-layer PCB board 200, the lower-layer PCB board 300, or the radiator 400.

In this implementation, the upper-layer PCB board 200, the lower-layer PCB board 300, and the radiator 400 are all spaced with the bottom plate 170 of the bottom cover 100. Therefore, if at least one of the upper-layer PCB board 200, the lower-layer PCB board 300, and the radiator 400 is to be fixedly connected to the bottom cover 100, a plurality of protrusions 110 need to be disposed on the bottom plate 170, to compensate for a distance in the height direction X. The plurality of protrusions 110 support at least one of the upper-layer PCB board 200, the lower-layer PCB board 300, and the radiator 400. The upper-layer PCB board 200 and the lower-layer PCB board 300 are fastened to the bottom cover 100, so that the power conversion circuit 600 mounted on the upper-layer PCB board 200 and the lower-layer PCB board 300 is also relatively fastened to the bottom cover 100. This helps enhance anti-interference performance of the vehicle-mounted power supply apparatus for an external force.

In an implementation, the plurality of protrusions 110 are configured to support each of the upper-layer PCB board 200, the lower-layer PCB board 300, or the radiator 400.

Figure 83:
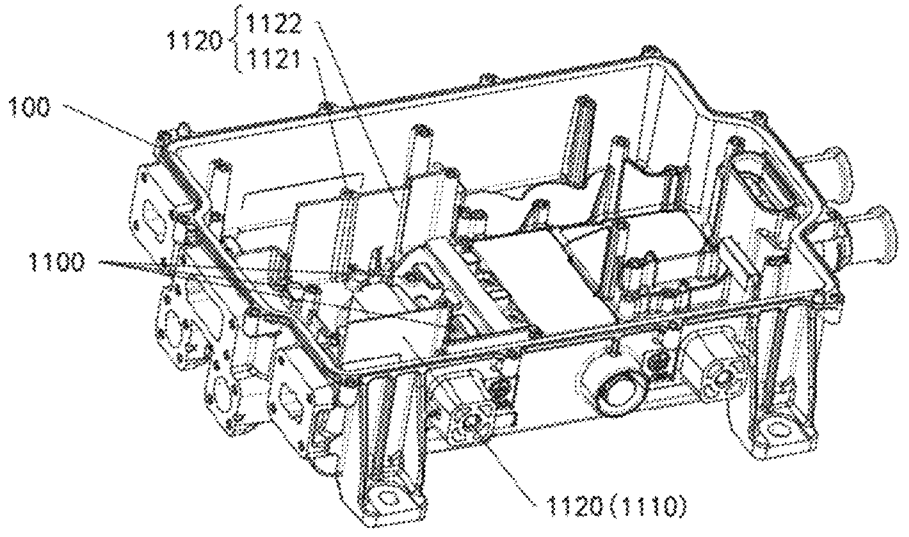
FIG. 83 is a schematic diagram of a structure of a bottom cover of a vehicle-mounted power supply apparatus according to an implementation.

FIG. 83 is a schematic diagram of a structure of the bottom cover 100 of the vehicle-mounted power supply apparatus 10 according to an implementation. In an implementation, the plurality of protrusions 110 of the bottom cover 100 include first protrusions 1100 and second protrusions 1110. The first protrusions 1100 are configured to fasten the lower-layer PCB board 300. The second protrusions 1110 are configured to fasten the upper-layer PCB board 200 and the radiator 400. A height of the second protrusions 1110 is greater than a height of the first protrusions 1100 along the height direction X of the vehicle-mounted power supply apparatus 10.

In this implementation, a part of the power conversion circuit 600 is disposed on both the upper-layer PCB board 200 and the lower-layer PCB board 300, and the upper-layer PCB board 200 and the lower-layer PCB board 300 are respectively fastened to the bottom cover 100 through the second protrusions 1110 and the first protrusions 1100, so that the power conversion circuit 600 on the upper-layer PCB board 200 and the lower-layer PCB board 300 is also relatively fastened to the bottom cover 100. When the vehicle-mounted power supply apparatus 10 is affected by an external environment, a position of the power conversion circuit 600 can be kept unchanged, so that the power conversion circuit 600 can stably performs a power conversion function.

In this implementation, a part of the power conversion circuit 600 mounted on the upper-layer PCB board 200 needs to occupy a volume in the height direction X of the vehicle-mounted power supply apparatus 10, and the upper-layer PCB board 200 is fastened to the bottom plate 170 through the second protrusions 1110. Therefore, setting the height of the second protrusions 1110 being greater than the height of the first protrusions 1100 means that a distance between the upper-layer PCB board 200 and the bottom plate 170 is greater than a distance between the lower-layer PCB board 300 and the bottom plate 170 in the height direction X, which provides mounting space for a component with a large volume in the power conversion circuit 600.

In this implementation, a magnitude relationship between the height of the first protrusions 1100 and the height of the second protrusions 1110 further enables the upper-layer PCB board 200 to be disposed close to the upper-layer cooling channel 410 of the radiator 400, the lower-layer PCB board 300 to be disposed close to the lower-layer cooling channel 180 in the bottom cover 100, and the upper-layer cooling channel 410 and the lower-layer cooling channel 180 form a three-dimensional channel, which can dissipate heat for components located in different positions of the vehicle-mounted power supply apparatus 10, and improve cooling efficiency of the coolant.

Refer to FIG. 5. In this implementation, along the height direction X of the vehicle-mounted power supply apparatus 10, the upper-layer PCB board 200, the lower-layer PCB board 300, and the bottom cover 100 are sequentially arranged. Therefore, a distance between the upper-layer PCB board 200 and an inner surface of the bottom cover 100 is greater than a distance between the lower-layer PCB board 300 and the inner surface of the bottom cover 100. The second protrusions 1110 and the first protrusions 1100 are respectively configured to connect to the upper-layer PCB board 200 and the lower-layer PCB board 300. Therefore, the height of the second protrusions 1110 needs to be set to be greater than the height of the first protrusions 1100, to make operation of fastening the upper-layer PCB board 200 to the bottom cover 100 less difficult. The difference between the second protrusions 1110 and the first protrusions 1100 in height also helps to distinguish between the second protrusions 1110 and the first protrusions 1100 from appearances, so that during actual operation, the upper-layer PCB board 200 and the lower-layer PCB board 300 may be fixedly connected to the bottom cover 100 quickly.

Refer to FIG. 83. In an implementation, the plurality of protrusions 110 include a plurality of shielding protrusions 1120. The upper-layer PCB board 200 and the radiator 400 are sequentially stacked and fastened to the plurality of shielding protrusions 1120. Two shielding protrusions 1120 jointly form one shielding region, or one shielding protrusion and one side wall jointly form another shielding region, and an orthographic projection of the upper-layer PCB board 200 covers the one shielding region and the another shielding region.

In this implementation, the upper-layer PCB board 200 and the radiator 400 are fastened on the bottom cover through the shielding protrusions 1120. When the vehicle-mounted power supply apparatus 10 is subject to an action force exerted by the external environment, relative displacement is not likely to occur between the radiator 400 and the bottom cover 100. This helps improve stability of an overall structure of the vehicle-mounted power supply apparatus 10.

In this implementation, the orthographic projection of the upper-layer PCB board 200 along the height direction X of the vehicle-mounted power supply apparatus 10 covers the plurality of shielding regions, so that a part of the power conversion circuit 600 fastened on the upper-layer PCB board 200 can extend to the shielding region, thereby improving an electrical shielding effect.

Still refer to FIG. 83. In an implementation, at least one shielding protrusion 1120 in the plurality of protrusions 110 includes a fastening post 1122 and a shielding wall 1121 that are connected. The fastening post 1122 is configured to fasten at least one of the upper-layer PCB board 200 and the radiator 400. The shielding wall 1121 is arranged along the left-right direction Z or the front-rear direction Y of the vehicle-mounted power supply apparatus 10.

In this implementation, the shielding protrusion 1120 belongs to the second protrusions 1110. Therefore, in the height direction X of the vehicle-mounted power supply apparatus 10, in one aspect, a height of the fastening post 1122 of the shielding protrusion 1120 is greater than the height of the first protrusions 1100, so that the upper-layer PCB board 200 and the radiator 400 fastened to the fastening post 1122 are also higher than the lower-layer PCB fastened to the first protrusions 1100. This provides sufficient mounting space for the power conversion circuit 600. In another aspect, a height of the shielding wall 1121 of the shielding protrusion 1120 is greater than the height of the first protrusions 1100, so that components located on different sides of the shielding wall 1121 are shielded and isolated by the shielding wall 1121. The shielding wall 1121 extends along the left-right direction Z or the front-rear direction Y in the vehicle-mounted power supply apparatus 10, so that the shielding wall 1121 not only provides a shielding effect, but also divides the bottom cover 100 into a plurality of shielding regions.

Still refer to FIG. 13. In an implementation, at least one shielding protrusion 1120 is configured to sequentially fasten the upper-layer PCB board 200 and the radiator 400, the radiator 400 and the upper-layer PCB board 200 are sequentially stacked on the at least one shielding protrusion 1120, and a gap between the at least one shielding protrusion 1120 and the upper-layer PCB board 200 is filled with a conductive adhesive.

In this implementation, the shielding protrusion 1120 implements functions of both electrical shielding and supporting and fastening. The radiator 400, the upper-layer PCB board, and the bottom cover 100 are fastened by using screws, and the screws sequentially pass through the radiator 400, the upper-layer PCB board 200, and the fastening post 1122 of the shielding protrusion 1120 along the height direction X.

Figure 84:
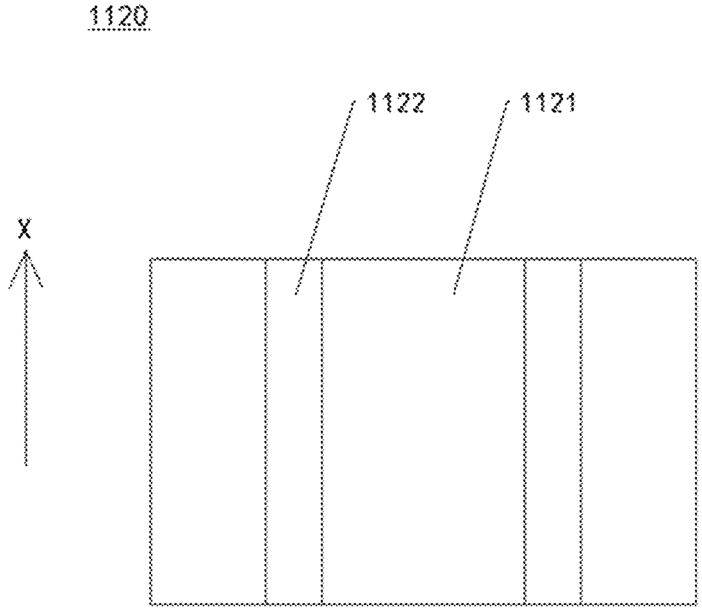
FIG. 84 is a schematic diagram of a structure of a shielding protrusion according to an implementation.

FIG. 84 is a schematic diagram of a structure of the shielding protrusion 1120 according to an implementation. In this implementation, when a height of the fastening post 1122 is equal to a height of the shielding wall 1121 in the height direction X of the vehicle-mounted power supply apparatus 10, the upper-layer PCB board 200 is in direct contact with the shielding wall 1121. In this case, a contact area of the upper-layer PCB board 200 and the second protrusions 1110 is large, so that the upper-layer PCB board 200 is more fixedly connected to the bottom cover 100 through the second protrusions 1110.

Figure 85:
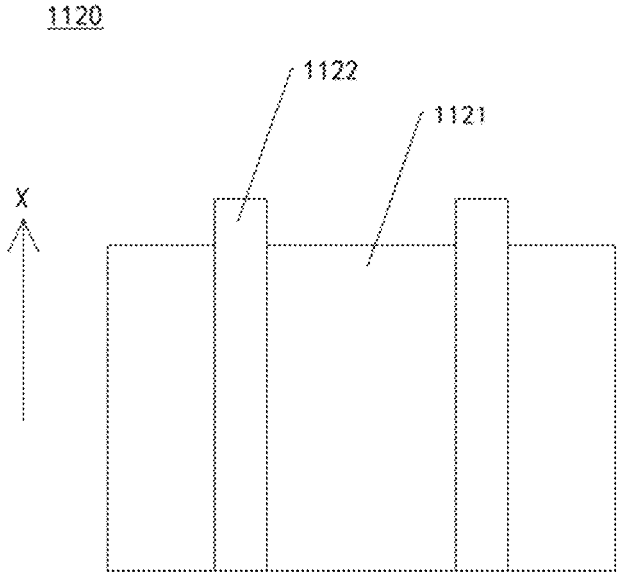
FIG. 85 is a schematic diagram of a structure of a shielding protrusion according to an implementation.

It should be noted that, due to factors such as an assembly tolerance, a design tolerance, and structural flatness, in this implementation, the height of the fastening post 1122 and the height of the shielding wall 1121 in the height direction X of the vehicle-mounted power supply apparatus 10 are highly likely to be unequal. Persons skilled in the art should know that such a deviation is inevitable and acceptable. FIG. 85 is a schematic diagram of a structure of the shielding protrusion 1120 according to an implementation. In this implementation, when a height of the fastening post 1122 in the height direction X of the vehicle-mounted power supply apparatus 10 is greater than a height of the shielding wall 1121 in the height direction X of the vehicle-mounted power supply apparatus 10, the upper-layer PCB board 200 is in contact with only the fastening post 1122, and there is a gap between the shielding wall 1121 and the upper-layer PCB board 200. In this case, the gap may be filled with a conductive adhesive, to compensate for a height distance between the fastening post 1122 and the shielding wall 1121, so that the upper-layer PCB board 200 is more stably connected to the second protrusions 1110. In addition, because the conductive adhesive is electrically conductive, a conductive path is formed between the upper-layer PCB board 200 and the shielding wall 1121, which can improve a shielding effect of the shielding wall 1121 on the power conversion circuit 600.

Figure 86:
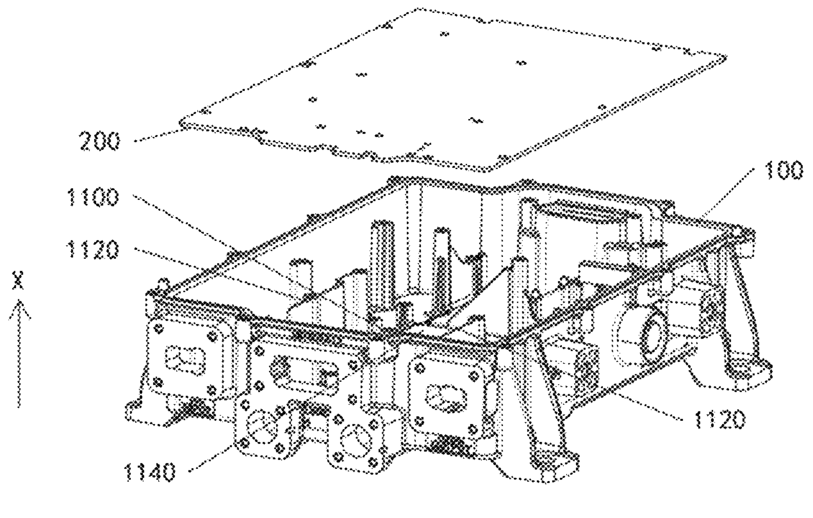
FIG. 86 is a schematic diagram of a structure of a bottom cover and an upper-layer PCB board according to an implementation.

Refer to FIG. 83 and FIG. 86, FIG. 86 is a schematic diagram of a structure of the bottom cover 100 and the upper-layer PCB board 200 according to an implementation. In an implementation, the bottom cover 100 includes the plurality of first protrusions 1100 and two shielding protrusions 1120 (as shown in FIG. 83). The plurality of first protrusions 1100 are distributed in a region of the bottom cover 100 between the two shielding protrusions 1120 (as shown in FIG. 83). The height of the plurality of first protrusions 1100 along the height direction X of the vehicle-mounted power supply apparatus 10 is less than a height of the two shielding protrusions 1120 (as shown in FIG. 83 and FIG. 86). The plurality of first protrusions 1100 are configured to fasten the lower-layer PCB board 300. The two shielding protrusions 1120 are configured to fasten the upper-layer PCB board 200. The two shielding protrusions 1120 and the upper-layer PCB board 200 form a lower-layer PCB board shielding region 1140. The lower-layer PCB board shielding region 1140 is configured to reduce electrical interference to the lower-layer PCB board 300 (as shown in FIG. 83).

In this implementation, the lower-layer PCB board 300 is located in the lower-layer PCB board shielding region 1140 between the two shielding protrusions 1120. The lower-layer PCB board 300 with a lower height is fastened to the bottom cover 100 through the first protrusions 1100 with a lower height. The upper-layer PCB board 200 with a greater height is fastened to the bottom cover 100 through the shielding protrusions 1120 with a greater height. In this way, the upper-layer PCB board 200 and the lower-layer PCB board 300 can be sequentially fastened to the bottom cover 100. This can improve overall structural strength of the vehicle-mounted power supply apparatus 10 and reduce a volume. In addition, the shielding protrusions 1120 can further reuse the upper-layer PCB board to form the lower-layer PCB board shielding region 1140. This helps ensure a shielding effect of the shielding protrusions 1120 on the lower-layer PCB board 300, so that electrical interference between the lower-layer PCB board 300 and a component located on the other side of the shielding protrusion 1120 is small. In this implementation, the shielding protrusions 1120 can implement functions of supporting, fastening, and shielding.

Figure 87:
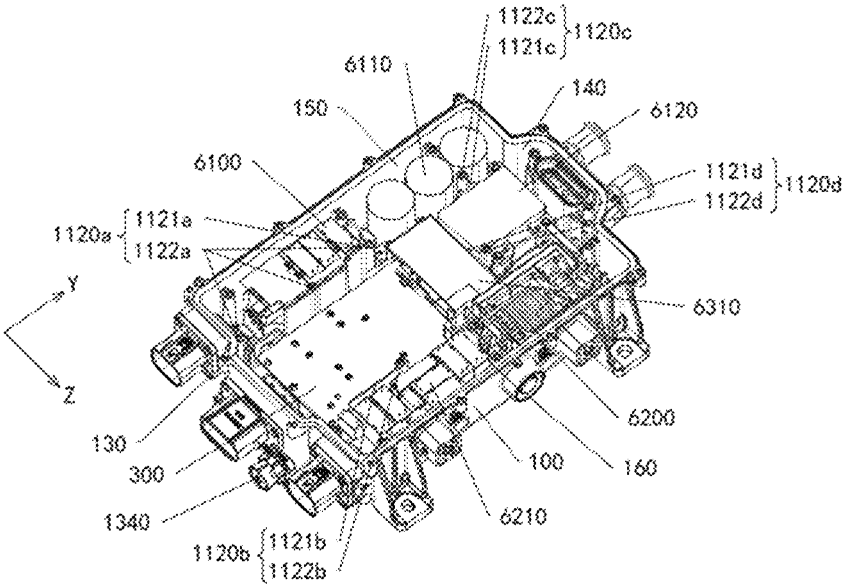
FIG. 87 is a schematic diagram of a structure of a bottom cover and a power conversion circuit according to an implementation.

FIG. 87 is a schematic diagram of a structure of the bottom cover 100 and the power conversion circuit 600 according to an implementation. In an implementation, the power conversion circuit 600 includes the AC filter 6100 and the HVDC filter 6210. One shielding protrusion in the two shielding protrusions 1120 is configured to reduce electrical interference of the AC filter 6100 in the power conversion circuit 600 to the lower-layer PCB board 300. The other shielding protrusion 1120 in the two shielding protrusions 1120 is configured to reduce electrical interference of the HVDC filter 6210 in the power conversion circuit 600 to the lower-layer PCB board 300.

In this implementation, the two shielding protrusions 1120 are respectively denoted as a first shielding protrusion 1120*a* and a second shielding protrusion 1120*b*. The first shielding protrusion 1120*a*, the lower-layer PCB board 300, and the second shielding protrusion 1120*b* are arranged in the left-right direction Z of the vehicle-mounted power supply apparatus 10. The lower-layer PCB board 300 is located between the first shielding protrusion 1120*a* and the second shielding protrusion 1120*b*. The AC filter 6100 is located between the left side wall 150 and the first shielding protrusion 1120*a*. The HVDC filter is located between the right side wall 160 and the second shielding protrusion 1120*b*. A part of the power conversion circuit 600 is mounted on the lower-layer PCB board 300 and electrically connected to the lower-layer PCB board 300. Therefore, along the left-right direction Z of the vehicle-mounted power supply apparatus 10, the first shielding protrusion 1120*a* can perform electrical shielding on the AC filter 6100 and the lower-layer PCB board 300 located on both sides, the second shielding protrusion 1120*b* can perform electrical shielding on the HVDC filters 6210 and the lower-layer PCB board 300 located on the two sides. The lower-layer PCB board 300 is shielded by both the first shielding protrusion 1120*a* and the second shielding protrusion 1120*b*.

Still refer to FIG. 87. In an implementation, the bottom cover 100 includes at least one of the first shielding protrusion 1120*a*, the second shielding protrusion 1120*b*, a third shielding protrusion 1120*c*, and a fourth shielding protrusion 1120*d*. The first shielding protrusion 1120*a* is configured to reduce electrical interference between the AC filter 6100 and the lower-layer PCB board 300. The second shielding protrusion 1120*b* is configured to reduce electrical interference between the HVDC filter 6210 and the lower-layer PCB board 300. The third shielding protrusion 1120*c* is configured to reduce electrical interference between the PFC capacitor 6110 and the PFC inductor 6120 and electrical interference between the PFC capacitor 6110 and the low-voltage transformer 6310. The fourth shielding protrusion 1120*d* is configured to reduce electrical interference between the PFC inductor 6120 and the low-voltage transformer 6310.

Refer to FIG. 87. In an implementation, the power conversion circuit 600 includes the AC filter 6100, the bottom cover 100 includes the first shielding protrusion 1120*a*, and the first shielding protrusion 1120*a* includes a first fastening post 1122*a* and a first shielding wall 1121*a* that are connected. The first fastening post 1122*a* is configured to fasten the upper-layer PCB board 200 and the AC filtering shielding can 830. The first shielding wall 1121*a* is arranged along the front-rear direction Y of the vehicle-mounted power supply apparatus 10. The first shielding wall 1121*a*, the left side wall 150 of the bottom cover 100, and the AC filtering shielding can 830 form an AC filter shielding region 1141. The AC filter shielding region 1141 is configured to accommodate the AC filter 6100 in the power conversion circuit 600.

In this implementation, the AC filter 6100 is configured to receive an alternating current of an external power source and filter out a harmonic in the alternating current, and the AC filter shielding region 1141 is configured to reduce electrical interference between the AC filter 6100 and an electrical component outside the AC filter shielding region 1141. In an implementation, considering factors such as a design tolerance, an assembly tolerance, and a requirement of mounting space, the AC filter shielding region 1141 may not be a completely closed region.

In this implementation, the first shielding wall 1121*a* and the left side wall 150 are spaced, a part of the first shielding protrusion 1120*a* extends along the front-rear direction Y of the vehicle-mounted power supply apparatus 10, and a part of the first shielding protrusion 1120*a* extends along the left-right direction Z of the vehicle-mounted power supply apparatus 10. The first shielding wall 1121*a* extending along the front-rear direction Y electrically shields the AC filter 6100 from a component located on the other side of the first shielding wall 1121*a* in the left-right direction Z. The first shielding wall 1121*a* extending along the left-right direction Z electrically shields the AC filter 6100 from a component located on the other side of the first shielding wall 1121*a* in the front-rear direction Y.

In this implementation, the AC filter 6100 is disposed opposite to an AC filter 6100 shielding region in the height direction X of the vehicle-mounted power supply apparatus 10, so that the bottom cover 100 accommodates the AC filter 6100. The AC filter 6100 shielding region is formed by six sides. In some other implementations, the AC filter 6100 shielding region may be formed by five sides, provided that an electrical shielding effect is not affected.

Still refer to FIG. 87. In an implementation, the power conversion circuit 600 includes the HVDC filter 6210, the bottom cover 100 includes the second shielding protrusion 1120*b*, and the second shielding protrusion 1120*b* includes a second fastening post 1122*b* and a second shielding wall 1121*b* that are connected. The second fastening post 1122*b* is configured to fasten the upper-layer PCB board 200 and the HVDC filtering shielding can 840. The second shielding wall 1121*b* is arranged along the front-rear direction Y of the vehicle-mounted power supply apparatus 10. The second shielding wall 1121*b*, the right side wall 160 of the bottom cover 100, and the HVDC filtering shielding can 840 form an HVDC filter shielding region 1142. The HVDC filter shielding region 1142 is configured to accommodate the HVDC filter 6210 in the power conversion circuit 600.

In this implementation, the HVDC filter 6210 is configured to filter out a harmonic of a second alternating current, and the HVDC filter shielding region 1142 is configured to reduce electrical interference between the HVDC filter 6210 and an electrical component outside the HVDC filter shielding region 1142. In an implementation, considering factors such as a design tolerance, an assembly tolerance, and a requirement of mounting space, the HVDC filter shielding region 1142 may not be a completely closed region.

In this implementation, the second shielding wall 1121*b* and the right side wall 160 are spaced, a part of the second shielding protrusion 1120*b* extends along the front-rear direction Y of the vehicle-mounted power supply apparatus 10, and a part of the second shielding protrusion 1120*b* extends along the left-right direction Z of the vehicle-mounted power supply apparatus 10. The second shielding wall 1121*b* extending along the front-rear direction Y electrically shields the HVDC filter 6210 from a component located on the other side of the second shielding wall 1121*b* in the left-right direction Z. The second shielding wall 1121*b* extending along the left-right direction Z electrically shields the HVDC filter 6210 from a component located on the other side of the second shielding wall 1121*b* in the front-rear direction Y.

In this implementation, the HVDC filter 6210 is disposed opposite to the HVDC filter shielding region 1142 in the height direction X of the vehicle-mounted power supply apparatus 10, so that the bottom cover 100 accommodates the HVDC filter 6210. The shielding region 1142 of the HVDC filter is formed by six sides. In some other implementations, the HVDC filter 6210 shielding region may be formed by five sides, provided that an electrical shielding effect is not affected.

Still refer to FIG. 87. In an implementation, the power conversion circuit 600 includes an alternating current/direct current conversion circuit 610. The alternating current/direct current conversion circuit 610 includes the PFC capacitor 6110 and the PFC inductor 6120. The bottom cover 100 includes the third shielding protrusion 1120*c*. The third shielding protrusion 1120*c* includes a third fastening post 1122*c* and a third shielding wall 1121*c* that are connected. The third fastening post 1122*c* is configured to fasten the upper-layer PCB board 200 and the radiator 400. The third shielding wall 1121*c* is arranged along the front-rear direction Y of the vehicle-mounted power supply apparatus 10 and is arranged side by side with the left side wall 150 of the bottom cover 100. The third shielding wall 1121*c* is configured to form a PFC capacitor shielding region 1143 with the left side wall 150 of the bottom cover 100, the rear side wall 140 of the bottom cover 100, and the upper-layer PCB board 200. The PFC capacitor shielding region 1143 is configured to accommodate the PFC capacitor 6110 in the alternating current/direct current conversion circuit 610. The third shielding wall 1121*c* is configured to reduce electrical interference between the PFC capacitor 6110 and the PFC inductor 6120 in the alternating current/direct current conversion circuit 610.

In this implementation, the alternating current/direct current conversion circuit 610 is configured to convert an alternating current into a direct current. The PFC capacitor 6110 and the PFC inductor 6120 are arranged along the left-right direction Z of the vehicle-mounted power supply apparatus 10. The PFC capacitor shielding region 1143 is configured to reduce electrical interference between the PFC capacitor 6110 and an electrical component outside the PFC capacitor shielding region 1143. In an implementation, considering factors such as a design tolerance, an assembly tolerance, and a requirement of mounting space, the PFC capacitor shielding region 1143 may not be a completely closed region.

In this implementation, the third shielding protrusion 1120*c* is spaced from the left side wall 150. The PFC capacitor 6110 is located between the left side wall 150 and the third shielding wall 1121*c*. The third shielding protrusion 1120*c* electrically isolates the PFC capacitor 6110 and the PFC inductor 6120 that are located on two sides of the third shielding wall 1121*c* in the left-right directions Z.

In an implementation, the third shielding protrusion 1120*c* includes a fastening post and a supporting wall beside the fastening post, where the supporting wall is configured to improve the manufacturability of the fastening post. A shape of the supporting wall is not limited. In this implementation, the shielding wall in the third shielding protrusion 1120*c* is used as a supporting wall for serving as a fastening post.

In an implementation, the shielding wall in the third shielding protrusion 1120*c* may be used to shield electrical interference and may also be used to improve manufacturability of the fastening post.

Refer to FIG. 87. In an implementation, the power conversion circuit 600 includes the low-voltage transformer 6310, the bottom cover 100 includes a fourth shielding protrusion 1120*d*, and the fourth shielding protrusion 1120*d* includes a fourth fastening post 1122*d* and a fourth shielding wall 1121*d* that are connected. The fourth fastening post 1122*d* is configured to fasten the upper-layer PCB board 200 and the radiator 400. The fourth shielding wall 1121*d* is arranged along the left-right direction Z of the vehicle-mounted power supply apparatus 10 and is arranged side by side with a side wall, in the bottom cover 100, on which the cooling channel interface 1400 is provided. The fourth shielding wall 1121*d* is configured to reduce electrical interference between the low-voltage transformer 6310 and the PFC inductor 6120 in the low-voltage direct current conversion circuit 630.

In this implementation, the low-voltage direct current conversion circuit 630 is configured to convert a second direct current into a first direct current. In the front-rear direction Y of the vehicle-mounted power supply apparatus 10, the low-voltage transformer 6310 is located between the lower-layer PCB board 300 and the PFC inductor 6120.

In this implementation, the low-voltage transformer 6310, the fourth shielding protrusion 1120*d*, and the PFC inductor 6120 are arranged along the front-rear direction Y of the vehicle-mounted power supply apparatus 10, and the fourth shielding protrusion 1120*d* can electrically shield the low-voltage transformer 6310 and the PFC inductor 6120 located on two sides of the fourth shielding wall 1121*d* along the front-rear direction Y.

In an implementation, the fourth shielding protrusion 1120*d* includes a fastening post and a supporting wall beside the fastening post, where the supporting wall is configured to improve the manufacturability of the fastening post. A shape of the supporting wall is not limited. In this implementation, the shielding wall in the third shielding protrusion 1120*d* is used as a supporting wall for serving as a fastening post.

In an implementation, the shielding wall in the fourth shielding protrusion 1120*d* may be used to shield electrical interference and may also be used to improve manufacturability of the fastening post.

Figure 88:
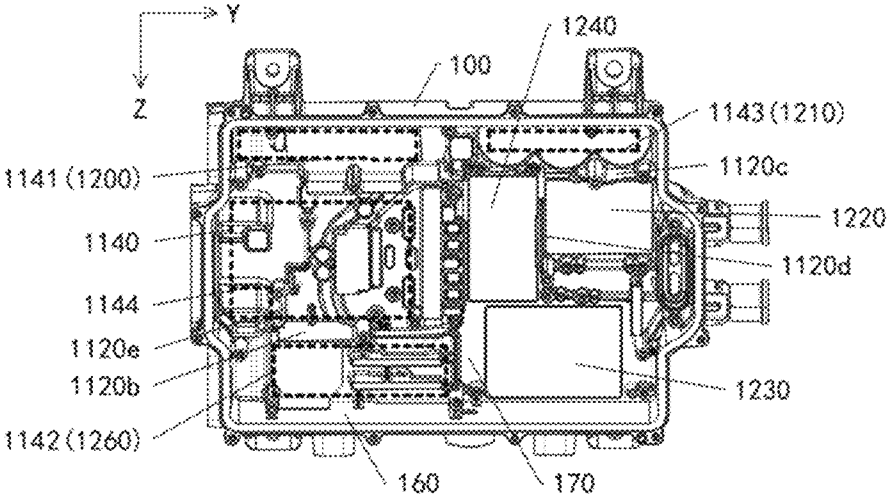
FIG. 88 is a schematic diagram of a structure of a bottom cover of a vehicle-mounted power supply apparatus according to an implementation.

Refer to FIG. 87 and FIG. 88. In an implementation, the bottom cover 100 includes the first shielding protrusion 1120*a*, the second shielding protrusion 1120*b*, the third shielding protrusion 1120*c*, and the fourth shielding protrusion 1120*d* (as shown in FIG. 88). The power conversion circuit 600 includes the AC filter 6100, the HVDC filter 6210, the low-voltage transformer 6310, the PFC capacitor 6110, and the PFC inductor 6120 (as shown in FIG. 87). The first shielding protrusion 1120*a* and the second shielding protrusion 1120*b* are configured to fasten the upper-layer PCB board 200 and form a lower-layer PCB board shielding region 1140 with the upper-layer PCB board 200 (as shown in FIG. 24 and FIG. 87). The lower-layer PCB board shielding region 1140 is configured to accommodate the lower-layer PCB board 300 and reduce electrical interference between the AC filter 6100 and the lower-layer PCB board 300, and between the HVDC filter 6210 and the lower-layer PCB board 300 (as shown in FIG. 87 and FIG. 88).

In this implementation, the AC filter 6100, the HVDC filter 6210, the low-voltage transformer 6310, the PFC capacitor 6110, and the PFC inductor 6120 are disposed around the lower-layer PCB board. When the vehicle-mounted power supply apparatus 10 is in a working state, a part of the power conversion circuit 600 mounted on the lower-layer PCB board interferes with components around. Therefore, setting the lower-layer PCB board shielding region 1140 can reduce electrical interference between the lower-layer PCB board 300 and an electrical component outside the lower-layer PCB board shielding region 1140. The first shielding protrusion 1120*a* is configured to shield the lower-layer PCB board 300 from the AC filter 6100, and the second shielding protrusion 1120*b* is configured to shield the lower-layer PCB board 300 from the HVDC filter 6210. In an implementation, considering factors such as a design tolerance, an assembly tolerance, and a requirement of mounting space, the lower-layer PCB board shielding region 1140 may not be a completely closed region.

Figure 89:
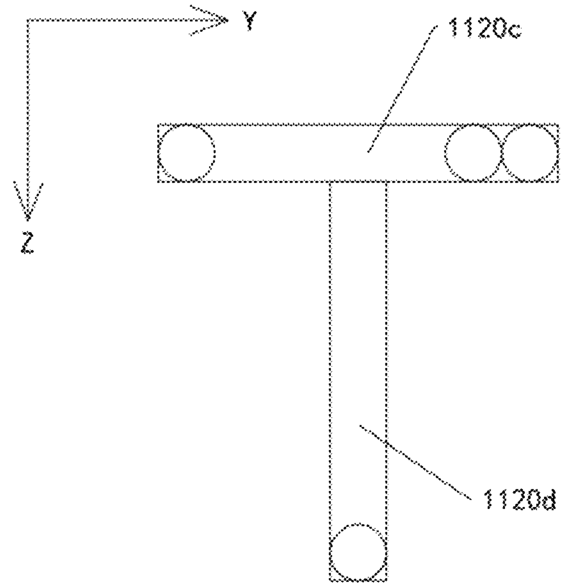
FIG. 89 is a schematic diagram of a structure of a third shielding protrusion and a fourth shielding protrusion according to an implementation.

FIG. 89 is a schematic diagram of a structure of the third shielding protrusion 1120*c* and the fourth shielding protrusion 1120*d* according to an implementation. In an implementation, the third shielding protrusion 1120*c* and the fourth shielding protrusion 1120*d* form a T-shaped shielding structure. The T-shaped shielding structure is used to reduce electrical interference between the low-voltage transformer 6310, the PFC capacitor 6110, and the PFC inductor 6120. In this implementation, in addition to performing electrical shielding on the PFC capacitor 6110 and the PFC inductor 6120, the third shielding protrusion 1120*c* can further reduce electrical interference between the PFC inductor 6120 and the low-voltage transformer 6310, thereby further improving electromagnetic compatibility of the vehicle-mounted power supply apparatus 10.

In an implementation, a front end of the third shielding protrusion 1120*c* is connected to the first shielding protrusion 1120*a*. A rear end of the third shielding protrusion 1120*c* may be connected to the rear side wall 140, to enhance overall structure strength and improve a shielding effect.

In an implementation, a front end of the first shielding protrusion 1120*a* is connected to the front side wall, to enhance overall structure strength and improve a shielding effect.

In an implementation, a left end of the fourth shielding protrusion 1120*d* is connected to the third shielding protrusion 1120*c*, to enhance overall structure strength and improve a shielding effect.

Refer to FIG. 12 and FIG. 88. In an implementation, the bottom cover 100 includes the first shielding protrusion 1120*a*, the second shielding protrusion 1120*b*, and a fifth shielding protrusion 1120*e*. The power conversion circuit 600 includes the first direct current interface 1340 (as shown in FIG. 12). The first direct current interface 1340 is configured to transmit a first direct current output by the power conversion circuit 600. The first shielding protrusion 1120*a* and the second shielding protrusion 1120*b* are arranged along the front-rear direction Y of the vehicle-mounted power supply apparatus 10 (as shown in FIG. 88). The fifth shielding protrusion 1120*e* is arranged along the left-right direction Z of the vehicle-mounted power supply apparatus 10 (as shown in FIG. 88). The first shielding protrusion 1120*a*, the second shielding protrusion 1120*b*, and the fifth shielding protrusion 1120*e* jointly form a first direct current interface shielding region 1144 (as shown in FIG. 88). The first direct current interface shielding region 1144 is configured to accommodate a part of the first direct current interface 1340 (as shown in FIG. 12 and FIG. 88)

In this implementation, the low-voltage direct current conversion circuit 630 supplies power to the first-type load 15 through the first direct current interface 1340. The first direct current interface shielding region 1144 is configured to reduce electrical interference between the first direct current interface 1340 and an electrical component outside the first direct current interface shielding region 1144. In an implementation, considering factors such as a design tolerance, an assembly tolerance, and a requirement of mounting space, the first direct current interface shielding region 1144 may be a region that is not completely closed.

In this implementation, one end of the first direct current interface 1340 extends to the bottom cover 100 and is electrically connected to the lower-layer PCB board 300. Therefore, the first direct current interface shielding region 1144 partially overlaps the lower-layer PCB board shielding region 1140. The fifth shielding protrusion 1120*e* and the front side wall 130 are spaced. The first direct current interface 1340 is located between the first shielding protrusion 1120*a* and the second shielding protrusion 1120*b*. The first shielding protrusion 1120*a* can shield electrical interference between the first direct current interface 1340 and the AC filter 6100. The second shielding protrusion 1120*b* can shield electrical interference between the first direct current interface 1340 and the HVDC filter 6210. The fifth shielding protrusion 1120*e* can shield electrical interference between the first direct current interface 1340 and the lower-layer PCB board 300.

Still refer to FIG. 87. In an implementation, the first shielding protrusion 1120*a* includes three first fastening posts 1122*a* and a first shielding wall 1121*a*. The three first fastening posts 1122*a* are sequentially connected to the first shielding wall 1121*a* along the front-rear direction Y of the vehicle-mounted power supply apparatus 10 and are respectively configured to fasten the signal filtering shielding can 820, the upper-layer PCB board 200, the upper-layer PCB board 300, and the radiator 400.

In this implementation, a direction in which the three first fastening posts 1122*a* are arranged corresponds to a direction in which the signal filtering shielding can 820 and the radiator 400 are arranged. In the three first fastening posts 1122*a*, a first fastening post 1122*a* close to the front side wall 130 is configured to be fastened to the signal filtering shielding can 820, a first fastening post 1122*a* close to the rear side wall 140 is configured to be fastened to the upper-layer PCB board 200 and the radiator 400, and a first fastening post 1122*a* in a middle position is configured to be fastened to the upper-layer PCB board 200. The three first fastening posts 1122*a* of the first shielding protrusion 1120*a* can shield three different components, which shows versatility of the shielding protrusion in the vehicle-mounted power supply apparatus 10.

Refer to FIG. 12. In an implementation, the fifth shielding protrusion 1120*e* includes two fifth fastening posts 1122*e* and a fifth shielding wall 1121*e*. The two fifth fastening posts 1122*e* are sequentially connected to the fifth shielding wall 1121*e* along the left-right direction Z of the vehicle-mounted power supply apparatus 10. The two fifth fastening posts 1122*e* are configured to fasten the lower-layer PCB board 300 and the shielding can 800. A height of the two fifth fastening posts 1122*e* and a height of the fifth shielding wall 1121*e* along the height direction Y of the vehicle-mounted power supply apparatus 10 are less than a height of the first fastening post 1122*a* and a height of the first shielding wall 1121*a* of the first shielding protrusion 1120*a*.

In this implementation, the shielding can 800 is configured to shield the low-voltage filter circuit 6400, the low-voltage filter circuit 6400 is electrically connected to the first direct current interface 1340, and the low-voltage filter circuit 6400 is configured to filter out a harmonic in a first direct current. The shielding can 800 is fixedly connected to the bottom cover through the fifth fastening post 1122*e*, so that the shielding can 800 can stably perform electrical isolation on the low-voltage filter circuit 6400, thereby enhancing an electromagnetic interference shielding effect.

In this implementation, both the low-voltage filter circuit 6400 and the first direct current interface 1340 are electrically connected to the lower-layer PCB board 300, the lower-layer PCB board 300 is located, along the height direction X, on a side that is of the upper-layer PCB board 200 and that is away from the bottom cover 100, and the first shielding protrusion 1120*a* is fastened to the upper-layer PCB board. Therefore, the height of the fifth fastening post 1122*e* and the height of the fifth shielding wall 1121*e* need to be set to be less than the height of the first fastening post 1122*a* and the height of the first shielding wall 1121*a* of the first shielding protrusion 1120*a*, so as to adapt to a height relationship between the upper-layer PCB board 200 and the lower-layer PCB board 300 and optimize an overall layout of the vehicle-mounted power supply apparatus 10.

Figure 90:
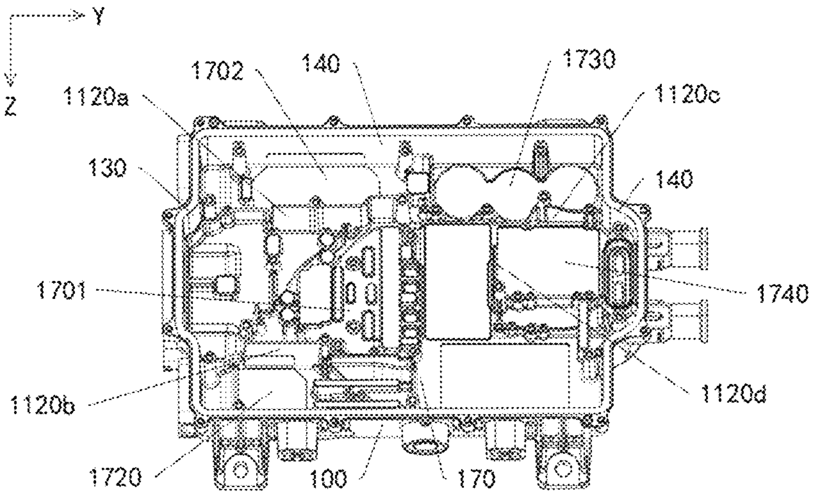
FIG. 90 is a schematic diagram of a structure of a bottom cover of a vehicle-mounted power supply apparatus according to an implementation.

Refer to FIG. 19, FIG. 88, and FIG. 90. FIG. 88 is a schematic diagram of a structure of the bottom cover 100 of the vehicle-mounted power supply apparatus 10 according to an implementation. FIG. 90 is a schematic diagram of a structure of the bottom cover 100 of the vehicle-mounted power supply apparatus 10 according to an implementation. In an implementation, the bottom plate 170 includes the first shielding protrusion 1120*a*, the second shielding protrusion 1120*b*, the third shielding protrusion 1120*c*, and the fourth shielding protrusion 1120*d* (as shown in FIG. 90). The first shielding protrusion 1120*a* and the second shielding protrusion 1120*b* form a lower-layer PCB board mounting region 1701 (as shown in FIG. 90), and the lower-layer PCB board mounting region 1701 is configured to accommodate the lower-layer PCB board 300 (as shown in FIG. 19). The first shielding protrusion 1120*a* and the right side wall 160 form an AC filter mounting region 1702 (as shown in FIG. 90), and the AC filter mounting region 1702 is configured to accommodate the AC filter 6100 (as shown in FIG. 19). The second shielding protrusion 1120*b* and the left side wall 150 form an HVDC filter mounting region 1720 (as shown in FIG. 90), and the HVDC filter mounting region 1720 is configured to accommodate the HVDC filter 6210 (as shown in FIG. 19). The third shielding protrusion 1120*c* and the right side wall 160 form a PFC capacitor mounting region 1730 (as shown in FIG. 90), and the PFC capacitor mounting region 1730 is configured to accommodate the PFC capacitor 6110 (as shown in FIG. 19). The fourth shielding protrusion 1120*d* and the rear side wall 140 form a PFC inductor mounting region 1740 (as shown in FIG. 90), and the PFC inductor mounting region 1740 is configured to accommodate the PFC inductor 6120 (as shown in FIG. 19).

In this implementation, the first shielding protrusion 1120*a*, the second shielding protrusion 1120*b*, the third shielding protrusion 1120*c*, and the fourth shielding protrusion 1120*d* divide the bottom plate 170 into a plurality of mounting regions, including the lower-layer PCB board mounting region 1701, the AC filter mounting region 1702, the HVDC filter mounting region 1720, the PFC capacitor mounting region 1730, and the PFC inductor mounting region 1740. Setting the mounting regions facilitates a mounting operation of the power conversion circuit 600, and protects components inside the mounting regions to some extent.

In this implementation, the first shielding protrusion 1120*a* and the left side wall 150 are spaced, and the first shielding protrusion 1120*a* is located between the AC filter 6100 and the lower-layer PCB board 300 along the left-right direction Z of the vehicle-mounted power supply apparatus 10. The second shielding protrusion 1120*b* and the right side wall 160 are spaced, and the second shielding protrusion 1120*b* is located between the HVDC filter 6210 and the lower-layer PCB board 300 along the left-right direction Z of the vehicle-mounted power supply apparatus 10. The third shielding protrusion 1120*c* and the left side wall 150 are spaced, and the third shielding protrusion 1120*c* is located between the PFC capacitor 6110 and the PFC inductor 6120 along the left-right direction Z of the vehicle-mounted power supply apparatus 10. The fourth shielding protrusion 1120*d* and the rear side wall 140 are spaced, and the fourth shielding protrusion 1120*d* is located between the low-voltage transformer 6310 and the PFC inductor 6120 along the front-rear direction Y of the vehicle-mounted power supply apparatus 10. The first shielding protrusion 1120*a*, the second shielding protrusion 1120*b*, the third shielding protrusion 1120*c*, and the fourth shielding protrusion 1120*d* provide electrical shielding between different components in the power conversion circuit 600, and improve electromagnetic compatibility (Electromagnetic Compatibility, EMC) of the power conversion circuit 600.

In an implementation, the first shielding protrusion 1120*a*, the second shielding protrusion 1120*b*, the third shielding protrusion 1120*c*, and the fourth shielding protrusion 1120*d* are integrally formed with the bottom cover 100, so that the first shielding protrusion 1120*a*, the second shielding protrusion 1120*b*, the third shielding protrusion 1120*c*, and the fourth shielding protrusion 1120*d* can stably perform electrical isolation on components on both sides, thereby enhancing an electromagnetic interference shielding effect.

Still refer to FIG. 88. In an implementation, the bottom cover 100 includes an AC filter limiting groove 1200. The AC filter limiting groove 1200 is configured to accommodate the AC filter 6100. The AC filter limiting groove 1200 is located between the lower-layer PCB board 300 and the left side wall 150, and is disposed closer to the front side wall 130 than the rear side wall 140.

In this implementation, the AC filter limiting groove 1200 is located in the AC filter shielding region 1141, which flexibly uses existing mounting space of the bottom cover 100, without increasing a volume of the vehicle-mounted power supply apparatus 10 additionally.

Still refer to FIG. 88. In an implementation, the bottom cover 100 includes a PFC capacitor limiting groove 1210 and a PFC inductor limiting groove 1220. The PFC capacitor limiting groove 1210 is configured to accommodate the PFC capacitor 6110. The PFC inductor limiting groove 1220 is configured to accommodate the PFC inductor 6120.

In this implementation, the PFC capacitor limiting groove 1210 is located in the PFC capacitor shielding region 1143, which flexibly uses the existing mounting space of the bottom cover 100, without increasing the volume of the vehicle-mounted power supply apparatus 10 additionally.

Still refer to FIG. 88. In an implementation, the bottom cover 100 includes an LLC transformer limiting groove 1230. The LLC transformer limiting groove 1230 is configured to accommodate the LLC transformer 6200. The PFC capacitor limiting groove 1210, the PFC inductor limiting groove 1220, and the LLC transformer limiting groove 1230 are arranged along the left-right direction Z of the vehicle-mounted power supply apparatus 10.

In this implementation, the LLC transformer limiting groove 1230 is rectangular, and the shape matches a shape of an end surface of a side that is of the LLC transformer 6200 and that faces the LLC transformer limiting groove 1230.

Refer to FIG. 88. In an implementation, the bottom cover 100 includes a low-voltage transformer limiting groove 1240. The low-voltage transformer limiting groove 1240 is configured to accommodate the low-voltage transformer 6310.

In this implementation, the low-voltage transformer limiting groove 1240 is located in a region between the PFC capacitor limiting groove 1210 and the LLC transformer limiting groove 1230, and is located in a region between space around the lower-layer PCB board 300 and the PFC inductor limiting groove 1220. This flexibly uses the existing mounting space of the bottom cover 100, without increasing the volume of the vehicle-mounted power supply apparatus 10 additionally.

Still refer to FIG. 88. In an implementation, the bottom cover 100 includes an HVDC filter limiting groove 1260. The HVDC filter limiting groove 1260 is configured to accommodate the HVDC filter 6210.

In this implementation, the HVDC filter limiting groove 1260 is located in the PFC capacitor shielding region 1143, which flexibly uses the existing mounting space of the bottom cover 100, without increasing the volume of the vehicle-mounted power supply apparatus 10 additionally.

Still refer to FIG. 88. In an implementation, the AC filter limiting groove 1200, the PFC capacitor limiting groove 1210, the PFC inductor limiting groove 1220, the LLC transformer limiting groove 1230, the low-voltage transformer limiting groove 1240, and the HVDC filter limiting groove 1260 are disposed around the lower-layer PCB board 300.

In this implementation, the plurality of limiting grooves are provided around the lower-layer PCB board 300. Correspondingly, the AC filter 6100, the PFC capacitor 6110, the PFC inductor 6120, the low-voltage transformer 6310, the LLC transformer 6200, and the HVDC filter 6210 are disposed around the lower-layer PCB board 300. In this case, in the height direction X of the vehicle-mounted power supply apparatus 10, a height of the foregoing components is not limited to a distance between the upper-layer PCB board 200 and the lower-layer PCB board 300. A component with a great height or a large space size may be disposed around the lower-layer PCB board 300. This flexibly uses an internal mounting region of the vehicle-mounted power supply apparatus 10, improves space utilization, and facilitates a miniaturization design of the vehicle-mounted power supply apparatus 10. A shape of the limiting groove may be set based on a shape of a corresponding component.

The vehicle-mounted power supply apparatus and the vehicle provided in the embodiments are described in detail above. The principles and embodiments are described by using specific examples. The description about the foregoing embodiments is merely provided to help understand the method and core ideas of the embodiments. In addition, persons of ordinary skill in the art can make variations and modifications in terms of the embodiments and scopes according to the ideas of the embodiments. Therefore, the content of the embodiments shall not be construed as limiting. In the embodiments, schematic descriptions are not necessarily directed to the same embodiment or example, and the described specific features, structures, materials, or characteristics may be combined in an appropriate manner in any one or more implementations or examples. In addition, in the case of no conflict, persons skilled in the art may combine different embodiments or examples, and features of different embodiments or examples as described.

The invention claimed is:

1. A vehicle-mounted power supply apparatus, comprising:

a power conversion circuit;

an upper-layer printed circuit board (PCB);

a lower-layer PCB;

a bottom cover;

a cover plate; and a radiator, wherein the power conversion circuit comprises a plurality of power switching transistors and a plurality of transformers;

wherein the upper-layer PCB and the lower-layer PCB are configured to bear the plurality of power switching transistors of the power conversion circuit;

wherein the bottom cover comprises a bottom plate, a front side wall, a rear side wall, a left side wall, and a right side wall, the lower-layer PCB and the plurality of transformers are fastened to the bottom plate, and the upper-layer PCB and the radiator are sequentially stacked above the lower-layer PCB and the plurality of transformers; and wherein the radiator comprises an upper-layer cooling channel, the bottom cover comprises a lower-layer cooling channel, and the upper-layer cooling channel communicates with the lower-layer cooling channel in the bottom cover through the rear side wall, and wherein the radiator is accommodated in a gap between the cover plate and the upper-layer PCB, an outlet and an inlet of the upper-layer cooling channel are located at a same side as the radiator, and the outlet and the inlet are respectively configured to connect to respective ones of two radiator interfaces disposed on an upper surface of the rear side wall of the bottom cover.

2. The vehicle-mounted power supply apparatus according to claim 1, wherein an area of an orthographic projection of the radiator on the upper-layer PCB is less than an area of the upper-layer PCB, and the orthographic projection of the radiator covers the plurality of transformers and the plurality of power switching transistors borne on the upper-layer PCB.

3. The vehicle-mounted power supply apparatus according to claim 1, wherein an area of an orthographic projection of the cover plate is greater than an area of the upper-layer PCB.

4. The vehicle-mounted power supply apparatus according to claim 1, wherein the bottom plate comprises a plurality of shielding protrusions, and the upper-layer PCB and the radiator are sequentially stacked and fastened to the plurality of shielding protrusions, wherein two shielding protrusions of the plurality of shielding protrusions jointly form one shielding region, or one shielding protrusion and one side wall jointly form another shielding region, and an orthographic projection of the upper-layer PCB covers the one shielding region and the another shielding region.

5. The vehicle-mounted power supply apparatus according to claim 1, wherein the bottom plate comprises a plurality of first protrusions and a plurality of second protrusions, wherein the plurality of first protrusions are configured to fasten the lower-layer PCB;

the plurality of second protrusions are configured to fasten the upper-layer PCB and the radiator; and a height of the plurality of first protrusions along a height direction of the vehicle-mounted power supply apparatus is less than a height of the plurality of second protrusions, so that the lower-layer PCB is closer to the lower-layer cooling channel than the upper-layer PCB, and the upper-layer PCB is closer to the upper-layer cooling channel than the lower-layer PCB.

6. The vehicle-mounted power supply apparatus according to claim 1, wherein the power conversion circuit comprises a power factor correction (PFC) inductor, a PFC capacitor, and two transformers;

the lower-layer cooling channel and the bottom cover are formed as an integral assembly; and the PFC inductor, the PFC capacitor, and the two transformers are in contact with the bottom of the bottom cover through a heat-conductive material, and are arranged above the lower-layer cooling channel and below the upper-layer PCB in a flat manner.

7. The vehicle-mounted power supply apparatus according to claim 1, wherein the front side wall and the rear side wall are disposed opposite to each other, the left side wall and the right side wall are disposed opposite to each other, the rear side wall comprises a cooling channel interface, and the cooling channel interface is configured to connect an external cooling system to the lower-layer cooling channel and the upper-layer cooling channel, so that the external cooling system exchanges a cooling medium with the lower-layer cooling channel and the upper-layer cooling channel through the cooling channel interface.

8. The vehicle-mounted power supply apparatus according to claim 7, wherein the front side wall comprises a power interface, two first direct current interfaces, and one second direct current interface, the power interface and the second direct current interface are electrically connected to the upper-layer PCB-board, and the two first direct current interfaces are electrically connected to the lower-layer PCB-board.

9. The vehicle-mounted power supply apparatus according to claim 7, wherein the cooling channel interface comprises:

two external cooling system interfaces, the two external cooling system interfaces disposed on a side surface that is of the rear side wall and that is away from the upper-layer PCB, and the two external cooling system interfaces are respectively configured to connect to an outlet and an inlet of the external cooling system; and two bottom cover interfaces, the two bottom cover interfaces respectively configured to connect to an outlet and an inlet of the lower-layer cooling channel.

10. The vehicle-mounted power supply apparatus according to claim 1, wherein the radiator comprises two stacked sheet metal parts and two sealing interfaces, edges of the two sheet metal parts are sealed through brazing with filler metal and form the upper-layer cooling channel, and the upper-layer cooling channel communicates with the two radiator interfaces through the two sealing interfaces; and a thickness of the two stacked sheet metal part-parts is less than a thickness of the bottom cover.

11. The vehicle-mounted power supply apparatus according to claim 9, wherein a lower surface of the radiator has a radiator connecting portion protruding toward the bottom cover, the two radiator interfaces are respectively provided with a connection grooves, and the radiator connecting portion is located in one of the connection grooves and communicates with the corresponding one of the two radiator interfaces.

12. The vehicle-mounted power supply apparatus according to claim 1, wherein the bottom plate comprises a bottom plate body and a sealing plate located on an outer side of the bottom plate body, the outer side of the bottom plate body is provided with a lower-layer cooling channel body, and the sealing plate and the lower-layer cooling channel body are connected in a sealed manner and jointly form the lower-layer cooling channel.

13. The vehicle-mounted power supply apparatus according to claim 12, wherein at least one group of spoiler teeth and at least one group of spoiler plates are disposed in the lower-layer cooling channel body, each group of spoiler teeth has a plurality of spaced spoiler teeth, and each group of spoiler plates has a plurality of spaced spoiler plates disposed side by side.

14. A vehicle, comprising:

a first-type load, a battery, and a vehicle-mounted power supply apparatus, comprising:

a power conversion circuit, an upper-layer printed circuit board (PCB);

a lower-layer PCB;

a bottom cover;

a cover plate; and a radiator, wherein the power conversion circuit comprises a plurality of power switching transistors and a plurality of transformers, wherein the upper-layer PCB and the lower-layer PCB are configured to bear the plurality of power switching transistors of the power conversion circuit;

wherein the bottom cover comprises a bottom plate, a front side wall, a rear side wall, a left side wall, and a right side wall, the lower-layer PCB and the plurality of transformers are fastened to the bottom plate, and the upper-layer PCB and the radiator are sequentially stacked above the lower-layer PCB and the plurality of transformers; and wherein the radiator comprises an upper-layer cooling channel, the bottom cover comprises a lower-layer cooling channel, and the upper-layer cooling channel communicates with the lower-layer cooling channel in the bottom cover through the rear side wall, and wherein the radiator is accommodated in a gap between the cover plate and the upper-layer PCB, an outlet and an inlet of the upper-layer cooling channel are located at a same side as the radiator, and the outlet and the inlet are respectively configured to connect to respective ones of two radiator interfaces disposed on an upper surface of the rear side wall of the bottom cover; and the power conversion circuit is configured to output a first direct current and a second direct current, a voltage of the second direct current is higher than a voltage of the first direct current, the first direct current is used to be transmitted to the first-type load to supply power to the first-type load, and the second direct current is used to be transmitted to the battery to supply power to the battery.

15. The vehicle according to claim 14, wherein an area of an orthographic projection of the radiator on the upper-layer PCB is less than an area of the upper-layer PCB, and the orthographic projection of the radiator covers the plurality of transformers and the plurality of power switching transistors borne on the upper-layer PCB.

16. The vehicle according to claim 14, wherein an area of an orthographic projection of the cover plate is greater than an area of the upper-layer PCB.

17. The vehicle according to claim 14, wherein the bottom plate comprises a plurality of shielding protrusions, and the upper-layer PCB and the radiator are sequentially stacked and fastened to the plurality of shielding protrusions, wherein two shielding protrusions of the plurality of shielding protrusions jointly form one shielding region, or one shielding protrusion and one side wall jointly form another shielding region, and an orthographic projection of the upper-layer PCB beard covers the one shielding region and the another shielding region.

18. The vehicle according to claim 14, wherein the bottom plate comprises a plurality of first protrusions and a plurality of second protrusions, wherein the plurality of first protrusions are configured to fasten the lower-layer PCB;

the plurality of second protrusions are configured to fasten the upper-layer PCB and the radiator; and a height of the plurality of first protrusions along a height direction of the vehicle-mounted power supply apparatus is less than a height of the plurality of second protrusions, so that the lower-layer PCB is closer to the lower-layer cooling channel than the upper-layer PCB, and the upper-layer PCB is closer to the upper-layer cooling channel than the lower-layer PCB.

19. The vehicle according to claim 14, wherein the power conversion circuit comprises a power factor correction (PFC) inductor, a PFC capacitor, and two transformers;

the lower-layer cooling channel and the bottom cover are formed as an integral assembly; and the PFC inductor, the PFC capacitor, and the two transformers are in contact with the bottom of the bottom cover through a heat-conductive material, and are arranged above the lower-layer cooling channel and below the upper-layer PCB in a flat manner.

20. The vehicle according to claim 14, wherein the front side wall and the rear side wall are disposed opposite to each other, the left side wall and the right side wall are disposed opposite to each other, the rear side wall comprises a cooling channel interface, and the cooling channel interface is configured to connect an external cooling system to the lower-layer cooling channel and the upper-layer cooling channel, so that the external cooling system exchanges a cooling medium with the lower-layer cooling channel and the upper-layer cooling channel through the cooling channel interface.

21. The vehicle according to claim 20, wherein the front side wall comprises a power interface, two first direct current interfaces, and one second direct current interface, the power interface and the second direct current interface are electrically connected to the upper-layer PCB, and the two first direct current interfaces are electrically connected to the lower-layer PCB.

* * * * *